United States Patent [19]
Itoh et al.

[11] Patent Number: 5,859,570
[45] Date of Patent: Jan. 12, 1999

[54] FREQUENCY SYNTHESIZER USING DIVIDED AND FREQUENCY CONVERTED DDS SIGNAL AS REFERENCE FOR PLL

[75] Inventors: Kenji Itoh; Ken'ichi Tajima, both of Kanagawa; Shuji Nishimura, Hyogo; Akio Iida, Kanagawa, all of Japan

[73] Assignee: Mitsubishi Denki Kabushiki Kaisha, Tokyo, Japan

[21] Appl. No.: 910,014

[22] Filed: Aug. 12, 1997

Related U.S. Application Data

[62] Division of Ser. No. 532,049, Sep. 21, 1995.

[30] Foreign Application Priority Data

Sep. 29, 1994 [JP] Japan .................................. 6-235379

[51] Int. Cl.$^6$ .............................. H03L 7/06; H03L 7/16
[52] U.S. Cl. .............................. 331/18; 327/106; 331/25
[58] Field of Search ...................... 331/18, 25; 327/105, 327/106, 107

[56] References Cited

U.S. PATENT DOCUMENTS

| | | | |
|---|---|---|---|
| 4,965,533 | 10/1990 | Gilmore | 331/25 |
| 5,184,093 | 2/1993 | Itoh et al. | 331/25 |
| 5,353,311 | 10/1994 | Hirata et al. | 375/202 |

*Primary Examiner*—Siegfried H. Grimm
*Attorney, Agent, or Firm*—Wolf, Greenfield & Sacks, P.C.

[57] ABSTRACT

A frequency synthesizer having reduced spurious components for use in a receiving and transmitting apparatus. The frequency synthesizer includes a direct digital synthesizer (DDS) for generating a first signal having a first frequency determined by channel setting data. The first signal is applied to a frequency divider to generate a divided signal having a divided frequency. The divided signal is applied to a frequency converter for shifting the divided frequency by a shift frequency interval to provide a reference signal having a reference frequency. The reference signal is applied to a phase locked loop (PLL) for generating a final signal having a predetermined frequency characteristic.

22 Claims, 55 Drawing Sheets

Fig.7

| PHASE DATA (Φ) (ADDRESS) | AMPLITUDE DATA |
|---|---|
| 0 π | + 0 0 0 0 |
| 1/8 π | + 0 1 0 0 |
| 2/8 π | + 0 1 1 0 |
| 3/8 π | + 0 1 1 1 |
| 4/8 π | + 1 0 0 0 |
| 5/8 π | + 0 1 1 1 |
| 6/8 π | + 0 1 1 0 |
| 7/8 π | + 0 1 0 0 |
| π | + 0 0 0 0 |
| 9/8 π | − 0 1 0 0 |
| 10/8 π | − 0 1 1 0 |
| 11/8 π | − 0 1 1 1 |
| 12/8 π | − 1 0 0 0 |
| 13/8 π | − 0 1 1 1 |
| 14/8 π | − 0 1 1 0 |
| 15/8 π | − 0 1 0 0 |
| 2 π | − 0 0 0 0 |

Fig.10 A

CHANNEL SETTING DATA (COARSE TUNING) 100 KHZ UNIT

| 1200.0 MHZ | 000 |
|---|---|
| 1200.1 MHZ | 001 |
| 1200.2 MHZ | 010 |
| 1200.3 MHZ | 011 |
| 1200.4 MHZ | 100 |

Fig.10 B

CHANNEL SETTING DATA (FINE TUNING) 10 KHZ UNIT

| +0 KHZ | 0000 |
|---|---|
| +10 KHZ | 0001 |
| +20 KHZ | 0010 |
| : | : |
| +90 KHZ | 1001 |

CHARACTERISTIC OF USUAL LEVEL CONVERTOR

LEVEL CONVERTER INCLUDING HYSTERESIS CHARACTERISTIC

WITHOUT PSEUDO RANDOM NOISE

WITH PSEUDO RANDOM NOISE

SUBTRACTER OUTPUT

REFERENCE CLOCK f1,
FREQUENCY SET. DATA k1

REFERENCE CLOCK f2,
FREQUENCY SET. DATA k2

Fig.45

| ADDRESS | CONTENT 1 | CONTENT 2 |
|---|---|---|
| FREQUENCY SETTING DATA k1 | SWITCH 220 SETTING | FREQ. SET. DATA k2 WHEN REF. CLOCK 32b IS SELECTED |
| ⋮ | ⋮ | ⋮ |
| 1 0 1 0 0 | 0 | — |
| 1 0 1 0 1 | 0 | — |
| 1 0 1 1 0 | 1 | 1 1 0 0 1 |
| 1 0 1 1 1 | 0 | — |
| ⋮ | ⋮ | ⋮ |

SELECT { 0:REF. CLOCK 32a, 1:REF. CLOCK 32b }

FREQUENCY SYNTHESIZER USING DIVIDED AND FREQUENCY CONVERTED DDS SIGNAL AS REFERENCE FOR PLL

This is a division of application Ser. No. 08/532,049, filed Sep. 21, 1995, entitled METHODS AND APPARATUS FOR COMMUNICATION AND SYNTHESIS SIGNAL and now pending.

BACKGROUND OF THE INVENTION

1. Field of the Invention

The present invention relates to a communication apparatus applying a frequency synthesizer wherein a direct digital synthesizer is used. Particularly, this invention relates to downsizing and a high precision receiving/transmitting apparatus and a frequency synthesizer used in radio communications systems.

2. Description of the Related Art

FIG. 48 shows an example configuration of a conventional receiving apparatus constructed based on a receiving apparatus including an auto frequency control (AFC) circuit. The receiving apparatus including the auto frequency control circuit is disclosed in "TDMA Communication" by Heiichi Yamamoto et al Institute of Electronics and Communication pp. 87–89, Spring Conference B-198 of Electronics Information Communication Institute in 1993, Unexamined Japanese Patent Publication 3-284016, Unexamined Japanese Patent Publication 3-296318, and Unexamined Japanese Patent Publication 4-156712.

In FIG. 48, a low noise amplifier (LNA) 1, band pass filters (BPF) 2a, 2b and 2c, mixers (MIX) 3a and 3b, a phase locked loop (PLL) synthesizer 4, a temperature compensation quartz-crystal oscillator (TCXO) 5, a frequency converter 6 for high frequency, amplifiers (AMP) 7a and 7b, a voltage-controlled quartz-crystal oscillator (VCXO) 8, a frequency converter 9 for low frequency, an analog-digital converter (A-D converter) 10, a frequency error detecting means 11, a frequency control means 12, a memory 13, and a digital-analog converter (D-A converter) 14 are provided. The frequency converter 6 for high frequency includes the LNA 1, the BPF 2a, the MIX 3a, the TCXO 5 and the PLL synthesizer 4. An output frequency of the PLL synthesizer 4 is controlled based on channel setting data. A receiving frequency is set based on the controlled output frequency from the PLL synthesizer 4. The frequency converter 9 for low frequency includes the AMP 7a, the BPF 2b, the MIX 3b and the VCXO 8. The receiving frequency can be adjusted finely based on a control voltage applied at the VCXO 8.

The operation will now be described. In the conventional receiving apparatus shown in FIG. 48, a frequency of an input signal is changed to an intermediate frequency (IF) signal of a predetermined frequency through the frequency converter 6 for high frequency and the frequency converter 9 for low frequency. The changed frequency is amplified at the AMP 7b and filtered at the BPF 2c. By this procedure, other input signals of neighboring frequencies are suppressed. The filtered frequency is converted from analog to digital at the A-D converter 10. In a common receiving apparatus for digital communication, an input signal expressed in digital amount is demodulated by digital operation and a transmission signal is extracted. In this case, there is a difference between a center frequency of the input signal and a receiving frequency in the receiving apparatus. This frequency difference is hereinafter called a frequency error. If the frequency error increases, the modulation performance (bit error rate in a digital transmission method) is gradually deteriorated. If the frequency error increases too far, it becomes impossible to receive the input signal because the input signal is defined to be out of passing bandwidth of the BPF 2c. The phenomenon, such as the above, becomes distinctive especially in a slow transmission speed system, such as a single channel per carrier (SCPC) method wherein speech transmission is mainly treated.

Generally, in the receiving apparatus as shown in FIG. 48, the frequency error is detected by the frequency error detecting means 11, a frequency of the VCXO 8 is controlled, and the frequency error is corrected in addition to the modulation operation. Based on frequency error data obtained by the frequency error detecting means 11, frequency control data is calculated for the purpose of correcting the frequency error in the receiving frequency by the frequency control means 12. The memory 13 is accessed based on the frequency control data. A table for output frequency of the VCXO 8 vs. control voltage, or a table for increased amount of the output frequency of the VCXO 8 vs. increased amount of the control voltage is stored in this memory 13. Voltage data applied at the VCXO 8 is output from the memory 13 based on the frequency control data. The voltage data is converted to the control voltage for the VCXO 8 at the D-A converter 14. The above serial controlling of the frequency is called AFC. (auto frequency control)

FIG. 49 shows a configuration of the PLL synthesizer 4. A variable divider 15, a reference signal divider 16, a phase comparator 17, a loop filter 18, a voltage-controlled oscillator (VCO) 19, the temperature compensation quartz-crystal oscillator (TCXO) 5 and a PLL 34 are shown in FIG. 49. The temperature compensation quartz-crystal oscillator (TCXO) 5 is a reference oscillator. A frequency of output signal of the VCO 19 is divided by dividing ratio N in the variable divider 15. A frequency of output signal of TCXO 5 is divided by dividing ratio R in the reference signal divider 16. The PLL operates in order to make the above divided frequencies be coincident. Accordingly, output frequency fout of the PLL 34 is N/R times output frequency fxo of TCXO 5 (fout=(N/R)·fxo). The output frequency fout of the PLL synthesizer 4 can be switched by interval fxo/R. The output frequency fout can be switched by changing dividing ratio N of the variable divider 15. The dividing ratio N is changed by the channel setting data.

Other configurations of the PLL synthesizer 4 are shown in FIG. 50 and U.S. Pat. No. 4,965,533. The configuration of FIG. 50 is described in the paper, A. L. Bramble, "Direct Digital Frequency Synthesis", IEEE 35th Ann. Frequency Control Symposium, May 1981, pp. 406–414.

In FIG. 50, a direct digital synthesizer (DDS) 31, a reference clock 32 and a frequency divider 33 are shown. The DDS 31 synchronized with the reference clock 32 is used as a reference oscillator of PLL 34, in this PLL synthesizer 4.

FIG. 51 shows a configuration of the DDS 31. A phase accumulator 40, a memory 41, a digital-analog converter 42 and a filter 43 are shown in FIG. 51. Frequency data (Δϕ) represented by plural bits is input and accumulated at the phase accumulator 40 in the DDS 31. The accumulated data is converted to phase data ϕ and output. Amplitude data sin ϕ of a sine wave is stored in the memory 41 in advance. The amplitude data sin ϕ of a sine wave is output based on the phase data ϕ. The output data is converted to analog waveform at the D-A converter 42. The above digital operation is performed synchronous with the reference clock. Output from the D-A converter 42 is input into the filter 43.

Spurious components of the reference clock, higher harmonic and so forth is removed at the filter 43. High-frequency resolution can be easily obtained by increasing the number of bits of the frequency data (Δφ), without deteriorating other characteristics, in DDS 31. Accordingly, high-frequency resolution also can be obtained in the PLL 34 whose reference oscillator is the DDS 31.

FIG. 52 shows another configuration of the DDS 31. In this DDS 31, a sin φ operation circuit 44 is provided instead of the memory 41. The sin φ calculation circuit 44 is provided in order to avoid making the capacity of the memory 41 large when the high-frequency resolution is obtained by increasing the number of bits of the frequency data (Δφ) in the DDS 31. CORDIC algorithm and so forth is used in the sin φ calculation circuit 44. The amplitude data sin φ of a sine wave is obtained by digital operation.

There are many disadvantages to the conventional receiving apparatus. For example, when a narrow bandwidth digital transmission of low symbol speed is performed for transmitting speech in SCPC (single channel per carrier), it is necessary to enhance the frequency setting accuracy at AFC. The reason is that the BPF 2c becomes a narrow band. The receiving frequency is finely adjusted by treating the frequency control data through the D-A converter 14, the memory 13 and the VCXO 8, in the conventional receiving apparatus. The VCXO 8 has a configuration wherein a varactor diode is connected to a quartz-crystal resonator for modulating the frequency. Thus sensitivity of the modulation is changed depending upon control voltage. Therefore, in order to enhance the frequency setting accuracy, it is needed to increase the number of entries for a table of output frequency vs. control voltage stored in the memory 13 for enhancing the resolution. This increase introduces a problem of a larger memory 13 requirement.

In addition, an output frequency of the VCXO 8 and the modulation sensitivity of the VCXO 8 are changed depending upon temperature. Therefore, it has another problem that the frequency setting accuracy is deteriorated with temperature variations.

Moreover, characteristics of the VCXO 8 relating to output frequency vs. control voltage differs depending upon each VCXO. In order to set the frequency highly accurately, it is necessary to measure the characteristic data of output frequency vs. control voltage for each receiving apparatus and to write the data into the memory 13. This rewriting procedure introduces another problem of higher cost.

As one of solutions for the above problems relating to the AFC, the following method is introduced. A digital oscillator is described in the book, "Digital Movement Communication", edited by Syuji Kuwahara, Kagaku Syuppan, pp. 269–271. The method for the solution is to correct a frequency error by a digital operation using the digital oscillator. FIG. 53 shows a configuration of the method.

A demodulator 35 and a digital oscillator 36 are shown in FIG. 53. It is easy to enhance the frequency setting accuracy according to this configuration. However, this method can not be applied when the frequency error is large and thus when an input signal is out of the passing bandwidth of the BPF 2c.

Problems in applying the VCXO 8 to the AFC in the receiving apparatus have been described. A similar configuration is also used for a transmitting apparatus in order to control a transmitting frequency. Namely, a transmitting frequency error is calculated based on a receiving frequency error. The VCXO 8 used as a local oscillator for the transmitting apparatus is controlled depending upon the transmitting frequency error. In this case also, there is the problem that the amount of the memory 13 becomes large in enhancing the frequency setting accuracy because the VCXO 8 is used. There is also the problem that a desired frequency setting accuracy can lead to high cost.

Now, the problem of the conventional PLL synthesizer shown in FIG. 49 when being applied in the receiving apparatus will be described.

Generally, phase comparison frequency fr (fr=fxo/R) of the PLL synthesizer wherein a frequency is switched by a variable divider is the same as a channel frequency interval. Therefore, the phase comparison frequency fr of the PLL synthesizer becomes low frequency in a system wherein the frequency interval of the channel is narrow, such as SCPC method of low transmission speed. In this case, phase noise PN close to a carrier wave of the PLL synthesizer increases, which brings about a problem that communication quality and selecting receiving frequency accuracy are deteriorated. The phase noise PN close to the carrier wave of the PLL synthesizer can be obtained in the following equation.

$$PN = 10 \cdot LOG_{10}\{(fout/fr)^2 \cdot (\frac{1}{2}) \cdot (Ef/Kp)^2\} (dBc/Hz) \quad (1)$$

In the equation, fout is output frequency of the PLL 34, Ef is noise voltage for input conversion for the loop filter and, Kp is signal detection sensitivity of the phase comparator 17. When the phase comparison frequency fr becomes low frequency, loop bandwidth of the PLL 34 also becomes narrow. Therefore, response speed of the PLL 34 becomes slow, which brings about a problem that the frequency switching time becomes long.

The PLL synthesizer 4 wherein the DDS 31 is used as a reference oscillator of the PLL 34, shown in FIG. 50, has been introduced to improve the above disadvantages. The variable divider 15 is not used in this PLL synthesizer 4 because the frequency is changed by the DDS 31. Therefore, it is possible to optionally select the phase comparison frequency fr. In addition, since a frequency is changed by the DDS 31, a frequency of narrow channel can be easily obtained without deteriorating the characteristics relating to the phase noise and the frequency switching time and so forth. Namely, the problems of increasing phase noise and lengthening frequency switching time can be solved. However, there is a problem that spurious components caused by a quantization error is high because the DDS 31 generates a sine wave by digital operation.

FIG. 54 shows an example of an output spectrum of the DDS 31. The spurious component is amplified in the passing bandwidth in the PLL 34. Assuming that the spurious component of the DDS 31 is SPdds (dBc) and the spurious component of the output signal from the PLL synthesizer 4 is SPout (dBc), the relation between these two can be obtained in the following equation.

$$\begin{aligned} SPout &= 10 \cdot LOG_{10}(fout/fr)^2 + SPdds \\ &= 10 \cdot LOG_{10}(N)^2 + SPdds \\ &(dBc) \end{aligned} \quad (2)$$

The spurious component in such a configuration of the PLL synthesizer is high, which brings about a problem that the communication quality and the frequency selecting accuracy are deteriorated. Therefore, the output frequency fout applied to such PLL synthesizer is relatively restricted to be a low frequency.

Though there is a method of increasing the output frequency (phase comparison frequency) fr of the DDS 31 in order to solve the above problems, this method has another problem. The problem is that electrical power consumption increases in proportion to an operating frequency as shown in FIG. 55.

SUMMARY OF THE INVENTION

A communications apparatus comprises
  a first frequency converter for shifting a first frequency characteristic of a first signal by a shift frequency interval to provide a second signal having a second frequency characteristic, the first frequency converter includes
    a direct digital synthesizer for generating a shifting signal that defines the shift frequency interval, and
    a mixer, operatively connected to the direct digital synthesizer, for mixing the shifting signal and the first signal,
  a frequency error detector, operatively connected to the first frequency converter, for determining a frequency error between the second frequency characteristic and a predetermined frequency characteristic, and
  a frequency controlling unit, operatively connected to the frequency error detector and the first frequency converter, for readjusting the shift frequency interval based on the frequency error.

A communications apparatus comprises
  a receiving frequency converter for inputting an input signal and for generating a first signal having a first frequency characteristic by mixing a filtered component of the input signal with a receiving signal,
  a first frequency converter, operatively connected to the receiving frequency converter, for shifting the first frequency characteristic of the first signal by a first shift frequency interval to provide a received signal,
  a second frequency converter for shifting a second frequency characteristic of a second signal by a second shift frequency interval,
  a transmitting frequency converter, operatively connected to the second frequency converter, for generating an output signal by mixing the second signal with a transmitting signal,
  a direct digital synthesizer, operatively connected to the first frequency converter and the second frequency converter, for generating a first shift signal that defines the first shift frequency interval and a second shift signal that defines the second shift frequency interval,
  a frequency error detector, operatively connected to the first frequency converter and the second frequency converter, for determining a first frequency error between the first frequency characteristic and a first predetermined characteristic and for determining a second frequency error between the second frequency characteristic and a second predetermined frequency characteristic, and
  a frequency controlling unit, operatively connected to the frequency error detector, the first frequency converter, and the second frequency converter, for readjusting the first shift frequency interval based on the first frequency error and for readjusting the second shift frequency interval based on the second frequency error.

A frequency synthesizer for generating a final signal having a predetermined frequency characteristic, the frequency synthesizer comprises
  a direct digital synthesizer for generating a first signal having a first frequency characteristic determined by first channel setting data and having a first amplitude,
  a first divider, operatively connected to the direct digital synthesizer, for dividing the first frequency characteristic of the first signal to generate a divided signal having a divided frequency characteristic,
  a frequency converter, operatively connected to the first divider, for shifting the divided frequency characteristic by a shift frequency interval to provide a reference signal having a reference frequency characteristic, and
  a phase locked loop for generating the final signal from the reference signal.

A frequency synthesizer for generating a final signal having a predetermined frequency characteristic, the frequency synthesizer comprises
  a direct digital synthesizer for generating a first signal having a first frequency characteristic determined by channel setting data,
  a first phase locked loop, operatively connected to the direct digital synthesizer, for generating a reference signal from the first signal, and
  a second phase locked loop, operatively connected to the first phase locked loop for generating the final signal from the reference signal.

A method for communicating with signals at a predetermined frequency characteristic, the method comprises the steps of
  generating a shifting signal that defines a shift frequency interval, with a direct digital synthesizer,
  shifting a first frequency characteristic of a first signal by the shift frequency interval, by mixing the first signal with the shift signal, to provide a second signal having a second frequency characteristic,
  detecting a frequency error between the second frequency characteristic and the predetermined frequency characteristic, and
  adjusting the shifting signal to change the shift frequency interval based on the frequency error.

A method for synthesizing a final signal having a predetermined frequency characteristic, the method comprises the steps of
  generating a first signal, having a first frequency characteristic determined by first channel setting data and having a first amplitude, at a direct digital synthesizer,
  dividing the first frequency characteristic of the first signal to generate a divided signal having a divided frequency characteristic,
  shifting the divided frequency characteristic by a shift frequency interval to provide a reference signal having a reference frequency characteristic, and
  generating the final signal from the reference signal, at a phase locked loop.

A communications apparatus comprises
  a first frequency converter for shifting a first frequency characteristic of a first signal by a shift frequency interval to provide a second signal having a second frequency characteristic,
  a frequency error detector, operatively connected to the first frequency converter, for determining a frequency error between the second frequency characteristic and a predetermined frequency characteristic, and
  a means for readjusting the shift frequency interval based on the frequency error using digital operations.

A frequency synthesizer for generating a final signal having a predetermined frequency characteristic, the frequency synthesizer comprises a means for generating a first signal having a first frequency characteristic by digital operations and determined by first channel setting data, a first divider, operatively connected to the means for generating, for dividing the first frequency characteristic of the first signal to generate a divided signal having a divided frequency characteristic, a frequency converter, operatively connected to the first divider, for shifting the divided frequency characteristic by a shift frequency interval to provide a reference signal having a reference frequency characteristic, and a phase locked loop for generating the final signal from the reference signal.

Other objects, features, and advantages of the invention will be apparent from the following description when taken in conjunction with the accompanying drawings.

BRIEF DESCRIPTION OF THE DRAWINGS

FIG. 7 shows a chart relating to phase data and amplitude data of DDS according to Embodiment 1 of the present invention;

FIG. 10A shows a chart relating to channel setting data according to Embodiment 2 of the present invention;

FIG. 10B shows another chart of channel setting data according to Embodiment 2 of the present invention;

9

Figure 37:
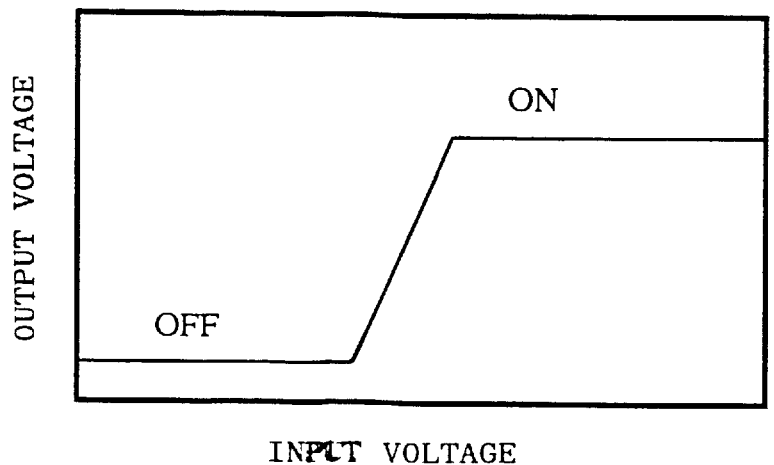
Figure 37:
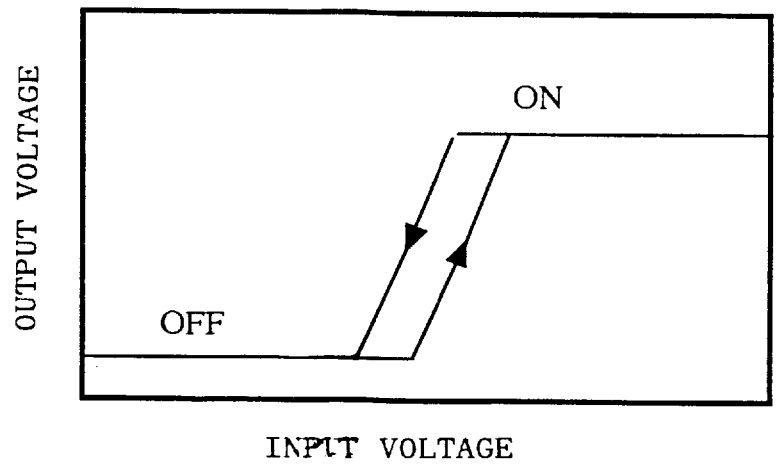
Figure 38:
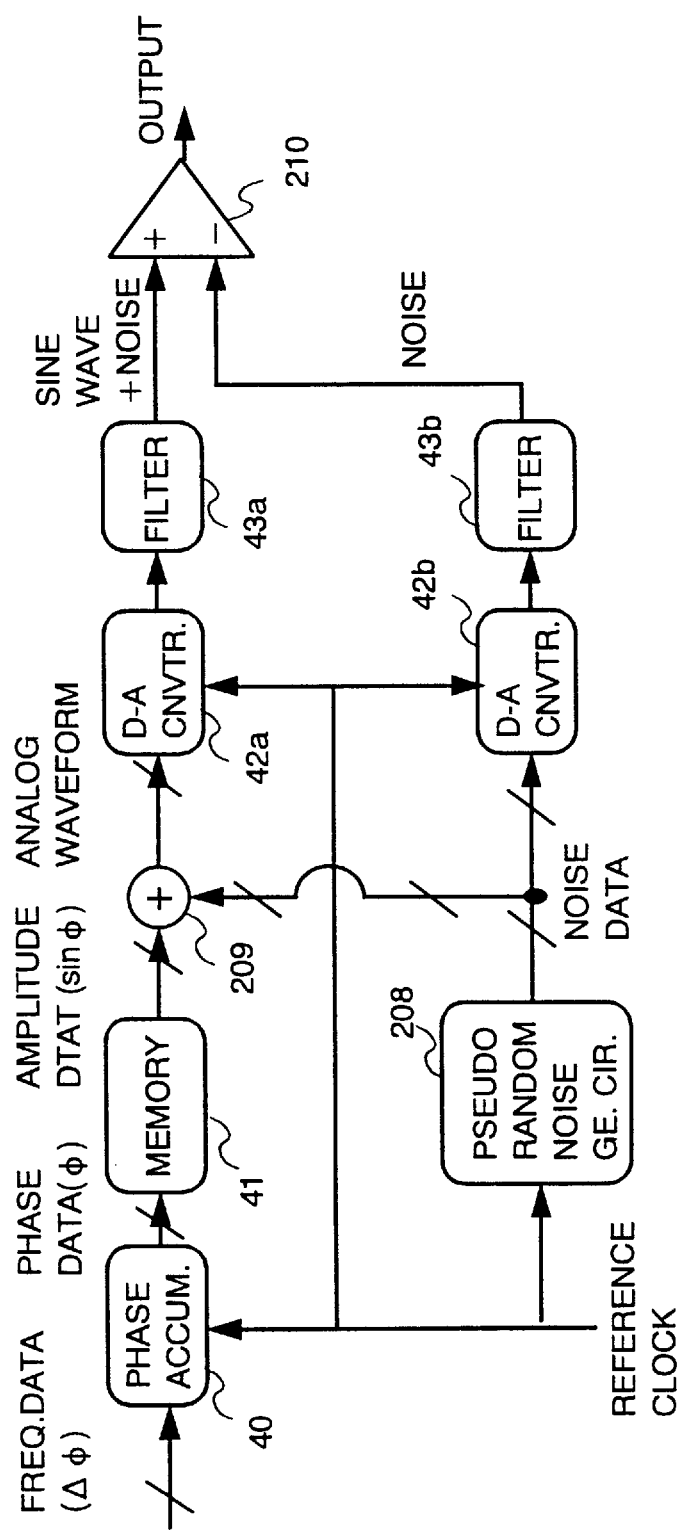
Figure 39:
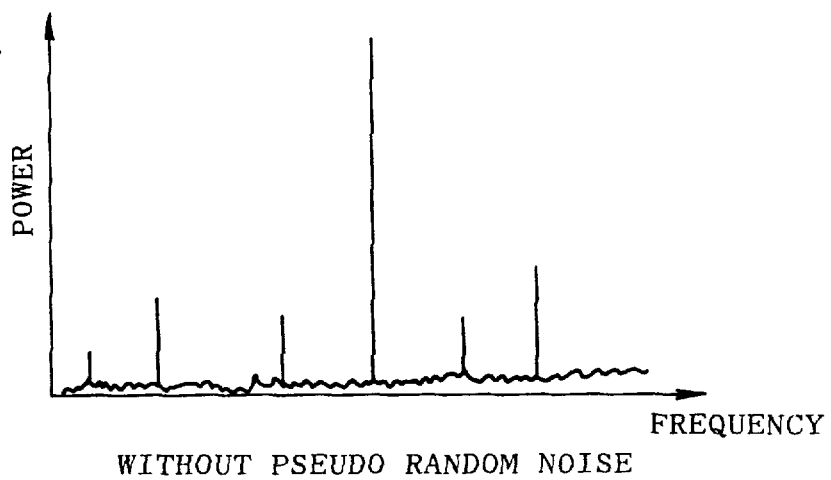
Figure 39:
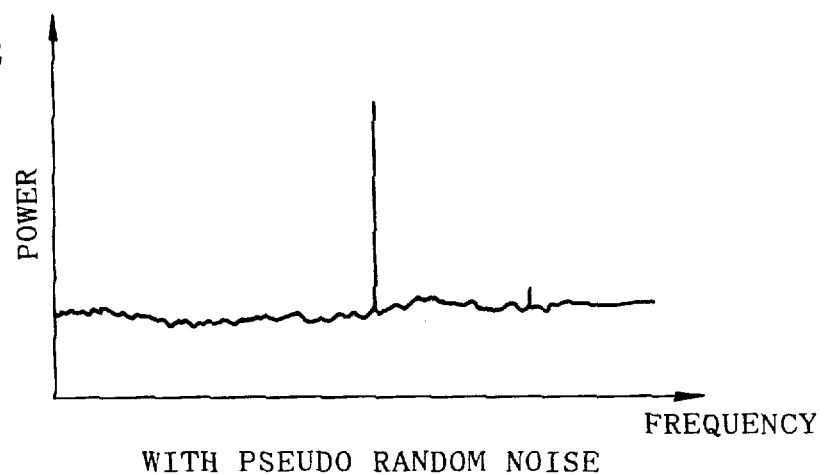
Figure 39:
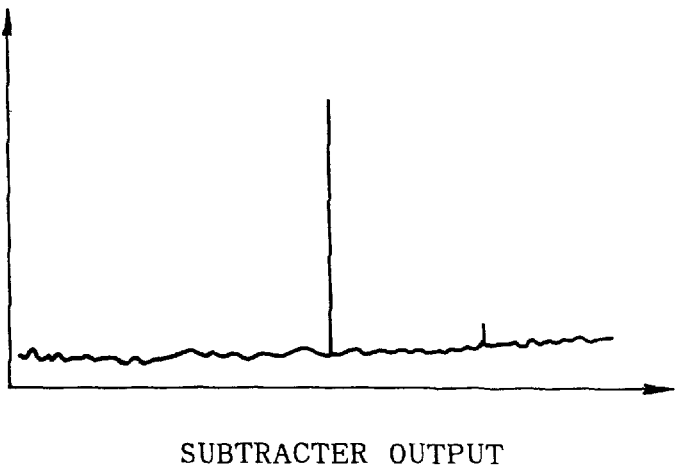
Figure 40:
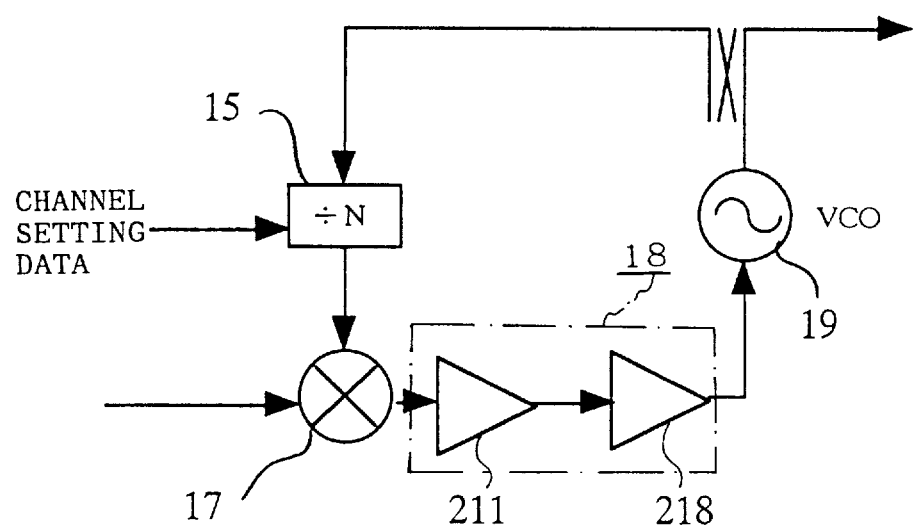
Figure 41:
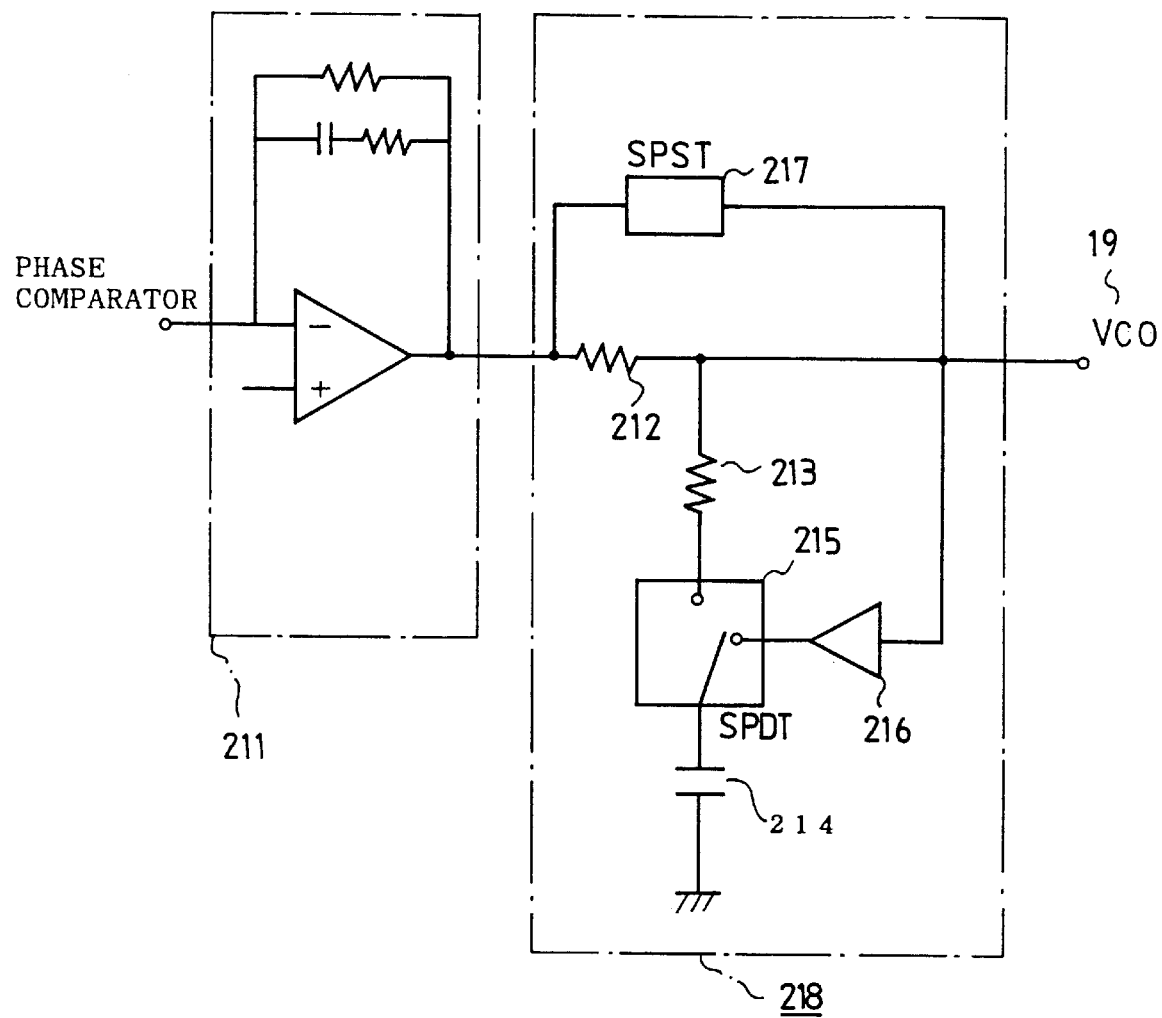
Figure 42:
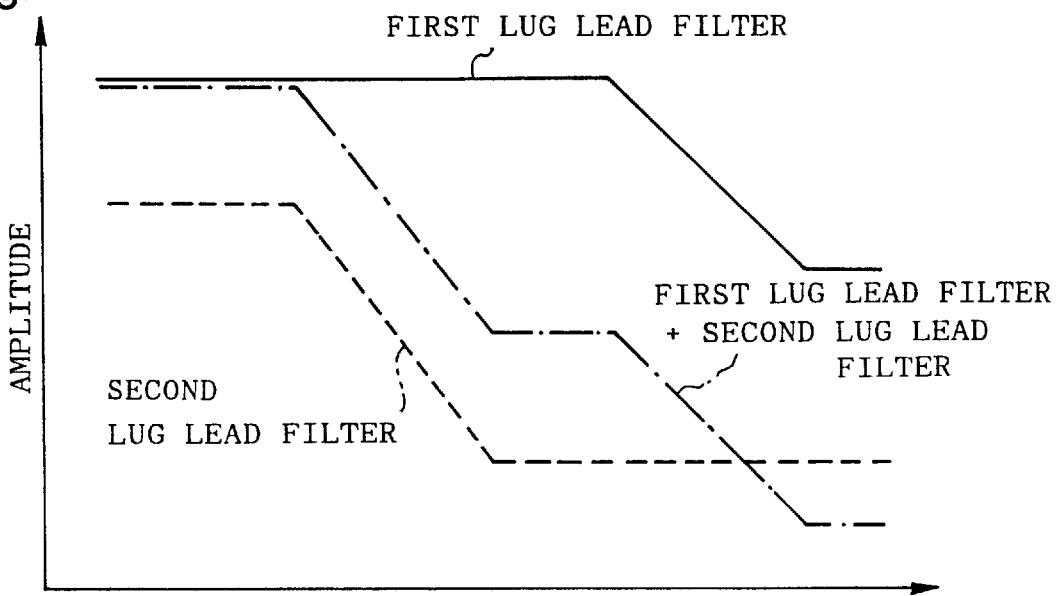
Figure 42:
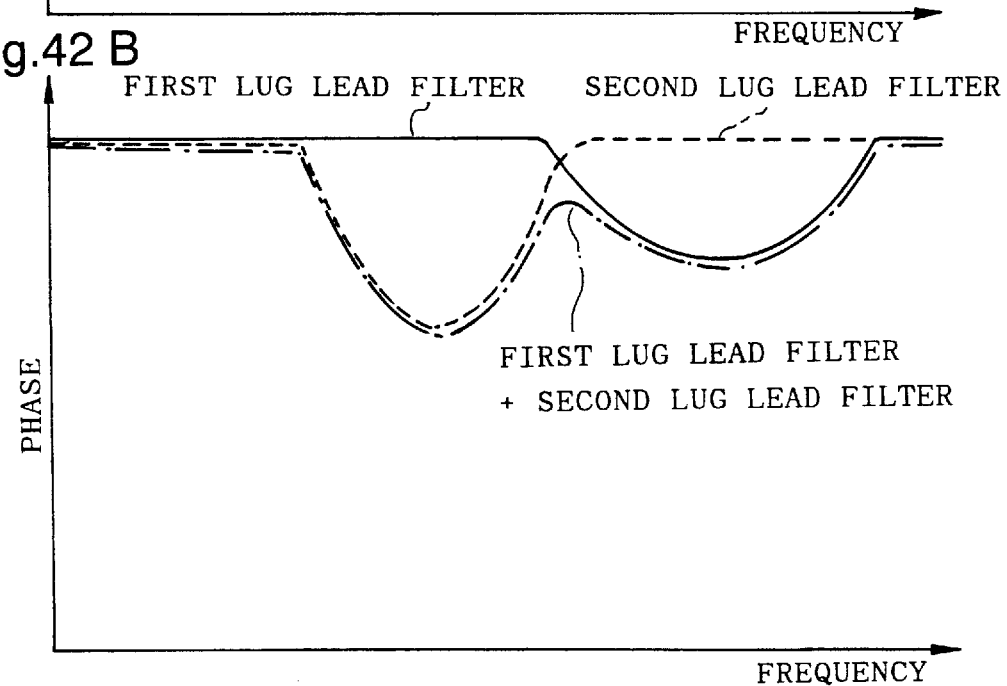
Figure 43:
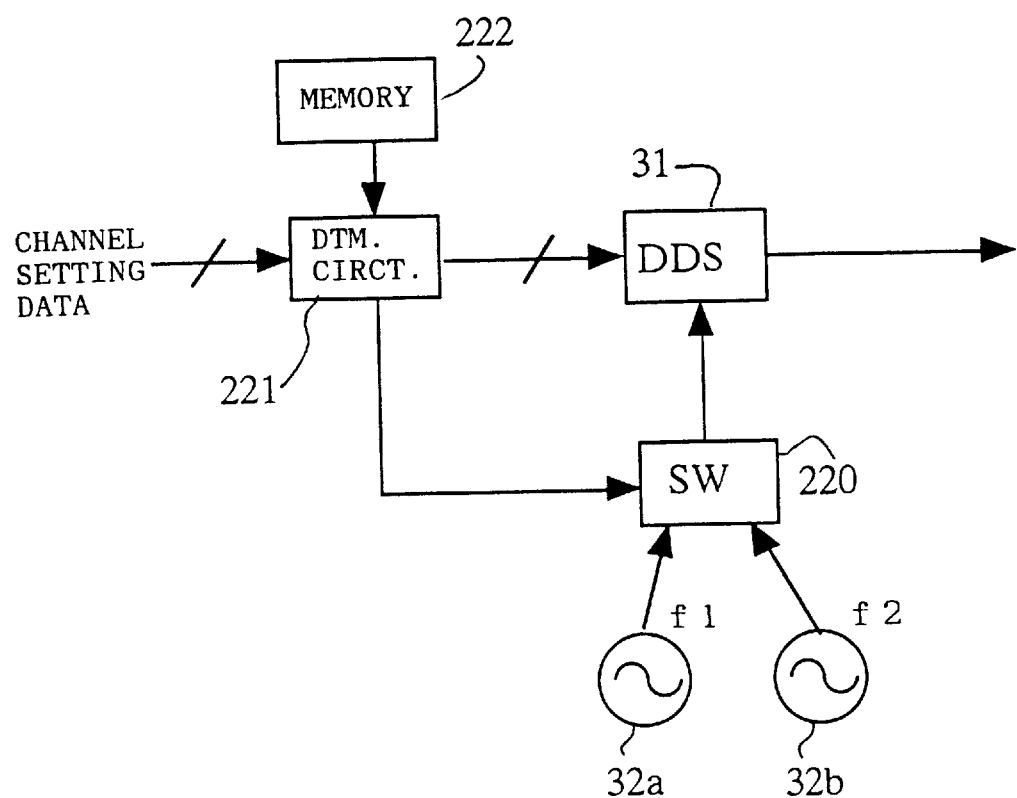
Figure 44:
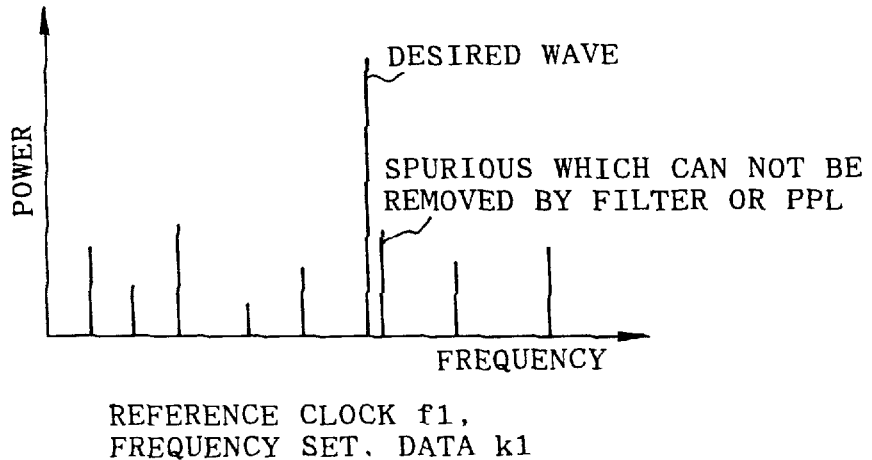
Figure 44:
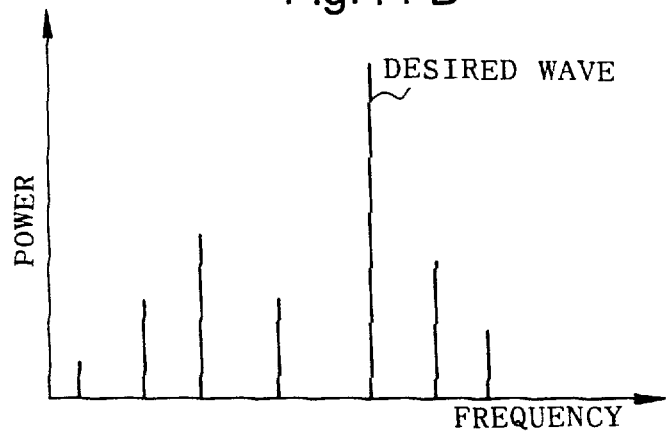
Figure 46:
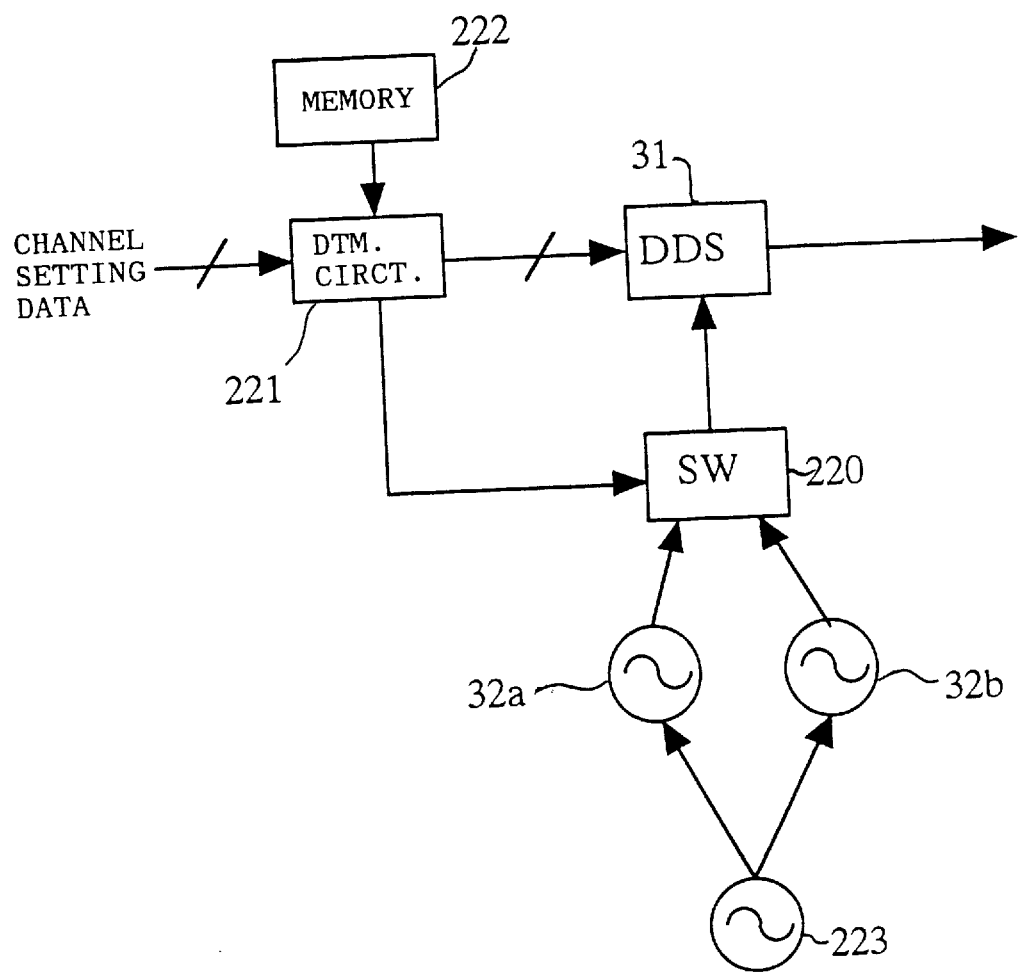
Figure 47:
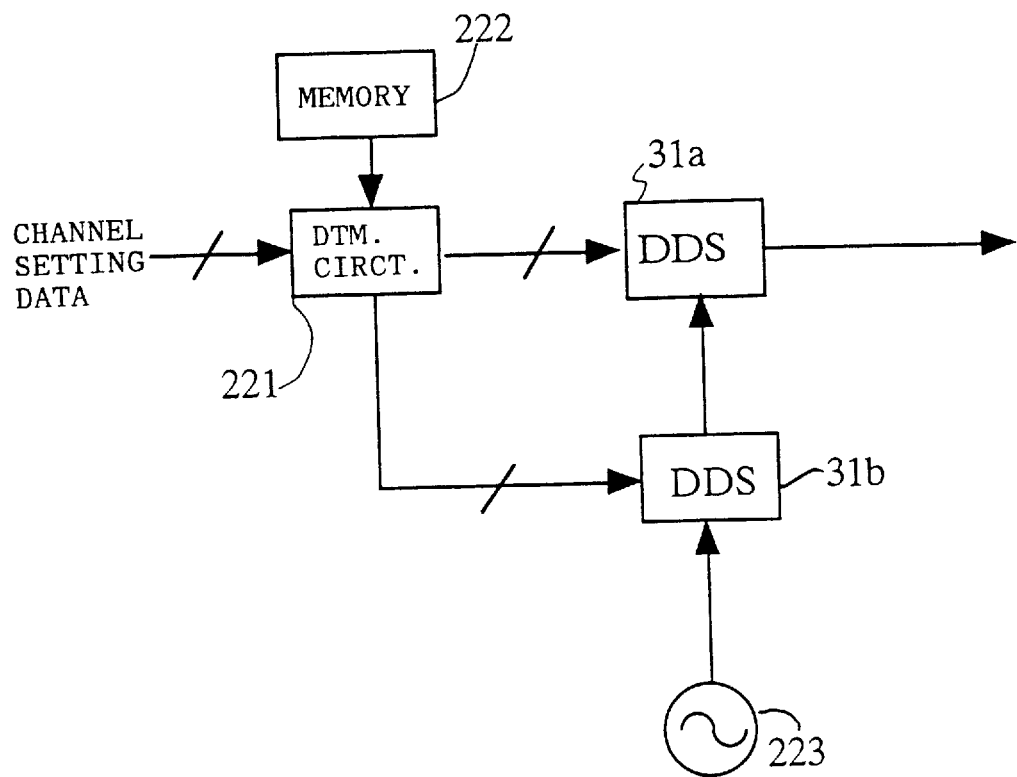
Figure 48:
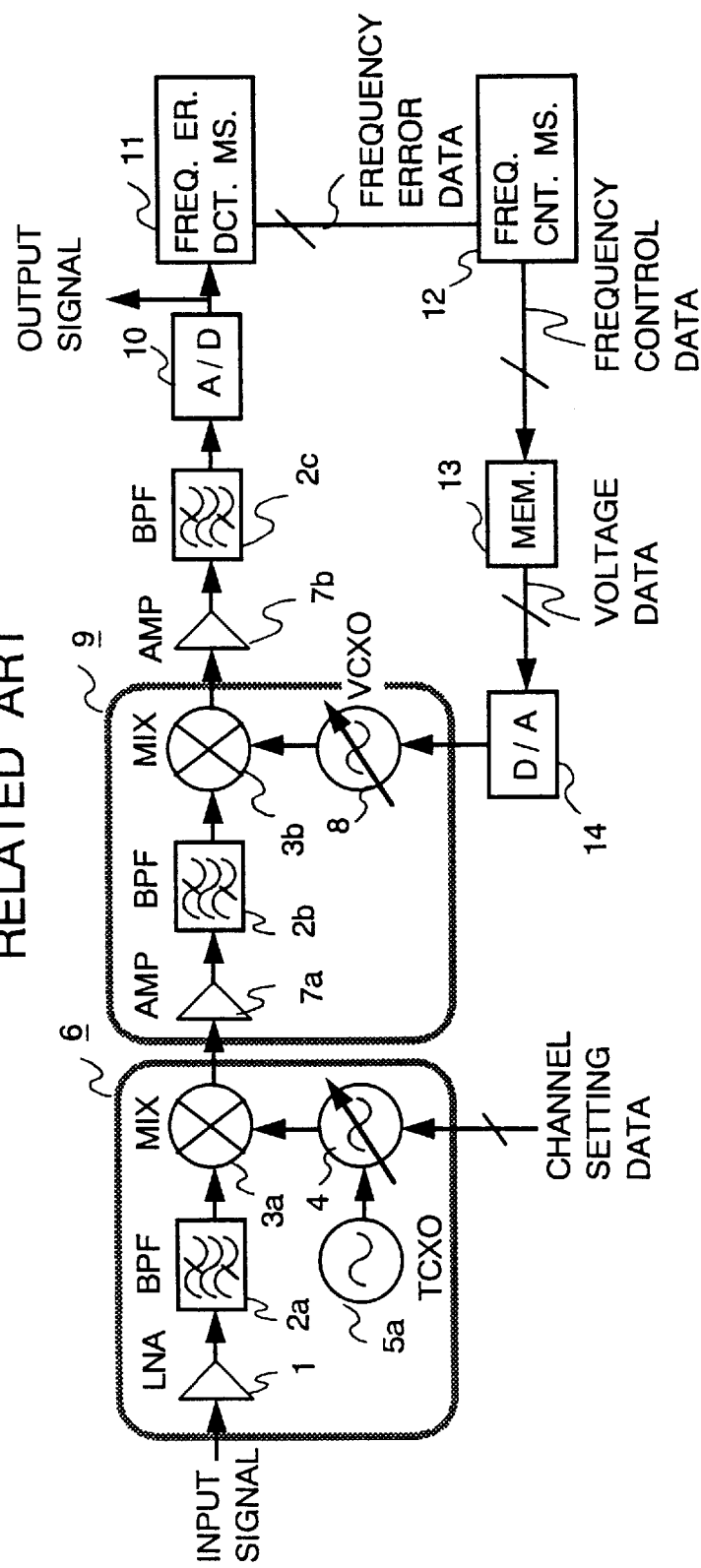
Figure 49:
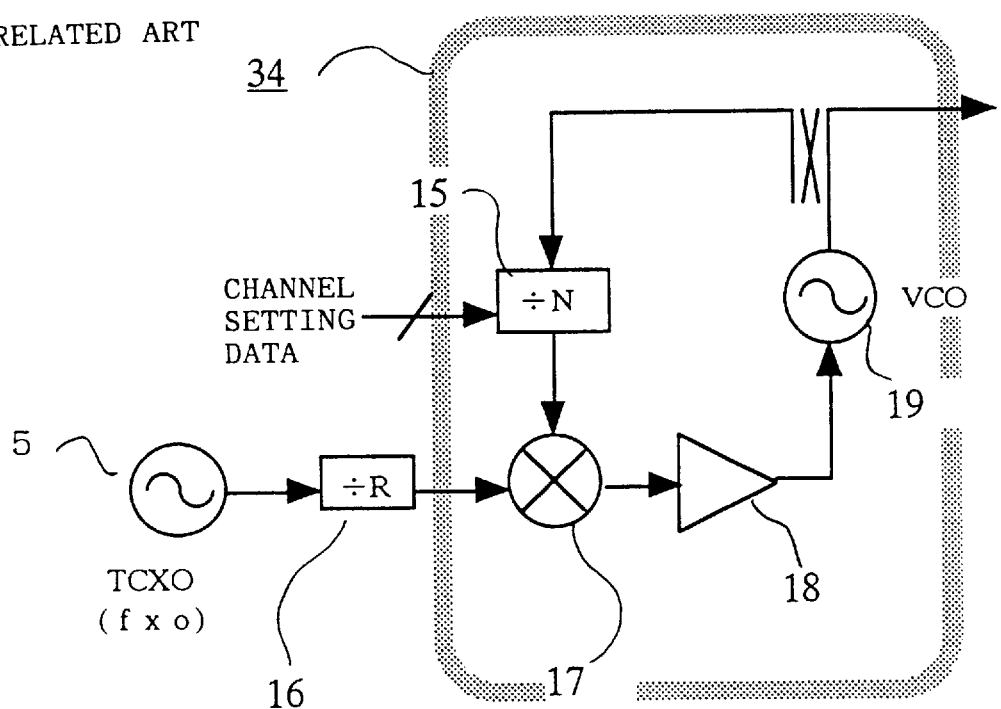
Figure 50:
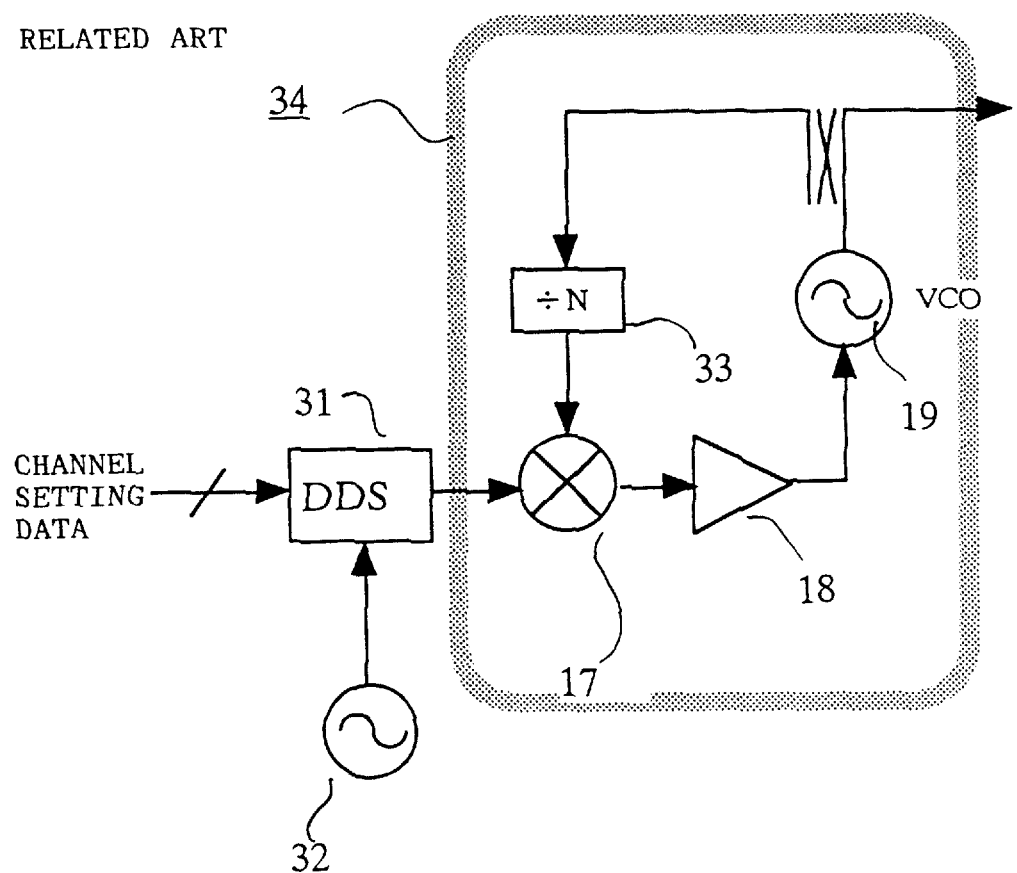
Figure 51:
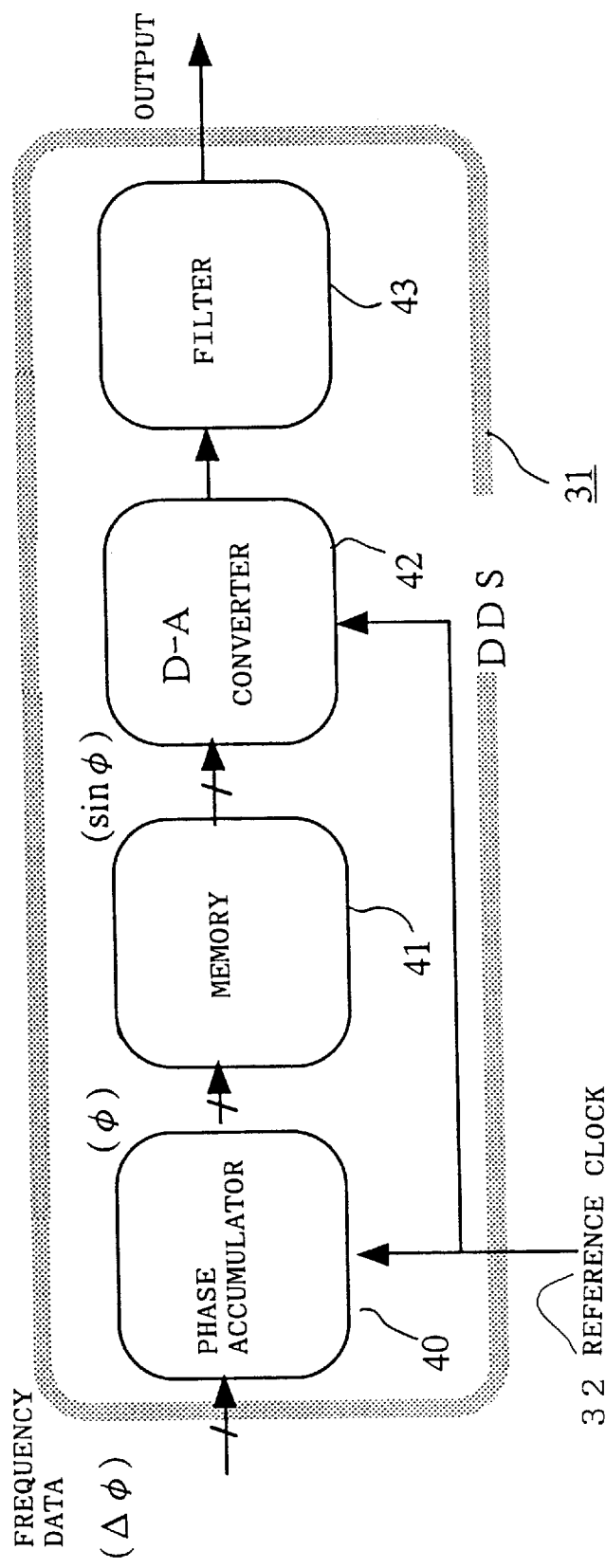
Figure 52:
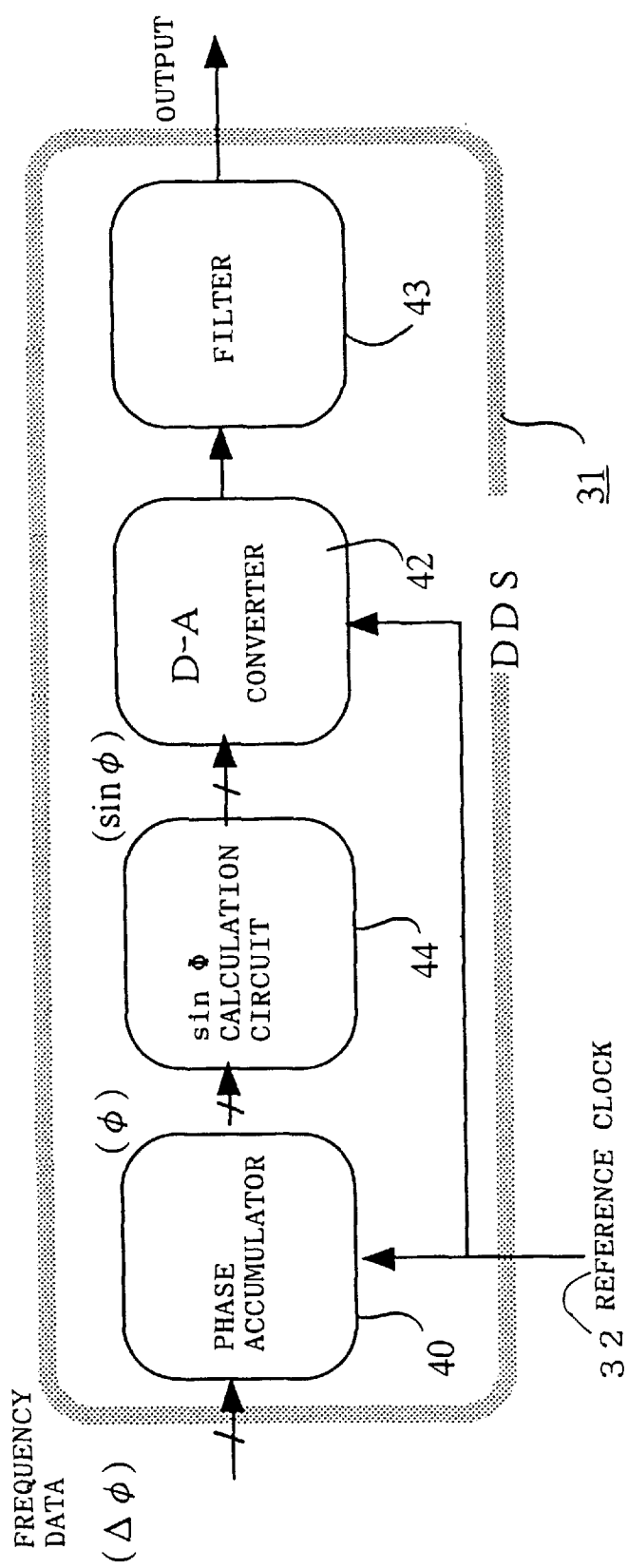
Figure 53:
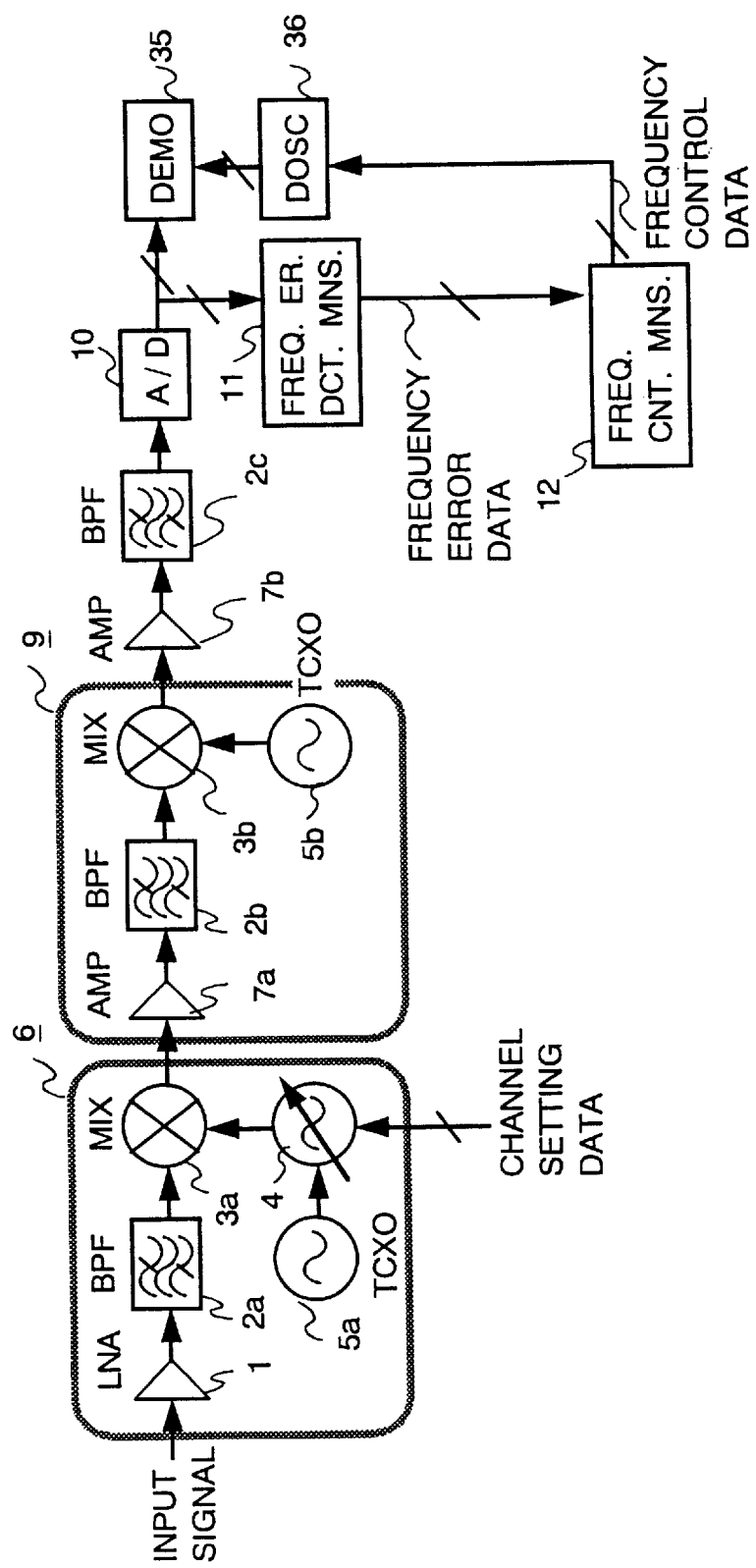
Figure 54:
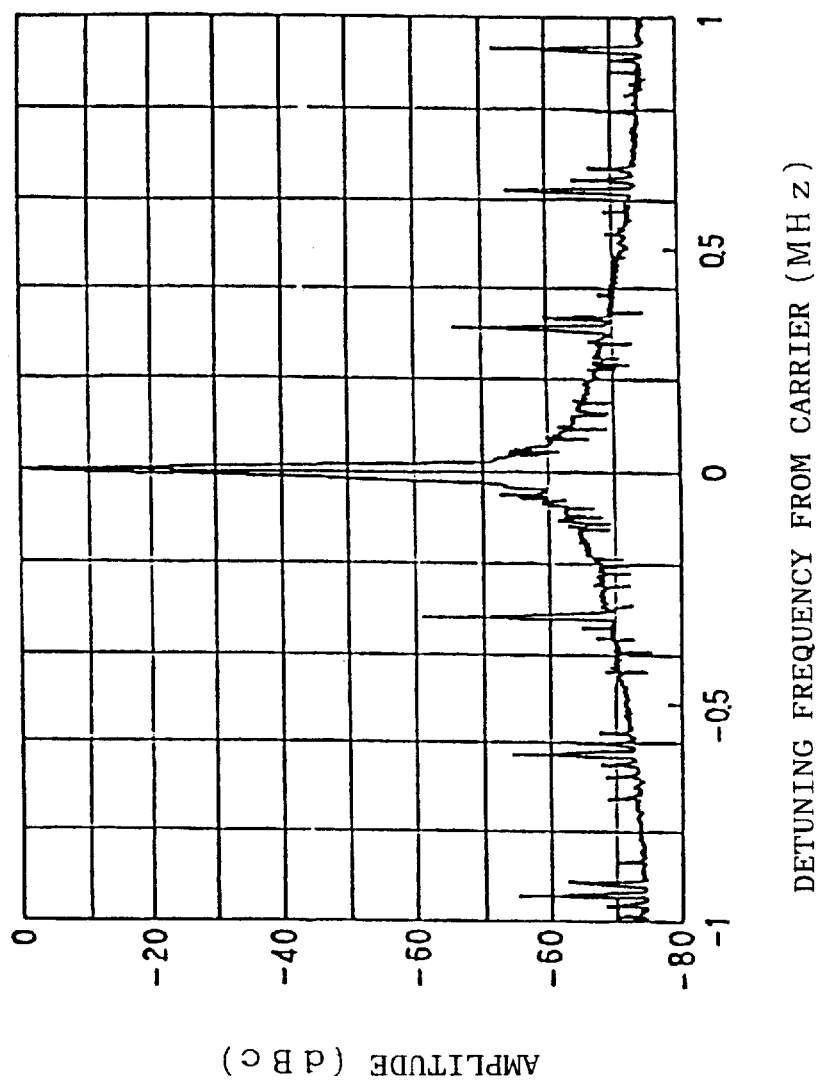

FIG. 37A shows a chart relating to operation of a level converter used for a frequency synthesizer according to Embodiment 14 of the present invention;

FIG. 37B shows another chart relating to operation of a level converter used for a frequency synthesizer according to Embodiment 14 of the present invention;

FIG. 38 shows a block diagram of an example of a frequency synthesizer according to Embodiment 15 of the present invention;

FIG. 39A shows a chart relating to an output spectrum of a frequency synthesizer according to Embodiment 15 of the present invention;

FIG. 39B shows another chart relating to an output spectrum of a frequency synthesizer according to Embodiment 15 of the present invention;

FIG. 39C shows another chart relating to an output spectrum of a frequency synthesizer according to Embodiment 15 of the present invention;

FIG. 40 shows a block diagram of an example of a frequency synthesizer according to Embodiment 16 of the present invention;

FIG. 41 shows a block diagram of an example of a loop filter used in a frequency synthesizer according to Embodiment 16 of the present invention;

FIG. 42A shows a chart relating to a characteristic of a loop filter used in a frequency synthesizer according to Embodiment 16 of the present invention;

FIG. 42B shows another chart relating to a characteristic of a loop filter used in a frequency synthesizer according to Embodiment 16 of the present invention;

FIG. 43 shows a block diagram of an example of a frequency synthesizer according to Embodiment 17 of the present invention;

FIG. 44A shows a chart relating to an output spectrum of a frequency synthesizer according to Embodiment 17 of the present invention;

FIG. 44B shows another chart relating to an output spectrum of a frequency synthesizer according to Embodiment 17 of the present invention;

FIG. 45 shows a chart relating to memory contents of a frequency synthesizer according to Embodiment 17 of the present invention;

FIG. 46 shows a block diagram of another example of a frequency synthesizer according to Embodiment 17 of the present invention;

FIG. 47 shows a block diagram of another example of a frequency synthesizer according to Embodiment 17 of the present invention;

FIG. 48 shows a block diagram of a conventional receiving apparatus;

FIG. 49 shows a block diagram of a conventional frequency synthesizer;

FIG. 50 shows a block diagram of a conventional frequency synthesizer;

FIG. 51 shows a block diagram of a conventional DDS;

FIG. 52 shows another block diagram of a conventional DDS;

FIG. 53 shows a block diagram of a conventional receiving apparatus;

FIG. 54 shows an output spectrum of a DDS; and

Figure 55:
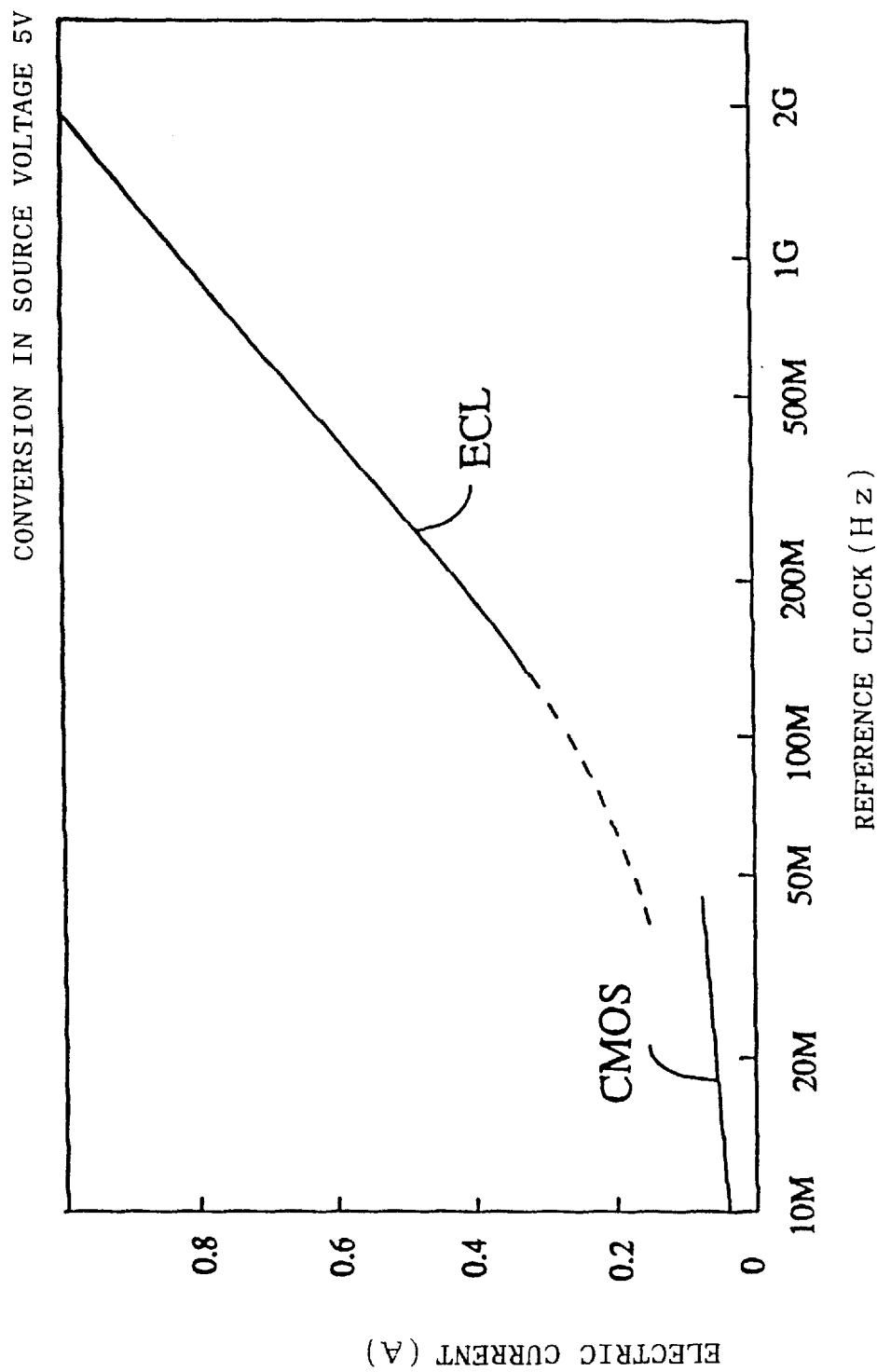

FIG. 55 shows a chart relating to electrical power consumption of a DDS.

10

DETAILED DESCRIPTION OF THE PREFERRED EMBODIMENTS

Embodiment 1

A receiving apparatus in this embodiment includes detecting means for detecting frequency error data. The frequency error data relates to the frequency difference between a center frequency of an input signal and a receiving frequency in the receiving apparatus. A direct digital synthesizer (DDS) is used for adjusting the receiving frequency finely so as to reduce a value of the frequency error data detected by the detecting means.

One example of the receiving apparatus of Embodiment 1 will be explained with reference to FIG. 1.

Figure 1:
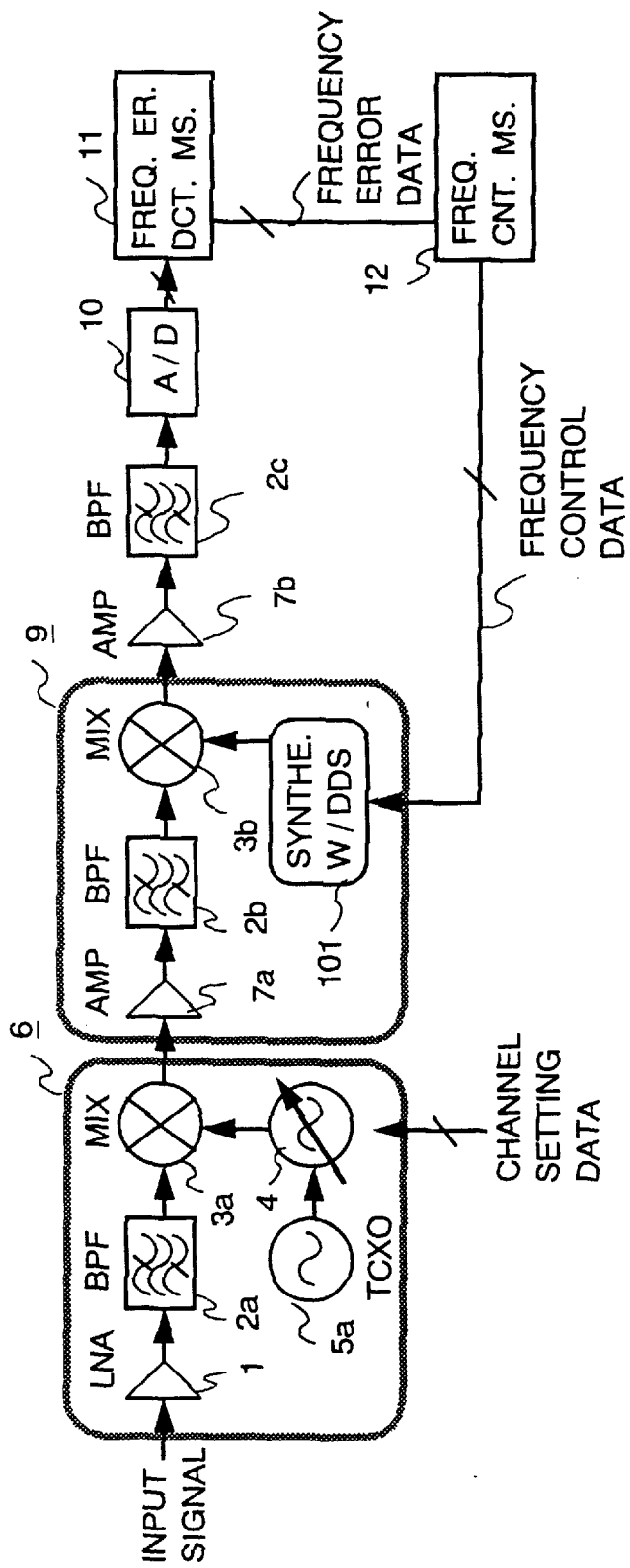
FIG. 1 shows a block diagram of one example of a receiving apparatus according to Embodiment 1 of the present invention.
Figure 2:
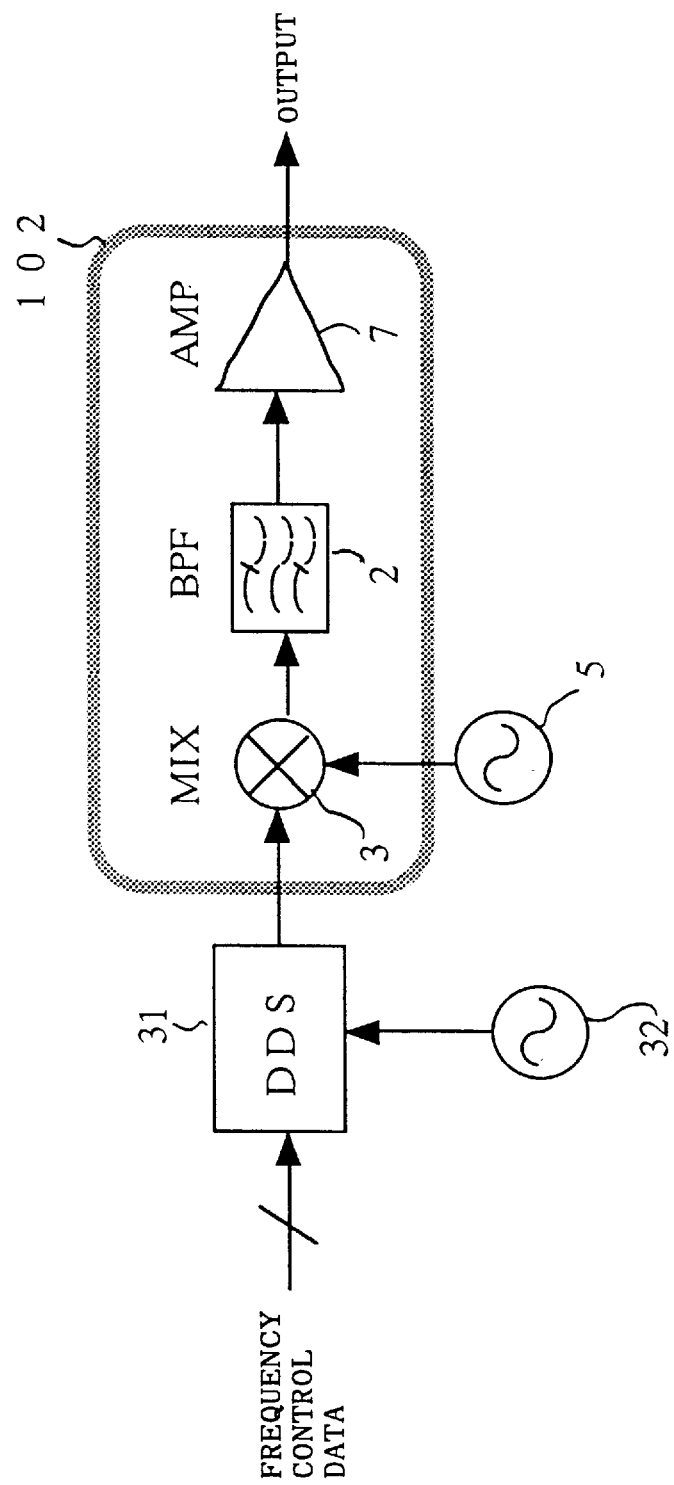
FIG. 2 shows a block diagram of one example of a synthesizer with DDS according to Embodiment 1 of the present invention.

In FIG. 1, a synthesizer (also called a local oscillator) 101 with a direct digital synthesizer (DDS) is shown. In FIG. 1, the same elements or the corresponding elements to the Related Art shown in FIG. 48 have the same references. The synthesizer 101 is composed of a DDS 31 and a frequency converter 102 as shown in FIG. 2. The frequency converter 102 is composed of a mixer 3, a band pass filter (BPF) 2 and an amplifier 7. A direct synthesis method is applied to the synthesizer 101 with DDS. A frequency output from DDS 31 is changed at the frequency converter 102.

Figure 3:
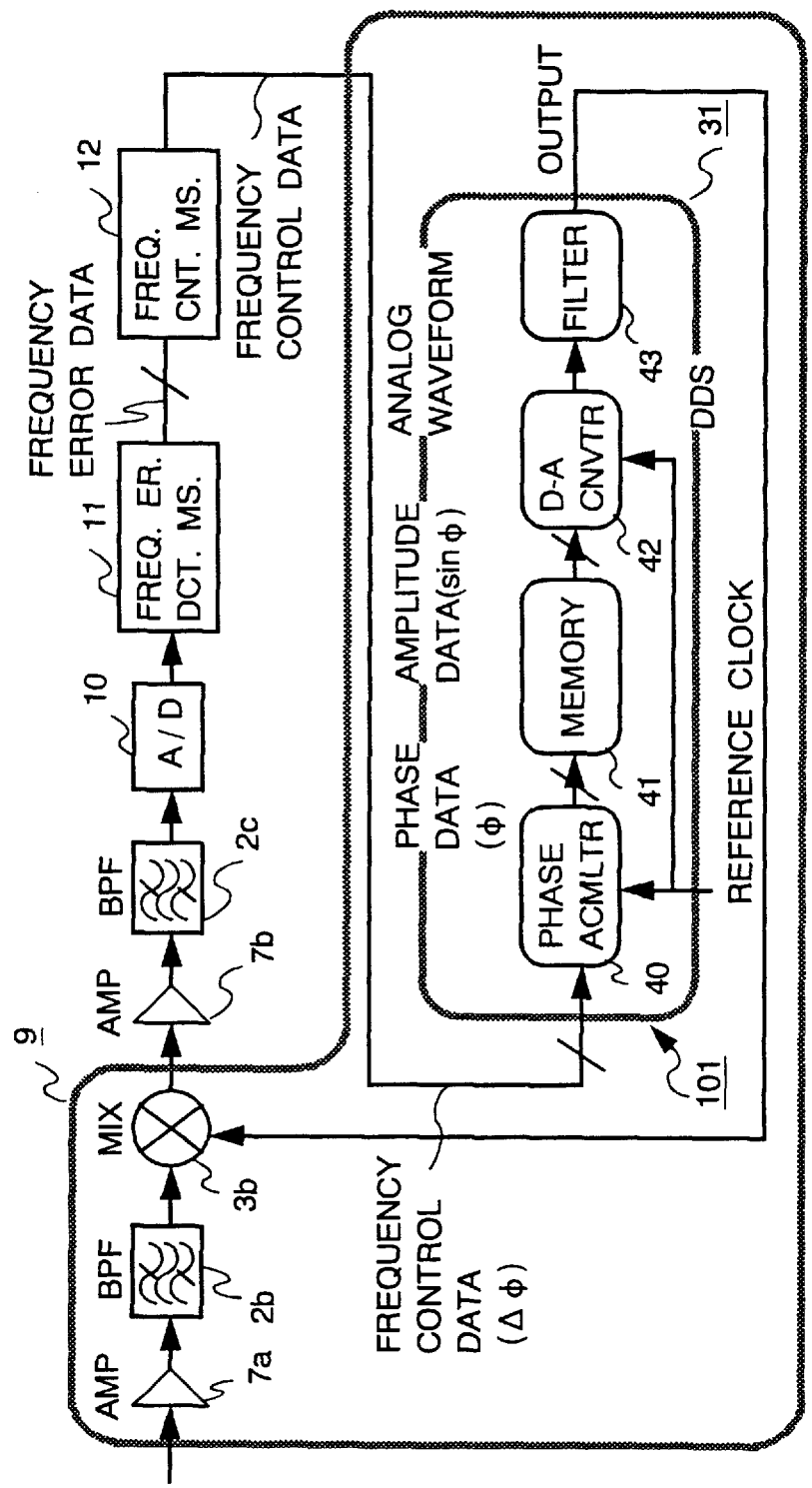
FIG. 3 shows a block diagram of another example of a receiving apparatus according to Embodiment 1 of the present invention.
Figure 4:
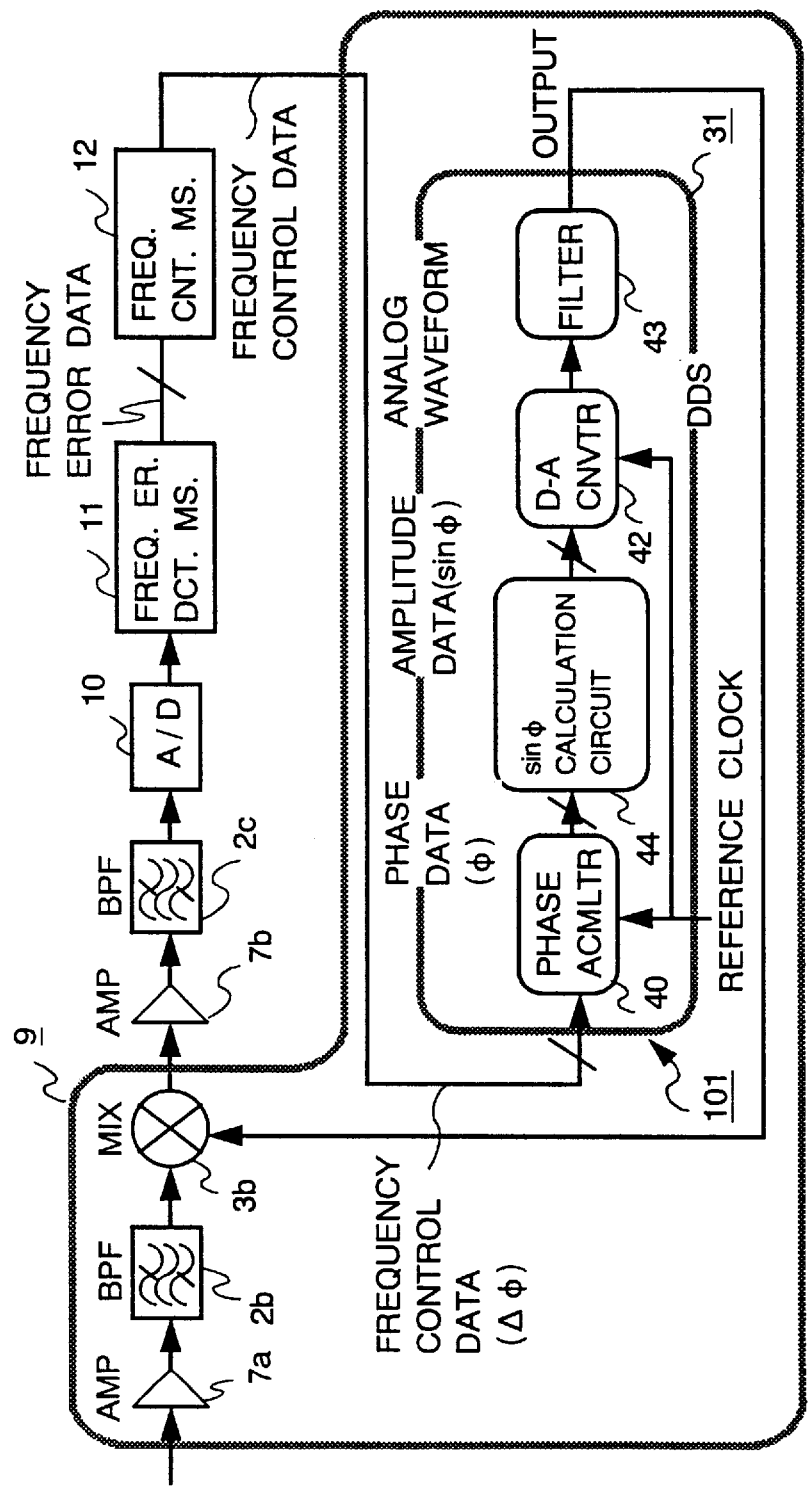
FIG. 4 shows a block diagram of another example of a receiving apparatus according to Embodiment 1 of the present invention.

As shown in FIGS. 3 and 4, DDS of a similar configuration as shown in FIGS. 51 and 52 can be used.

Figure 5:
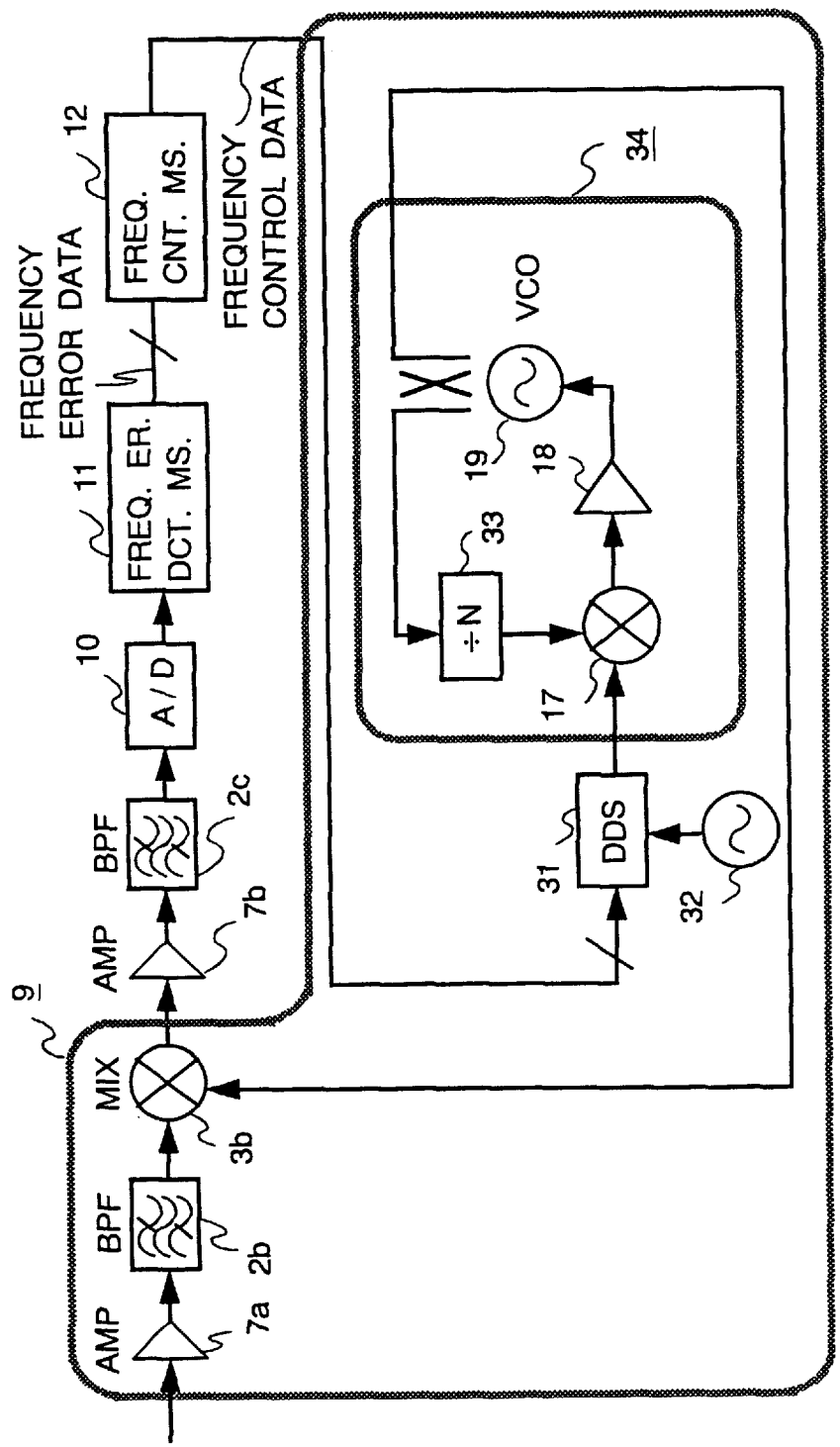
FIG. 5 shows a block diagram of another example of a receiving apparatus according to Embodiment 1 of the present invention.

As shown in FIG. 5, DDS combined with PLL shown in FIG. 50 can also be used.

The operation will now be explained. In the receiving apparatus of this embodiment, operations up to generating frequency control data at a frequency control means 12 are the same as the operations in the Related Art. However, the frequency control data at an auto frequency control (AFC) of the receiving apparatus of this embodiment can be used as frequency setting data of the DDS 31 used in the synthesizer 101 with the DDS. Accordingly, frequency control can be performed directly by digital data without using a memory and a D-A converter.

The detailed operation will be explained furthermore with reference to FIG. 3.

A frequency error detecting means 11 outputs frequency error data corresponding to a frequency error. The frequency error data is input into the frequency control means 12 and then becomes frequency control data $\Delta\phi$.

Figure 6:
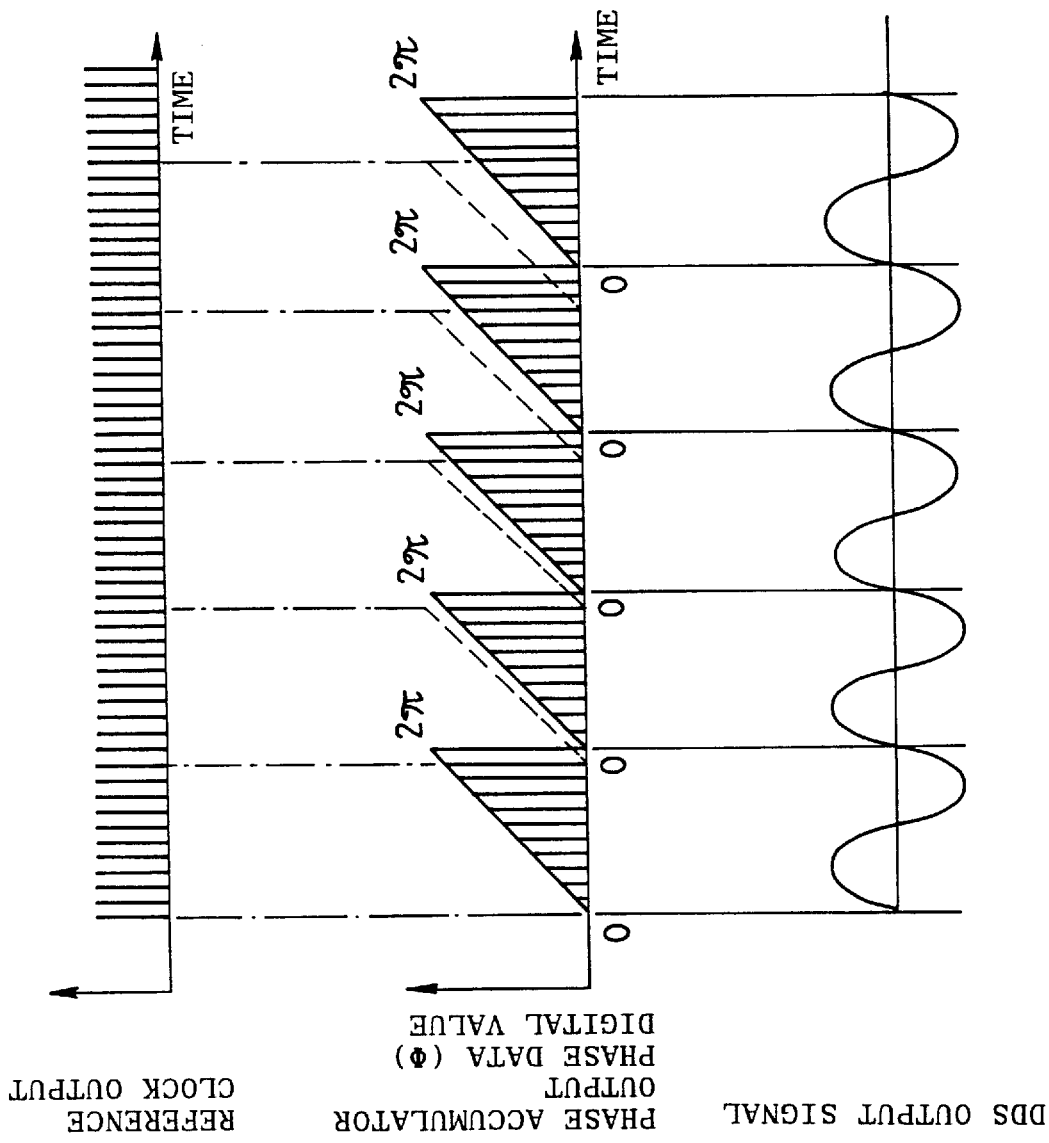
FIG. 6 shows a chart relating to operation of DDS according to Embodiment 1 of the present invention.

A phase accumulator 40 adds the frequency control data $\Delta\phi$ cumulatively using a reference clock 32 and outputs phase data $\phi$. The frequency control data $\Delta\phi$ is accumulated based on timing from the reference clock in the phase accumulator 40. A signal waveform of the reference clock is shown at the top of the chart in FIG. 6. A signal waveform of the output phase data $\phi$ is shown in the middle of the chart in FIG. 6. The phase accumulator 40 resets the accumulated phase at 0 when the accumulated phase becomes $2\pi$. Values 0 to $2\pi$ are repeatedly output from the phase accumulator 40. The reference clock is constructed to have more than two periods at one period of an output signal. The signal waveform in the middle of the chart in FIG. 6 shows a case that an interval of each triangle wave period generated in the phase accumulator 40 gradually gets wider. The interval of the triangle wave period becomes wider depending upon values of the frequency control data $\Delta\phi$ and an accumulated time between 0 and $2\pi$. The less the value of the frequency control data $\Delta\phi$ becomes and the longer the value of the accumulated time between 0 and $2\pi$ becomes, the wider the interval of the triangle wave period becomes.

As shown in FIG. 7, a memory 41 has data $\phi$ as an address data and waveform data (amplitude data) corresponding to phase as a look-up table.

In FIG. 7, the phase data φ indicates a phase corresponding to amplitude data stored in the memory 41. Moreover, the phase data φ indicates an address of the memory 41. The amplitude data is read by the address. The amplitude data is converted to an analog value at a D-A converter 42 and then passed through a filter 43 in order to extract necessary frequency components. A low pass filter (LPF) is generally used for the filter 43. A BPF can be used also for the filter 43 so as to generate high frequency in the case that Nyquist loop back frequency is used.

The analog signal filtered at the filter 43 becomes the output signal shown at the bottom of the chart in FIG. 6 and is output to a mixer 3b.

Accordingly, when the receiving frequency of the input signal is higher than the frequency of the received signal, value of the frequency control data Δφ becomes large. Then, the frequency of output signal from the DDS 31 becomes higher in order to make the receiving frequency coincident with the frequency of the input signal. Conversely when the receiving frequency of the input signal is lower than the frequency of the received signal, the value of the frequency control data Δφ becomes small. Then, the frequency of output signal from the DDS 31 becomes low in order to make the receiving frequency coincident with the frequency of the input signal. Thus, the output signal having a substantially similar frequency as the input signal can be obtained.

The DDS 31 inputs the frequency control data Δφ and generates the output signal using the reference clock. By using the DDS 31, the receiving apparatus can generate a signal corresponding to the frequency of input signal even when the frequency of input signal is set at large range and is changed.

The followings are features of the receiving apparatus of this embodiment. The receiving apparatus includes the frequency converter 9 having a mixer 3b and a synthesizer (local oscillator) 101. The receiving apparatus also includes the detecting means 11 for detecting frequency error data. The frequency error data represents the frequency difference between the center frequency of the input signal and receiving frequency in the receiving apparatus. In order to reduce the frequency error data detected by the detecting means 11, the frequency control means 12 for controlling the output frequency of the local oscillator 101 is also provided in the receiving apparatus. The frequency synthesizer 101 has the direct digital synthesizer 31 as a part of the local oscillator 101. The DDS 31 is composed of digital operation means and the D-A converter 42. The digital operation means outputs an amplitude value of periodic waveform based on a periodic function, synchronizing with the reference clock. The D-A converter converts the output of the digital operation means to an analog waveform.

In the receiving apparatus of this embodiment, a voltage-controlled quartz-crystal oscillator (VCXO) 8, a memory 13 and a D-A converter 14 are not necessary, which has an effect that the apparatus can be simplified and manufacturing cost can be lessened. It is also unnecessary to measure a characteristic on control voltage vs. output frequency of the VCXO 8. Since writing measured data onto the memory 13 is not necessary, the manufacture cost of the apparatus can be reduced. Though frequency setting accuracy of the DDS 31 is dependent on the reference clock 32, the relative accuracy is precise. There is another effect that a setting error of the receiving frequency and a sign error rate are less.

Figure 8:
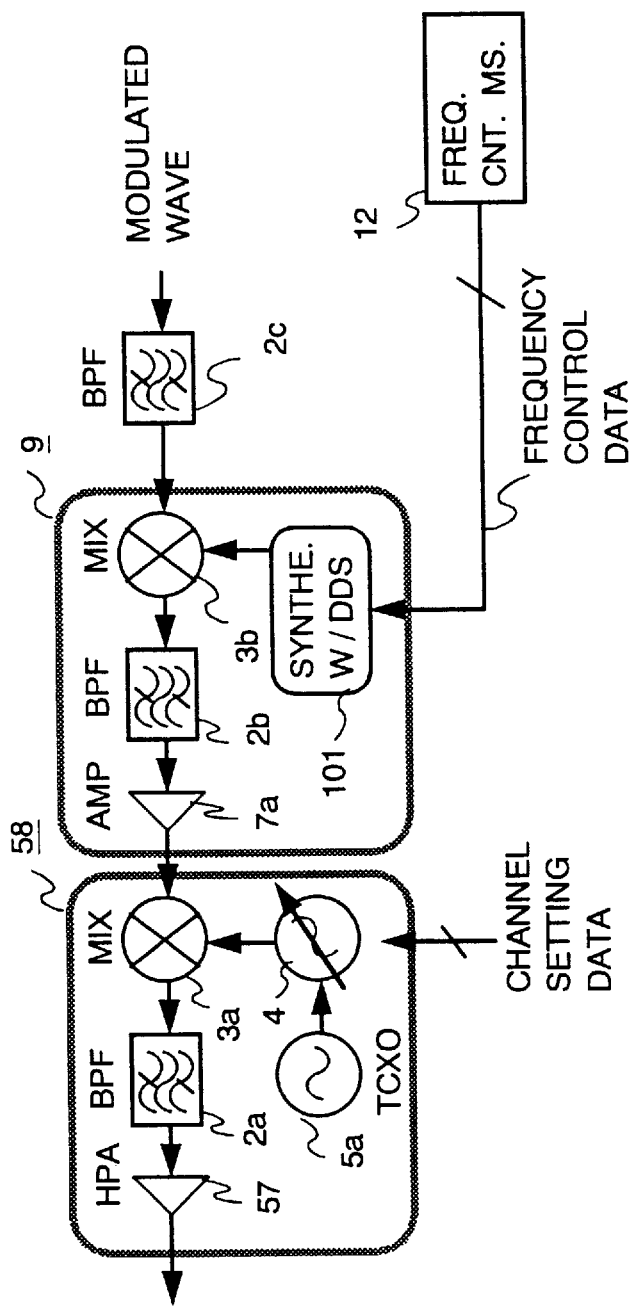
FIG. 8 shows a block diagram of one example of a transmitting apparatus according to Embodiment 1 of the present invention.

Although the receiving apparatus has been explained in Embodiment 1 as an example, the same configuration can be applicable to a transmitting apparatus, as shown in FIG. 8.

A high power amplifier (HPA) 57 and a frequency converter 58 for transmitting are shown in FIG. 8.

The operation will now be explained. A modulated wave modulated by a modulator (not shown) is input through an amplifier 7b (not shown) and a band pass filter 2c. A frequency of the input signal is changed at the mixer 3b. The frequency-changed signal is changed to RF (radio frequency) signal at a mixer 3a in the frequency converter 58. Then, the changed signal is amplified at the HPA 57 and output. The synthesizer 101 with DDS is used as a carrier wave source for the mixer 3b. The frequency control data from the frequency control means 12 is input into the synthesizer 101 with DDS. By controlling the frequency, the same effect as that of the receiving apparatus can also be obtained in the transmitting apparatus.

Embodiment 2

There are more than two local oscillators in the transmitting apparatus or the receiving apparatus of this embodiment. The transmitting apparatus or the receiving apparatus includes frequency control means. The frequency control means controls an output frequency from the local oscillator in order to reduce a frequency error in a receiving frequency or in a transmitting frequency. A frequency synthesizer of phase locked loop configuration is used as a first local oscillator for changing high frequency. A frequency synthesizer with DDS is used as a second local oscillator for changing intermediate frequency. Setting receiving/transmitting channel roughly is performed at the first local oscillator. Setting receiving/transmitting channel finely is performed at the second local oscillator. A setting error of transmitting/receiving frequency is also corrected at the second local oscillator.

One example of the receiving apparatus or the transmitting apparatus of Embodiment 2 will now be described. First, the receiving apparatus is explained.

Figure 9:
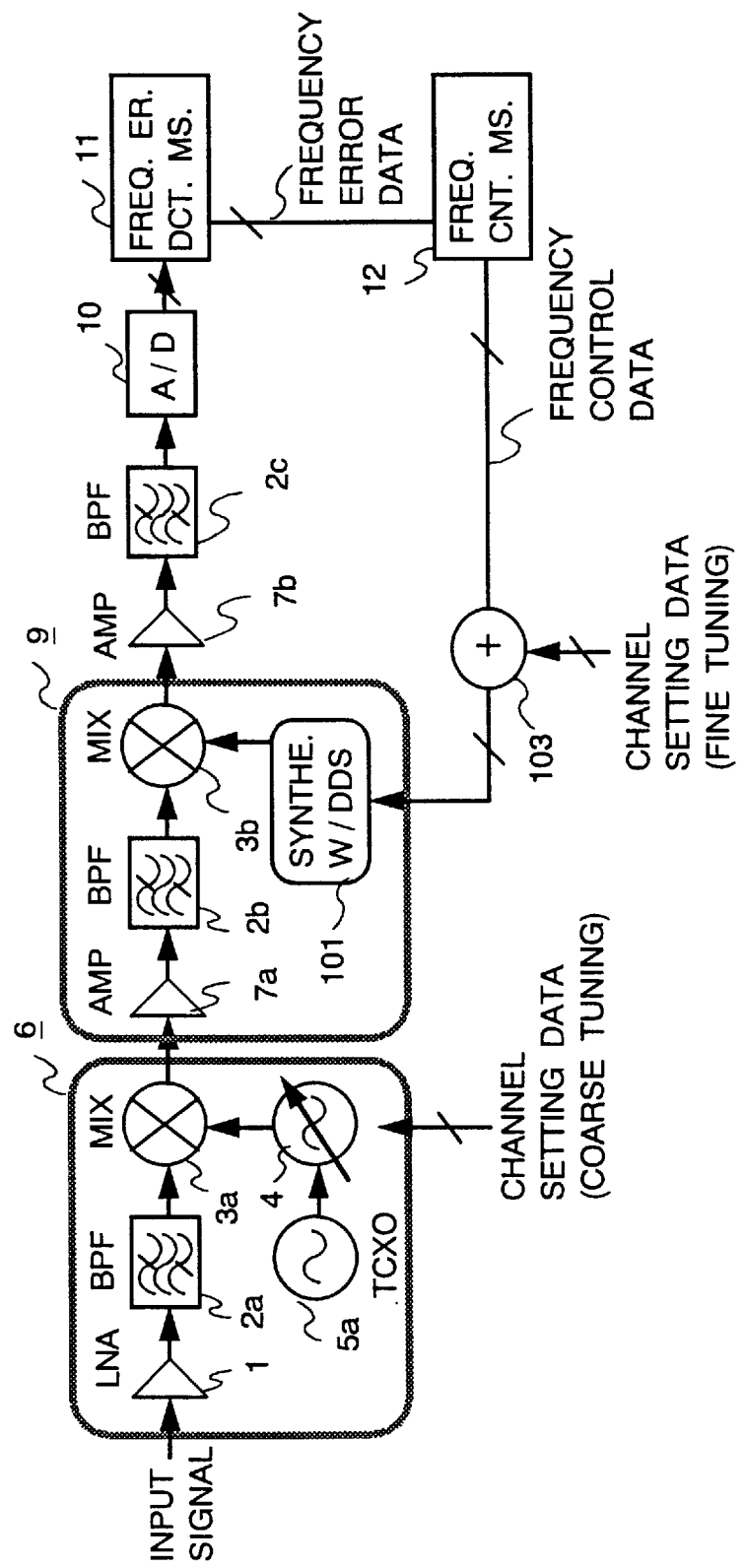
FIG. 9 shows a block diagram of one example of a receiving apparatus according to Embodiment 2 of the present invention.

In FIG. 9, an adder 103 is shown and the same elements or the corresponding elements to the elements in FIG. 1 have the same references. The synthesizer 101 with DDS has the same configuration as the one in Embodiment 1.

The operation will now be stated. In the receiving apparatus of Embodiment 2, the synthesizer 101 with DDS, used as AFC (auto frequency control) in Embodiment 1, has another role of setting a receiving channel in addition to a role of AFC. A coarse frequency setting, at every ten channels for instance, is performed by a PLL (phase locked loop) synthesizer 4. A fine frequency setting, for each of the ten channels for example, is performed by the synthesizer 101 with DDS. The frequency control data by the AFC is added to channel setting data at the adder 103. The added data becomes frequency setting data of DDS 31.

FIGS. 10A and 10B show examples of the channel setting data. The channel setting data is given through a channel setting circuit (not shown) including a CPU or a microprocessor. The channel setting circuit in this embodiment provides the channel setting data shown in FIGS. 10A and 10B to a receiving circuit. FIG. 10A shows the channel setting data for coarse tuning. FIG. 10B shows the channel setting data for fine tuning. Unit 100 kHz is used in the case of the coarse tuning. Unit 10 kHz is used in the case of the fine tuning. If it is needed to set the channel at 1200.11 MHz, the channel setting data for the coarse tuning is "001" and the channel setting data for the fine tuning is "0001". The channel setting data for the fine tuning is added to the frequency control data Δφ and input to the synthesizer 101 with DDS. Accordingly, the synthesizer 101 with DDS performs the fine tuning of the channel and corrects the frequency.

Because of performing the fine frequency setting by the synthesizer 101 with DDS, channel intervals of the PLL synthesizer 4 can be wide. Thus, it becomes possible to increase a phase comparison frequency fr of the PLL synthesizer 4, which has effects of reducing phase noise PN in equation (1) and increasing frequency switching speed. In addition, the same effect as Embodiment 1 can be obtained by using the DDS 31 for AFC.

Figure 11:
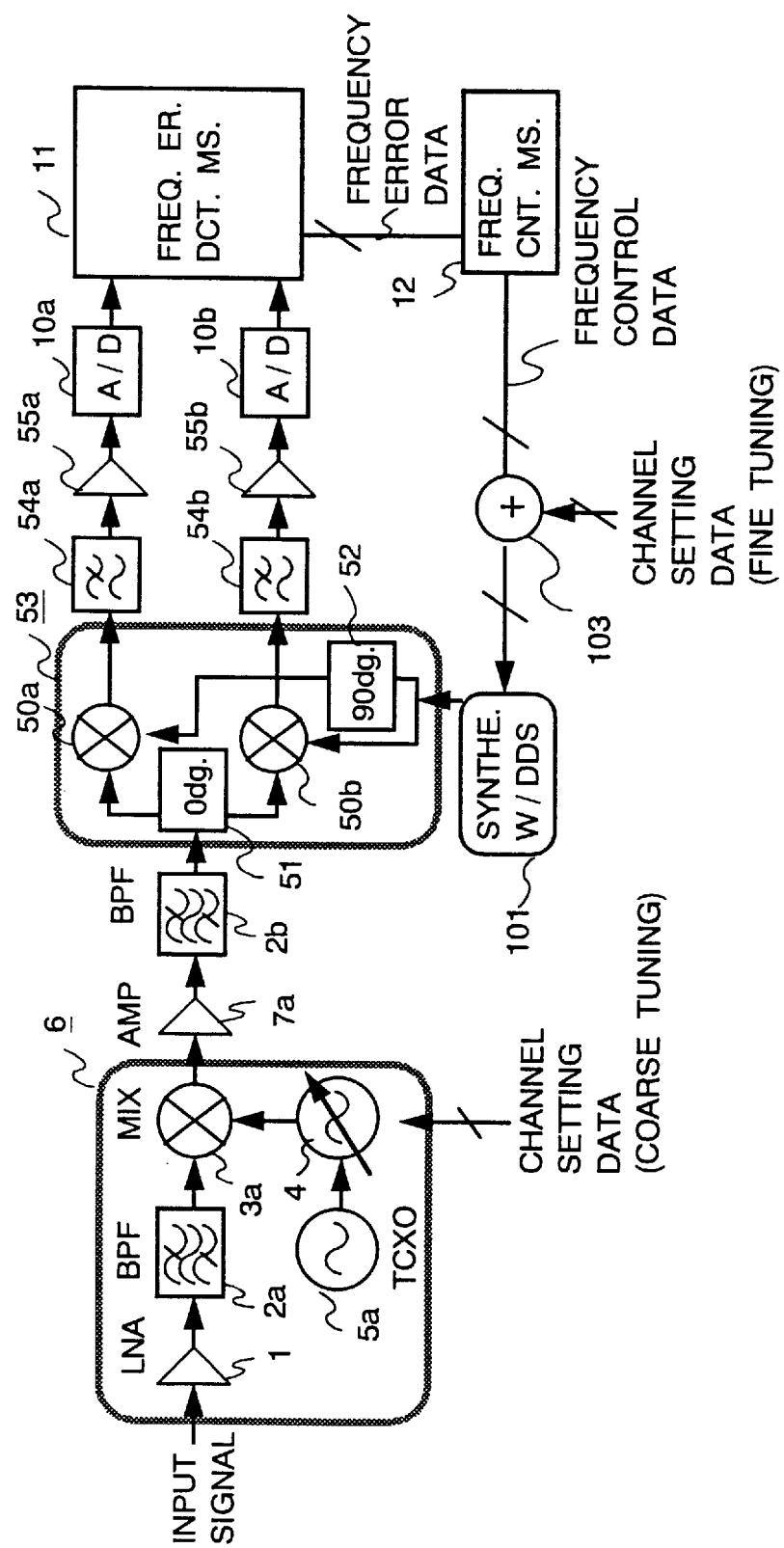
FIG. 11 shows a block diagram of another example of a receiving apparatus according to Embodiment 2 of the present invention.

The receiving apparatus of Embodiment 1 and Embodiment 2 has a configuration wherein an IF (intermediate frequency) signal is A-D converted and demodulated. Another configuration is also acceptable as shown in FIG. 11, where quasi-synchronization detection is performed at a quadrature mixer 53 of IF band and an output of the base band is A-D converted and demodulated. This configuration has the same effect as the above configuration.

In FIG. 11, unit mixers 50a and 50b, an in-phase distributor 51, an opposite phase distributor 52, the quadrature mixer 53, low-pass filters (LPF) 54a and 54b and base band amplifiers 55a and 55b are shown. The quadrature mixer 53 includes the unit mixers 50a and 50b, the in-phase distributor 51 and the opposite phase distributor 52. The low-pass filters 54a and 54b filter an output of the quadrature mixer 53. In the receiving apparatus shown in FIGS. 1 and 9, values in orthogonal coordinate which transits timewise are calculated from the IF signal by a digital signal process. The orthogonal coordinate values are calculated by the quadrature mixer 53 in FIG. 11. Other elements in FIG. 11 are the same as the elements in FIGS. 1 and 9 and have the same effect.

Figure 12:
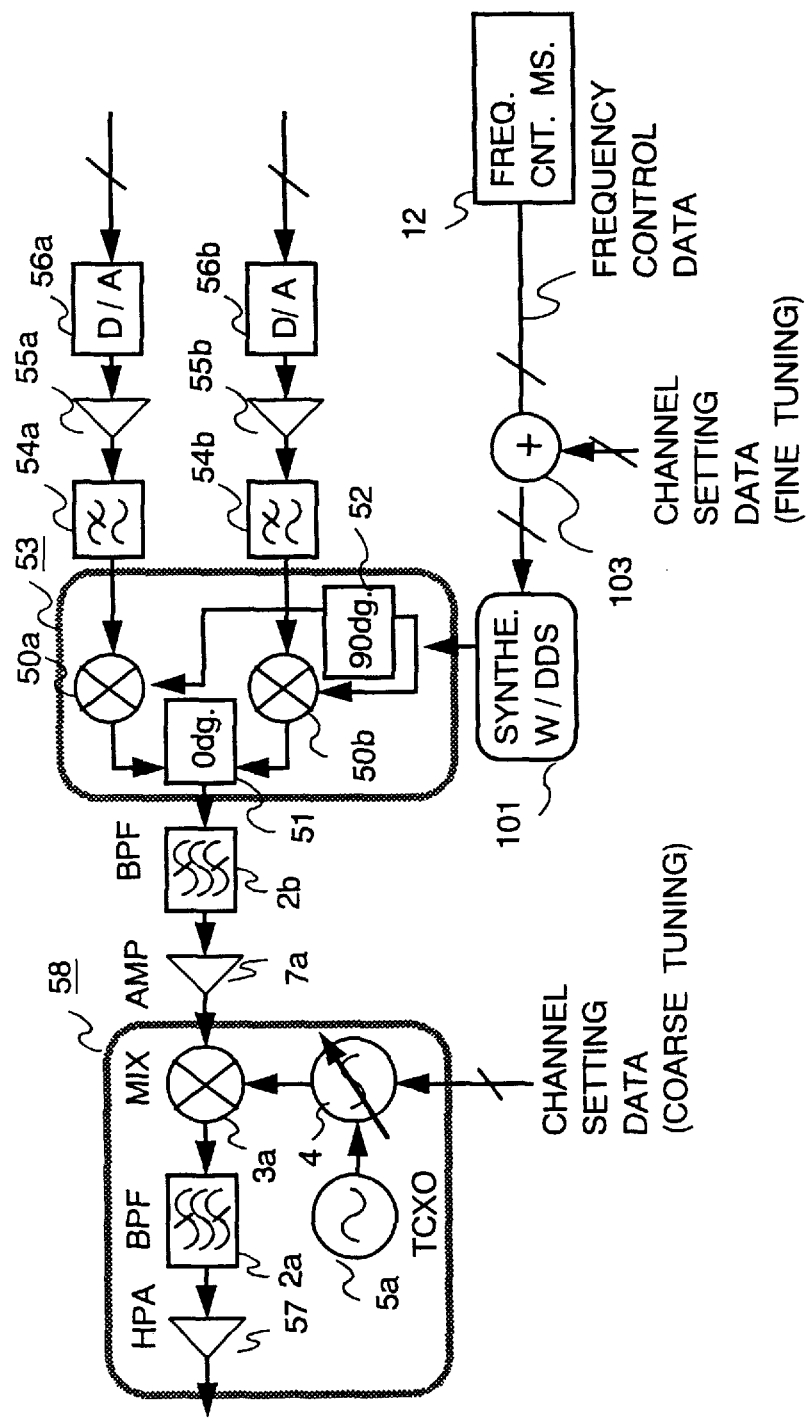
FIG. 12 shows a block diagram of one example of a transmitting apparatus according to Embodiment 2 of the present invention.

The receiving apparatus has been described as one example in the explanation on Embodiment 2. The same configuration can also be acceptable in the transmitting apparatus as shown in FIG. 12. D-A converters 56a and 56b, the high power amplifier (HPA) 57 and the frequency converter 58 for transmitting are shown in FIG. 12.

The operation will now be explained. Data of I and Q indicating coordinate points of a modulated wave is converted to voltage waveform in the D-A converters 56a and 56b. The converted wave is modulated at the quadrature mixer 53 via the base band amplifiers 55a, 55b and LPFs 54a, 54b. Then, the modulated wave is frequency-changed to an RF signal at the mixer 3a in the frequency converter 58 for transmitting. The frequency-changed signal is amplified at the HPA 57 and output. In this case, the synthesizer 101 with DDS used as a carrier wave source of the quadrature mixer 53. The frequency control data from the frequency control means 12 is added to fine channel setting data at the adder 103. The same effect as the receiving apparatus can be obtained by controlling the synthesizer 101 with a DDS based on the added result.

The followings are features of the receiving apparatus or the transmitting apparatus of this embodiment. There are more than two local oscillators in the transmitting apparatus or the receiving apparatus. The transmitting apparatus or the receiving apparatus includes the frequency control means 12. The frequency control means 12 controls the output frequency from the local oscillator 101 in order to reduce the frequency error in the receiving frequency or the frequency error in the transmitting frequency. The frequency synthesizer 4 of phase locked loop configuration, is used as the first local oscillator for changing high frequency. The frequency synthesizer 101 with DDS is used as the second local oscillator for changing intermediate frequency. The DDS is composed of the digital operation means and the D-A converter. The digital operation means outputs an amplitude value of periodic waveform of a periodic function, synchronizing with the reference clock. The D-A converter converts the output of the digital operation means to the analog waveform. The transmitting/receiving channel is coarsely set at the first local oscillator. The transmitting/receiving channel is finely set at the second local oscillator. The setting error of the transmitting/receiving frequency is also corrected at the second local oscillator.

Embodiment 3

In the receiving apparatus or the transmitting apparatus of this embodiment, a frequency synthesizer with a DDS for low frequency and a frequency synthesizer of phase locked loop configuration for high frequency are provided. The frequency synthesizer for low frequency is used as a reference oscillator of the frequency synthesizer for high frequency. A variable divider is included in the frequency synthesizer for high frequency. Setting a receiving frequency or transmitting frequency coarsely is performed by changing a dividing number of the variable divider. Setting a receiving frequency or transmitting frequency finely and correcting an error of the setting frequency are performed by the DDS.

One example of the receiving apparatus or the transmitting apparatus of Embodiment 3 will now be explained with reference to FIG. 13.

Figure 13:
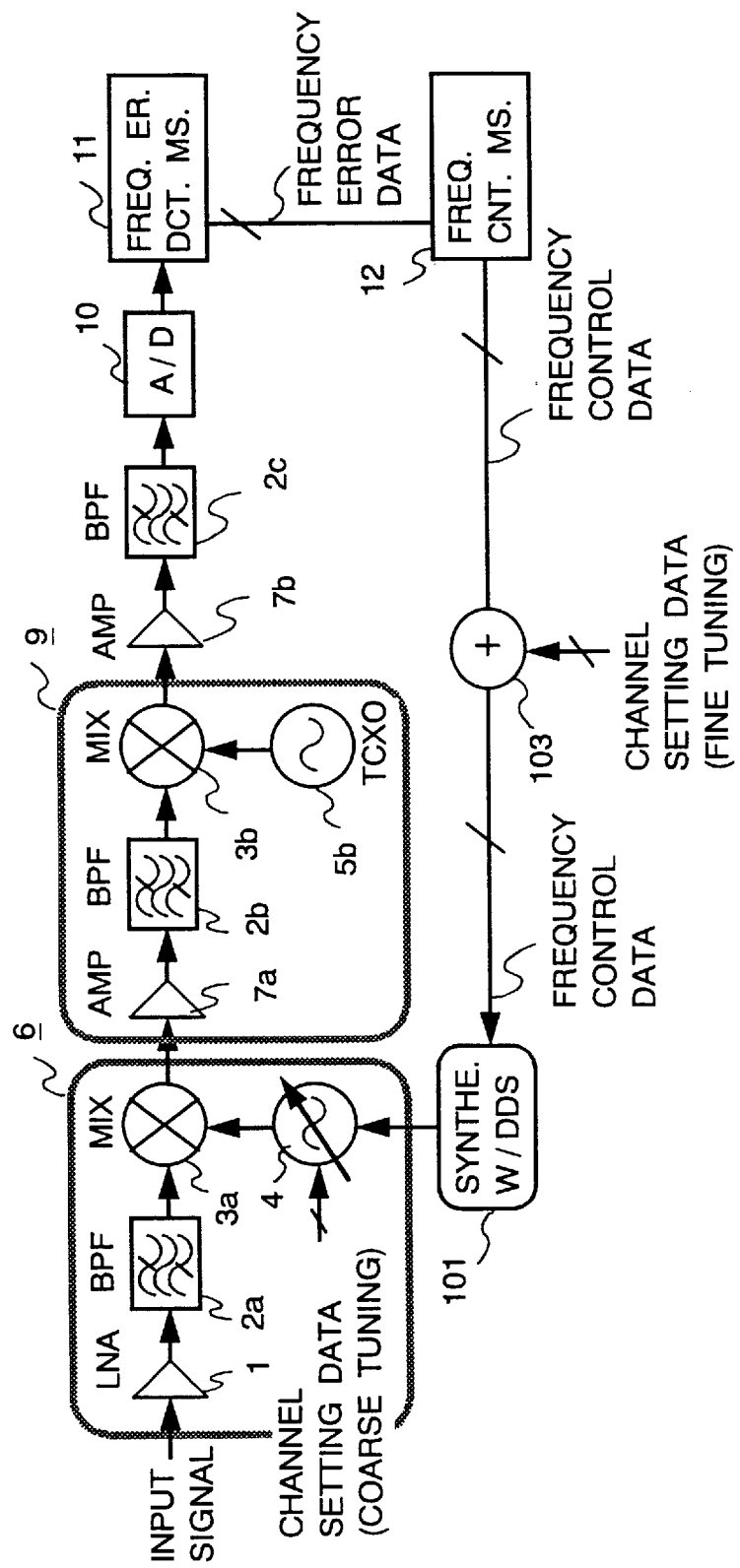
FIG. 13 shows a block diagram of an example of a receiving apparatus according to Embodiment 3 of the present invention.

Relating to the receiving apparatus, the same elements or the corresponding elements to the elements in FIG. 1 has the same references in FIG. 13. The synthesizer 101 with DDS has the same configuration as Embodiment 1. The PLL synthesizer 4 has the same configuration as the one shown in FIG. 49.

The operation of the receiving apparatus will now be described. The synthesizer 101 with a DDS is used for AFC and for setting the receiving channel finely. The PLL synthesizer 4 is used for setting the frequency coarsely. Namely, setting the frequency roughly is performed by changing the dividing number of a variable divider 15. Setting the frequency finely is performed by the DDS 31. Frequency control data by AFC is added to channel setting data at the adder 103. The added data becomes frequency setting data for the DDS 31. The way that the synthesizer 101 with DDS is used as a reference oscillator for the PLL synthesizer 4 differs from that of Embodiment 2.

Since channel intervals of the PLL synthesizer 4 can be wide in the configuration of this embodiment as well as Embodiment 2, it becomes possible to increase a phase comparison frequency fr of the PLL synthesizer 4. This has effects of reducing the phase noise PN in the equation (1) and increasing the frequency switching speed. In addition, the same effect as Embodiment 1 can be obtained by using the DDS 31 for AFC. The present embodiment has an effect that interference of neighboring channels can be lessened. The reason for this is that an output from the mixer 3a has a bandwidth only for one channel because the synthesizing functions are concentrated on a high frequency operation in the receiving apparatus. This result is different from that of Embodiments 1 and 2. Namely, interference of the neighboring channels can be lessened by restricting the bandwidth in a BPF 2b.

The case that the variable divider 15 is used as the PLL synthesizer 4 has been stated above. It is also acceptable to use fixed frequency dividing. In this case, the synthesizer 101 with DDS is used for the channel setting and AFC, which has the same effect.

Figure 14:
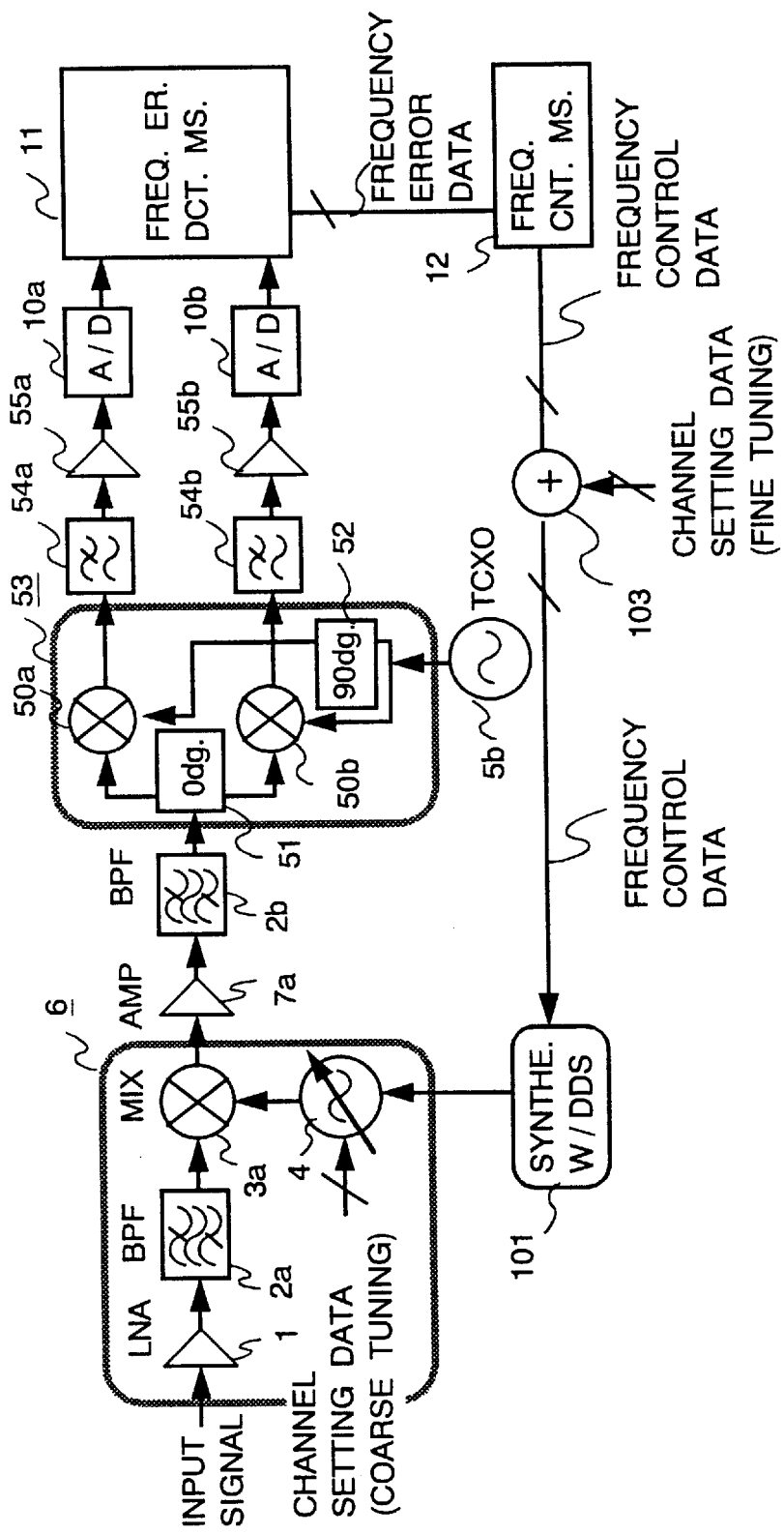
FIG. 14 shows a block diagram of another example of a receiving apparatus according to Embodiment 3 of the present invention.

The above receiving apparatus of Embodiment 3 has a configuration wherein the IF signal is A-D converted and modulated. As shown in FIG. 14, another configuration wherein quasi-synchronization detection is performed at a quadrature mixer of IF band and an output of the base band is A-D converted and demodulated, is also acceptable. This configuration has the same effect as the above configuration.

Figure 15:
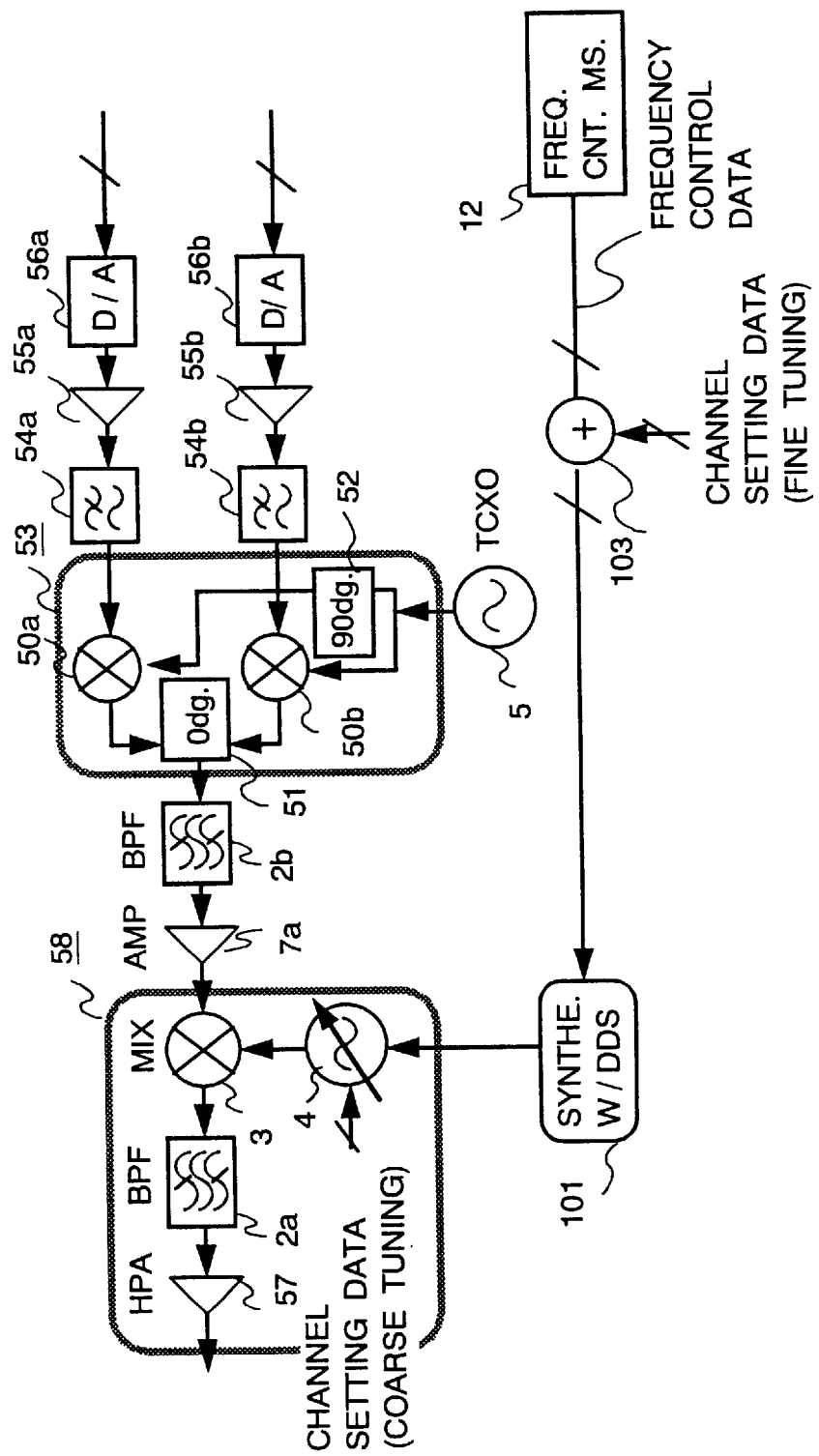
FIG. 15 shows a block diagram of one example of a transmitting apparatus according to Embodiment 3 of the present invention.

The receiving apparatus has been described as one example of Embodiment 3. As shown in FIG. 15, the above stated configuration can be applied also to the transmitting apparatus. The transmitting apparatus has the same effect as the receiving apparatus.

The followings are features of the receiving apparatus or the transmitting apparatus of this embodiment. The frequency synthesizer 101 with DDS for low frequency and the frequency synthesizer 4 of phase locked loop configuration for high frequency are provided in the receiving apparatus or the transmitting apparatus. The DDS includes the digital operation means and the D-A converter. The digital operation means outputs an amplitude value of periodic waveform of a periodic function, synchronized with the reference clock. The D-A converter converts the output of the digital operation means to an analog waveform. The frequency synthesizer 101 for low frequency is used as the reference oscillator of the frequency synthesizer 4 for high frequency. The variable divider 15 is included in the frequency synthesizer 4 for high frequency. Setting the receiving frequency or the transmitting frequency coarsely is performed by changing the dividing number of the variable divider 15. Setting the receiving frequency or the transmitting frequency finely and correcting the error of the setting frequency are performed by the DDS.

Embodiment 4

The receiving apparatus or the transmitting apparatus having a heterodyne configuration has been explained in Embodiments 1 to 3. The receiving apparatus and the transmitting apparatus of this embodiment has a homodyne configuration. A frequency of base band signal and a frequency of high frequency signal are changed directly by a quadrature mixer in the homodyne configuration. A frequency synthesizer of phase locked loop configuration for high frequency is used as a carrier wave source for the quadrature mixer. A frequency synthesizer with DDS for low frequency is used as a reference oscillator of the frequency synthesizer for high frequency.

The transmitting apparatus or the receiving apparatus of Embodiment 4 has the homodyne configuration wherein quasi-synchronization detection is performed at the quadrature mixer 53 of RF band. This configuration will now be explained with reference to FIG. 16 for describing the receiving apparatus as an example. The homodyne configuration has a problem that auto frequency control (AFC) can not be performed at the VCXO 8 of low frequency since only one oscillator is needed in the configuration. Conventionally, AFC has been performed at the VCXO 8 of low frequency.

Figure 16:
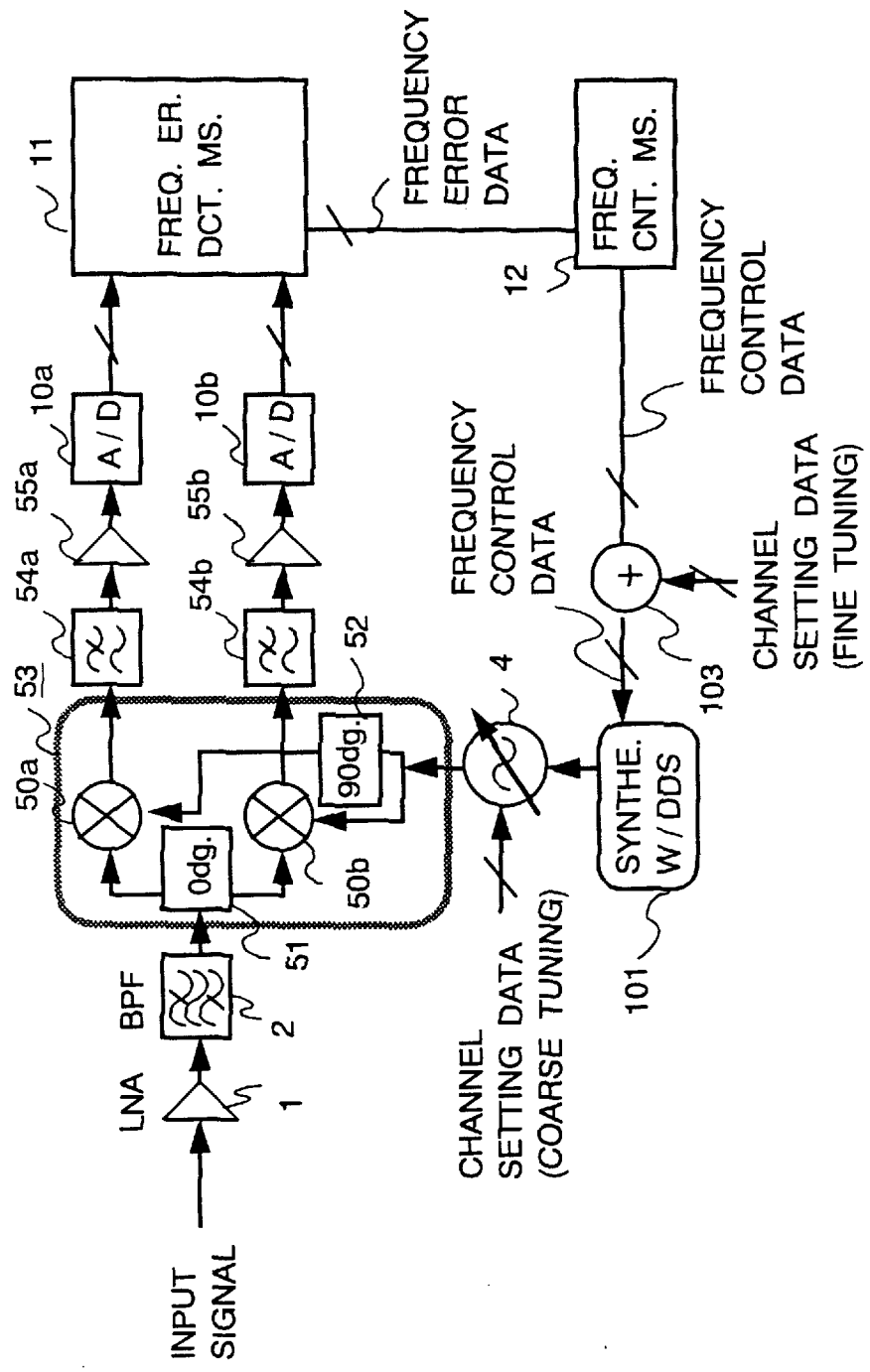
FIG. 16 shows a block diagram of an example of a receiving apparatus according to Embodiment 4 of the present invention.

In FIG. 16, the same elements or corresponding elements to the elements in FIG. 11 have the same references. The synthesizer 101 with DDS has the same configuration as the one in Embodiment 1.

Now, the operation will be described. An input signal is amplified at a low noise amplifier (LNA) 1, filtered at the BPF 2 and input into the quadrature mixer 53 of RF band. Values for points in orthogonal coordinate of a modulated signal, which transits timewise, in the input signal are output from the quadrature mixer 53 by multiplying the input signal and the carrier wave in analog. The outputs are filtered at the LPFs 54a and 54b, amplified at base band amplifiers 55a and 55b and input into A-D converters 10a and 10b with desired level. The A-D converters 10a and 10b output coordinate data. Based on the coordinate data of the input signal, which has been converted to digital data by the A-D conversion, the input data is demodulated. Simultaneously, frequency error data is extracted by the frequency error detecting means 11. The synthesizer 101 with DDS, whose DDS is the reference oscillator of the PLL synthesizer 4, is controlled to reduce the frequency error by the frequency control means 12, based on the frequency error data. It is also acceptable to add fine channel setting data to the frequency control data by the adder 103 as well as Embodiment 2.

The receiving apparatus of homodyne configuration has an advantage that its configuration is simple. However, since only one carrier wave for the quadrature mixer 53 is input, it is necessary to use the VCXO 8 as the reference oscillator of the PLL synthesizer 4, which is the carrier wave source, when AFC is necessary. In this case, higher control technology for the VCXO 8 is needed because output frequency of the VCXO 8 is multiplied by the frequency interval of the channel at the PLL synthesizer 4. Actually, it has been very difficult to realize such a high control technology. However, it is possible to use AFC easily even in the homodyne configuration according to the configuration of the present embodiment. The reason is that since it is possible to realize very precise relative accuracy of frequencies by the DDS 31, the configuration of this embodiment has an effect that AFC can be used easily even in the homodyne configuration.

In addition to the above-mentioned peculiar effect of this configuration, there are other effects such as that the phase noise PN in the equation (1) can be reduced and the frequency switching speed can be increased, as in Embodiments 2 and 3. The reason is that since it is possible to make the channel intervals of the PLL synthesizer 4 wide, the phase comparison frequency fr of the PLL synthesizer 4 can be increased and then the phase noise PN can be reduced. Naturally, the same effect as Embodiment 1 can be obtained by using DDS 31 for AFC.

The case that the variable divider 15 is used as the PLL synthesizer 4 has been explained in the above. It is also acceptable to use fixed frequency dividing. In this case, the synthesizer 101 with DDS is used for the channel setting and AFC, which has the same effect.

Figure 17:
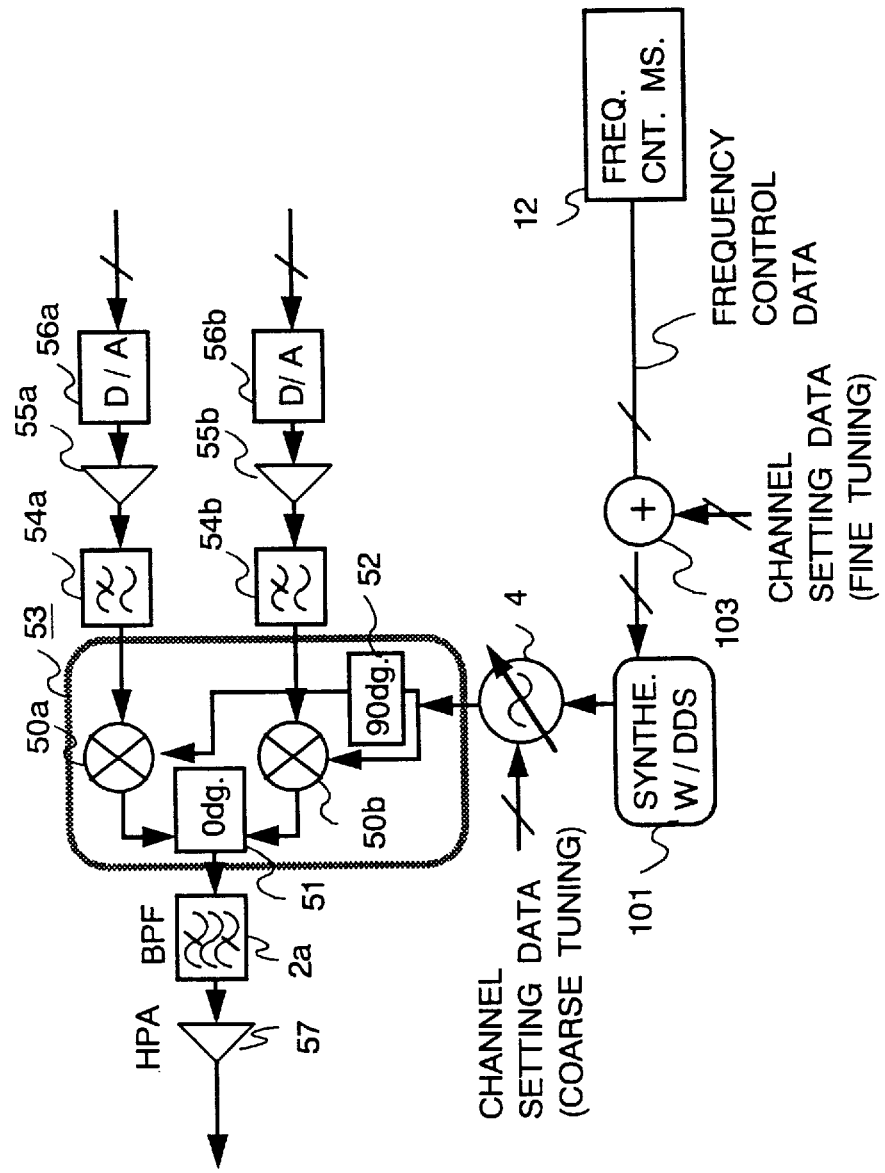
FIG. 17 shows a block diagram of one example of a transmitting apparatus according to Embodiment 4 of the present invention.

Although the receiving apparatus has been explained above as an example of Embodiment 4, it is also acceptable to apply the same configuration to the transmitting apparatus as shown in FIG. 17. The quadrature mixer 53 of RF band is used and the output signal from the PLL synthesizer 4, whose reference oscillator is the synthesizer 101 with DDS, is modulated in FIG. 17. Namely, the transmitting apparatus has the same configuration as the receiving apparatus and has the same effect as the receiving apparatus according to the present embodiment.

The followings are features of the receiving apparatus or the transmitting apparatus of homodyne configuration in this embodiment. The frequency of base band signal and the frequency of high frequency signal are changed directly by the quadrature mixer 53 in the homodyne configuration. The quadrature mixer 53 includes two unit mixers 50a and 50b corresponding to a channel I and a channel Q, and a hybrid circuit. The hybrid circuit 52 of 90 degrees combines the two unit mixers electrically. The frequency synthesizer 101 with DDS for low frequency and the frequency synthesizer 4 of phase locked loop configuration for high frequency are provided in the receiving apparatus or the transmitting apparatus. The DDS is composed of the digital operation means and the D-A converter. The digital operation means outputs an amplitude value of periodic waveform of a periodic function, synchronizing with the reference clock. The D-A converter converts the output of the digital operation means to an analog waveform. The frequency synthesizer 101 for low frequency is used as the reference oscillator of the frequency synthesizer 4 of phase locked loop configuration for high frequency. The frequency synthesizer 101 for low frequency and the frequency synthesizer 4 for high frequency are used as the carrier wave source for the quadrature mixer 53.

Embodiment 5

The receiving apparatus or the transmitting apparatus of this embodiment has a homodyne configuration. A frequency of base band signal and a frequency of high frequency signal are changed directly by a quadrature mixer in the homodyne configuration. A frequency of a frequency synthesizer with DDS for low frequency and a frequency of a frequency synthesizer of phase locked loop configuration for high frequency are mixed at a frequency converter. An output wave of the mixed frequency is used as a carrier wave source for the quadrature mixer.

The transmitting apparatus or the receiving apparatus of Embodiment 5 has the homodyne configuration wherein quasi-synchronization detection is performed at the quadrature mixer 53 of RF band. This configuration will now be explained with reference to FIG. 18 describing the receiving apparatus as an example. The homodyne configuration of the configuration of this embodiment has a problem that AFC (auto frequency control) can not be performed by the VCXO 8 of low frequency as well as in Embodiment 4. The reason for this is that only one oscillator is needed in the configuration. Conventionally, AFC has been performed by the VCXO 8.

Figure 18:
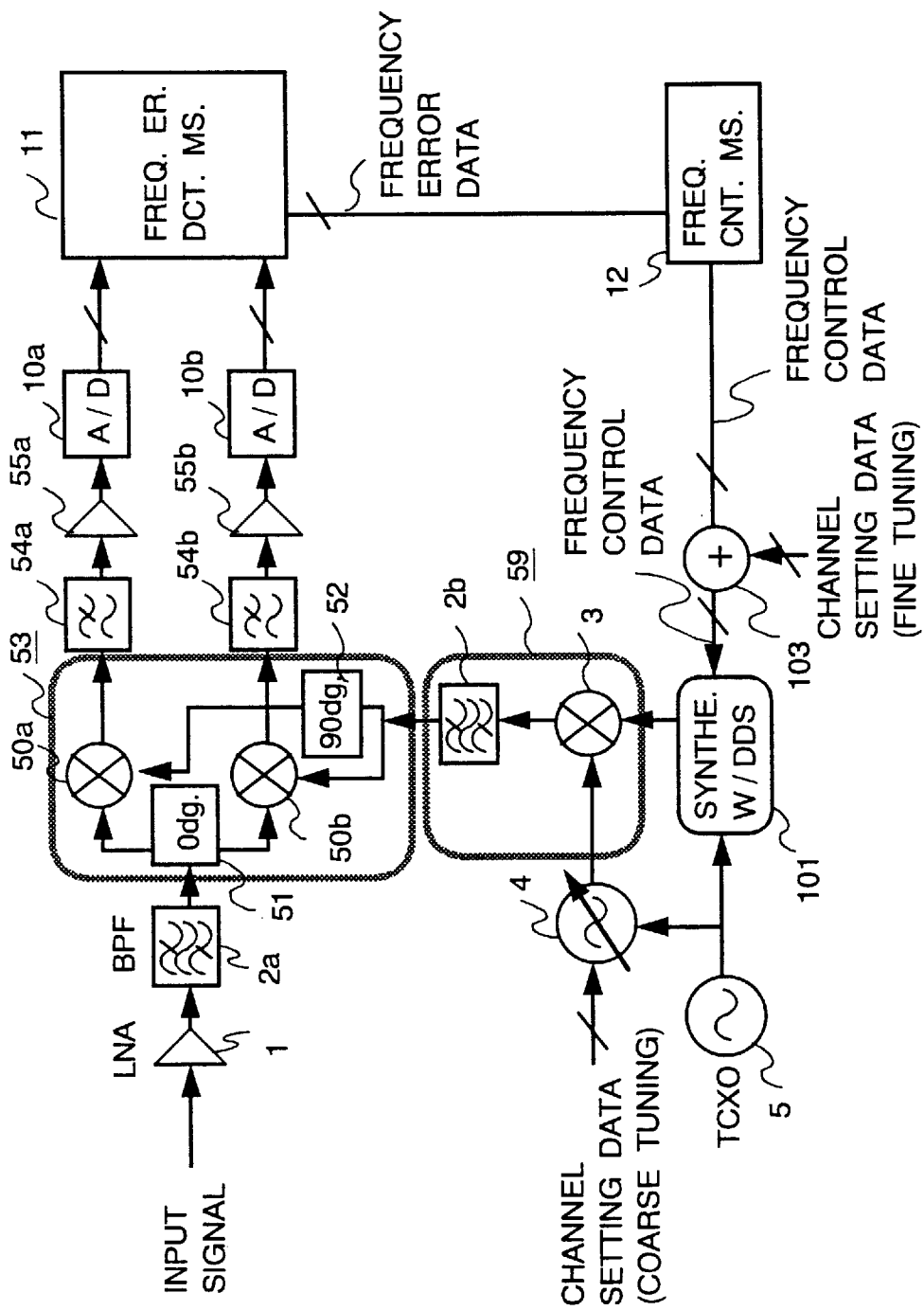
FIG. 18 shows a block diagram of an example of a receiving apparatus according to Embodiment 5 of the present invention.

In FIG. 18, a frequency converter 59 includes the mixer 3 and the BPF 2b. The frequency converter 59 synthesizes an output wave from the synthesizer 101 with a DDS and an output wave from the PLL synthesizer 4 and outputs the synthesized wave to the quadrature mixer 53 as a carrier wave source.

In FIG. 18, the same elements or corresponding elements to the elements in FIG. 11 have the same references. The synthesizer 101 with a DDS has the same configuration as the one in Embodiment 1.

The operation will now be explained. Excepting the carrier wave source for the quadrature mixer 53, the receiving apparatus of this embodiment has the same configuration as Embodiment 4. The output from the synthesizer 101 with DDS and the output from the PLL synthesizer 4 are synthesized at the frequency converter 59 as the carrier wave source. A frequency of the synthesizer 101 with DDS is controlled to reduce a frequency error in the receiving apparatus. It is also acceptable to add fine channel setting data to frequency control data by the adder 103 as well as in Embodiment 2. Coarse channel setting is performed at the PLL synthesizer 4.

Comparing with Embodiment 4, the carrier wave source of Embodiment 5 has an advantage that spurious components are not increased. As a frequency of the output wave from the DDS 31 is not multiplied by the frequency interval of the channel at the PLL synthesizer 4, there is no spurious component given by the equation (2). The carrier wave source of Embodiment 5 has a disadvantage that the configuration is somewhat complicated as the frequency converter 59 is indispensable. Regarding other respects, the receiving apparatus of this embodiment has the same effect as Embodiment 4.

Figure 19:
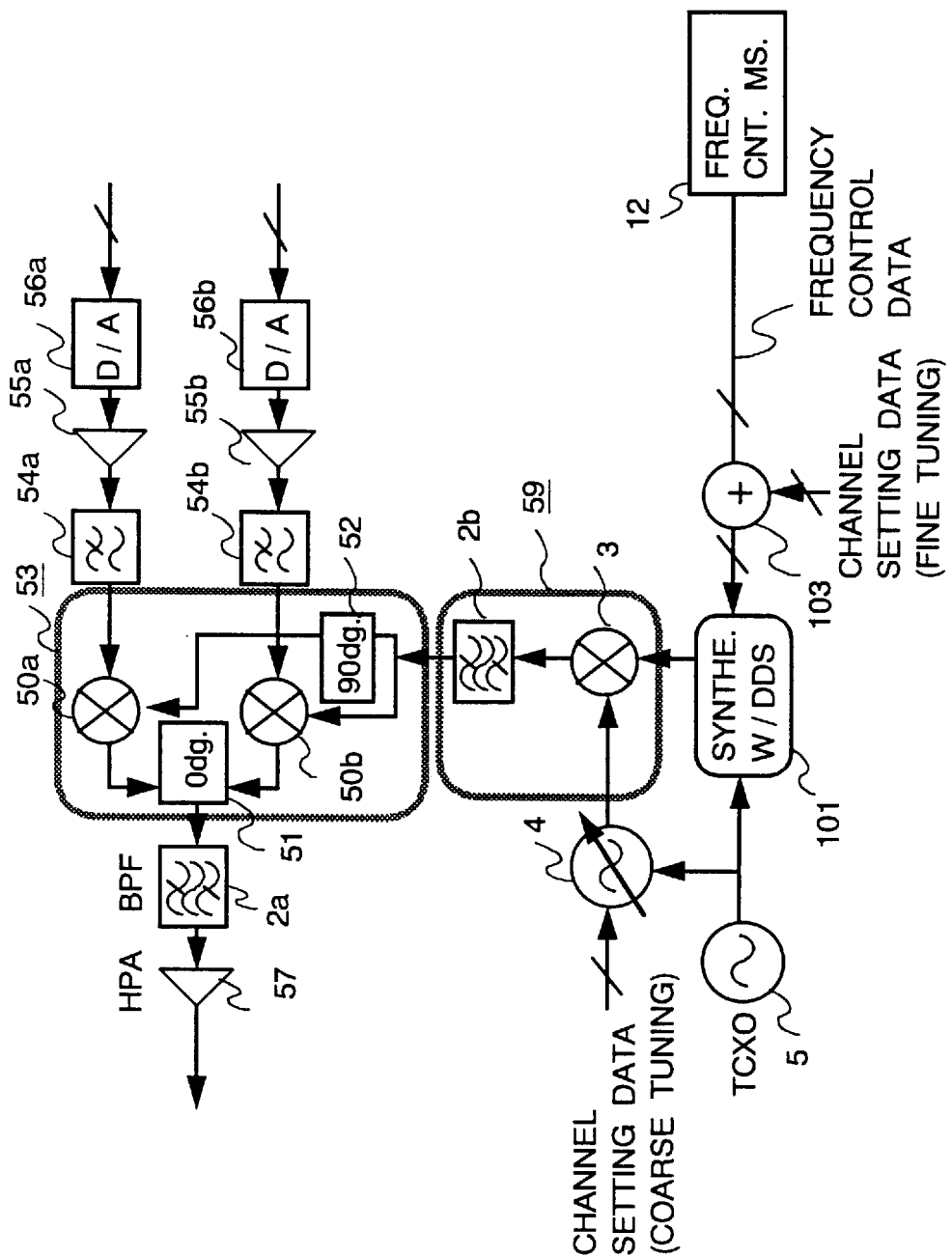
FIG. 19 shows a block diagram of one example of a transmitting apparatus according to Embodiment 5 of the present invention.

Although the receiving apparatus has been explained above as an example of Embodiment 5, it is also acceptable to apply the same configuration to the transmitting apparatus as shown in FIG. 19. Namely, the transmitting apparatus has the same effect as the receiving apparatus according to the present embodiment.

The followings are features of the receiving apparatus or the transmitting apparatus of homodyne configuration in this embodiment. The frequency of base band signal and the frequency of high frequency signal are changed directly by the quadrature mixer 53 in the homodyne configuration. The quadrature mixer includes two unit mixers 50a and 50b corresponding to the channel I and the channel Q, and the hybrid circuit. The hybrid circuit 52 of 90 degrees combines the two unit mixers electrically. The frequency synthesizer 101 with a DDS for low frequency and the frequency synthesizer 4 of phase locked loop configuration for high frequency are provided in the receiving apparatus or the transmitting apparatus. The DDS is composed of the digital operation means and the D-A converter. The digital operation means outputs an amplitude value of periodic waveform of a periodic function, synchronizing with the reference clock. The D-A converter converts the output of the digital operation means to the analog waveform. The frequency of the frequency synthesizer 101 for low frequency and the frequency of the frequency synthesizer 4 for high frequency are mixed at the frequency converter 59. The mixed frequency is used as the carrier wave source for the quadrature mixer 53.

Embodiment 6

The receiving/transmitting apparatus of this embodiment comprises a receiving apparatus including a first local oscillator with a first DDS. An output frequency of the first DDS is controlled to reduce a frequency error detected by detecting means. The detecting means detects frequency error data representing frequency difference between a center frequency of an input signal and a received frequency. The receiving/transmitting apparatus of this embodiment also includes a second local oscillator for transmitting apparatus, conversion means and a second DDS. The second local oscillator for the transmitting apparatus is synchronized with a reference oscillator which is common to the first and the second local oscillators. The conversion means converts the frequency error data of the receiving frequency to a correction value for transmitting frequency. The second local oscillator includes the second DDS for changing a transmitting frequency based on an output of the conversion means.

One example of the receiving/transmitting apparatus of Embodiment 6 will now be described.

Figure 20:
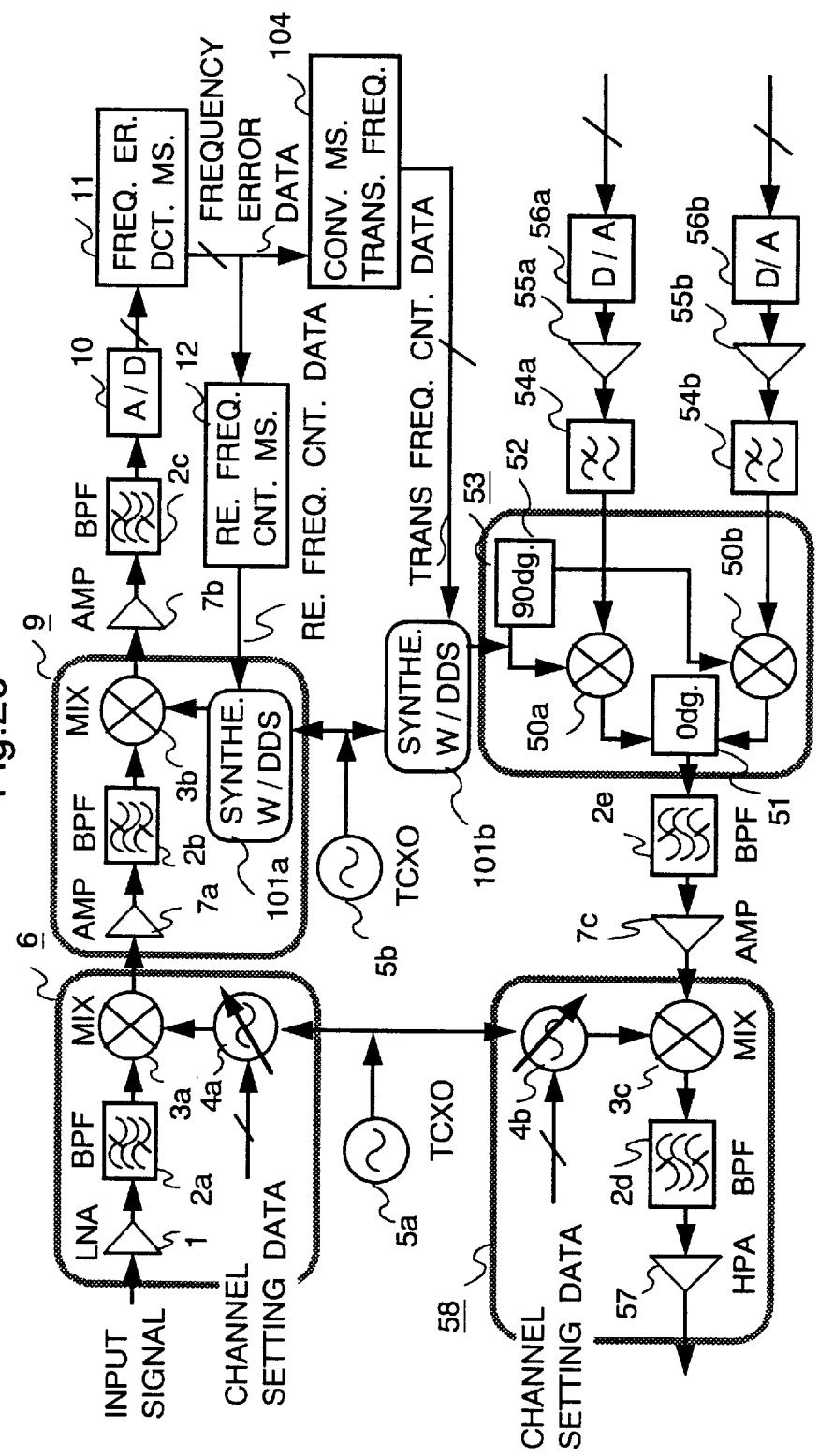
FIG. 20 shows a block diagram of one example of a receiving/transmitting apparatus according to Embodiment 6 of the present invention.

In FIG. 20, a conversion means 104 converts a frequency error in a receiving frequency to a frequency error for a transmitting frequency. The same elements or the corresponding elements to the elements in FIG. 11 have the same references in FIG. 20. Synthesizers 101a and 101b with a DDS have the same configuration as the synthesizer 101 with a DDS in Embodiment 1.

The operation will now be explained. In the receiving/transmitting apparatus of this embodiment, operations up to generating the frequency control data at the frequency control means 12 are the same as the operations in the Related Art. However, the frequency control data of the auto frequency control (AFC) of the receiving/transmitting apparatus according to this embodiment can be used as frequency setting data for the DDS 31 of the synthesizer with a DDS as in Embodiments 1 to 5. Accordingly, frequency control can be performed directly by digital data without using a memory and a D-A converter. Moreover, a frequency error in a transmitting frequency is corrected based on data of received AFC. Depending upon the frequency error data, a correction value for transmitting frequency is calculated by digital operation at the conversion means 104. An output frequency from the synthesizer 101b with a DDS for transmitting apparatus is controlled.

Since the receiving frequency is different from the transmitting frequency, it is impossible to input the frequency control data generated by the receiving frequency control means 12 into the synthesizer 101b with a DDS which controls the transmitting frequency. Therefore, the conversion means 104 generates transmitting frequency control data and outputs it to the synthesizer 101b with a DDS.

The receiving apparatus of this embodiment has effects of simplifying the apparatus and reducing the manufacturing cost as in Embodiments 1 to 5, because the memory, writing into the memory, and D-A converter are not necessary. Furthermore, the frequency setting can be performed very accurately since the DDS 31 is used.

Figure 21:
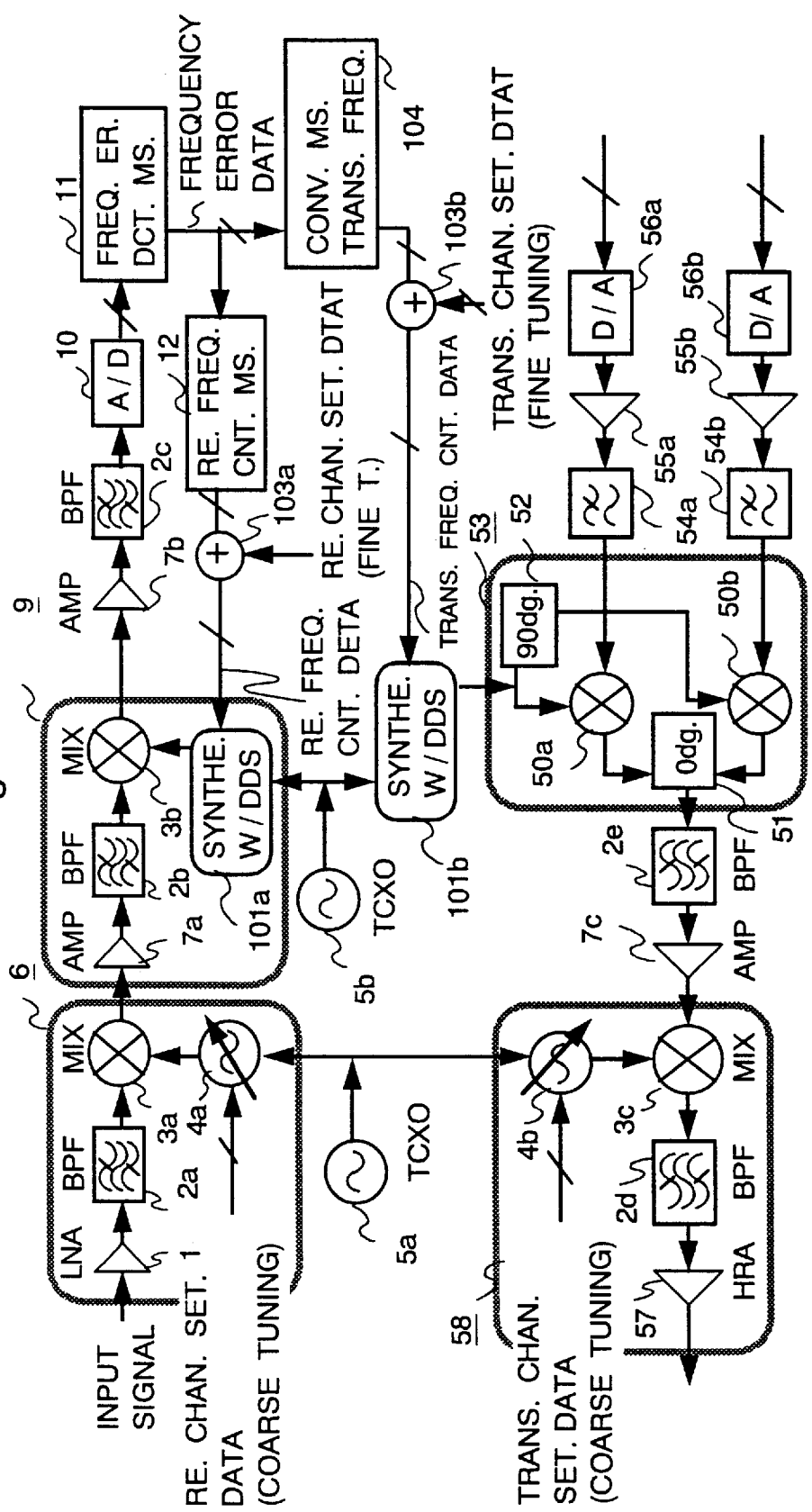
FIG. 21 shows a block diagram of another example of a receiving/transmitting apparatus according to Embodiment 6 of the present invention.

The case of adjusting the receiving frequency and the transmitting frequency finely by AFC at the synthesizers 101a and 101b with DDS has been described in the above explanation on Embodiment 6. As shown in FIG. 21, not only AFC but also fine channel setting for transmitting/receiving can be performed at the synthesizers 101a and 101b with DDS. In this case, it is possible to make channel intervals of the PLL synthesizer 4 wide and increase reference frequency. Accordingly, there are effects of reducing the phase noise and increasing the frequency switching speed as in Embodiment 2.

In the above explanation, the configuration of the receiving apparatus wherein an IF signal is A-D converted has been described. However, as shown in FIG. 11, another configuration wherein the IF signal is quasi-synchronization detection performed and its I and Q signals are A-D converted has the same effects. As shown in FIG. 16, another configuration, which is the homodyne configuration, wherein an RF signal is quasi-synchronization detection performed, and its I and Q signals are A-D converted is also acceptable. This configuration has the same effects as the above configuration.

The configuration of the transmitting apparatus wherein the IF signal is modulated by the quadrature mixer has been described above. As shown in FIG. 17, another configuration, which is the homodyne configuration, wherein the RF signal is modulated by the quadrature mixer is also acceptable. This configuration has the same effects as the above configuration.

The followings are features of the receiving/transmitting apparatus of this embodiment. The receiving apparatus includes the first local oscillator 101a wherein the first DDS is used. The first DDS includes the digital operation means and the D-A converter. The digital operation means outputs an amplitude value of periodic waveform of a periodic function, synchronized with the reference clock. The D-A converter converts the output of the digital operation means to an analog waveform. The detecting means 11 which detects the frequency error data representing a frequency difference between the center frequency of the input signal and the receiving frequency is also included. The frequency control means 12 which controls the output frequency of the first DDS in order to reduce the frequency error detected by detecting means is included in the receiving apparatus. The configuration of this embodiment also includes the second local oscillator 101b for the transmitting apparatus, the conversion means 104 and the second DDS. The second local oscillator 101b is synchronized with the reference oscillator 5b which is common to the first and the second local oscillators 101a and 101b. The conversion means 104 converts the frequency error data of the receiving frequency detected by the detecting means 11 to the correction value for transmitting frequency. The second local oscillator 101b includes the second DDS for changing the transmitting frequency based on output of the conversion means 104.

Embodiment 7

In addition to the features of the receiving/transmitting apparatus of Embodiment 6, the receiving/transmitting apparatus of this embodiment includes a memory. The memory stores error data of a receiving frequency detected by the detecting means and a correction value for a transmitting frequency output from conversion means. A second DDS is included in a local oscillator for a transmitting apparatus. The second DDS controls an output frequency based on the data stored in the memory.

One example of the receiving/transmitting apparatus of Embodiment 7 will be described.

Figure 22:
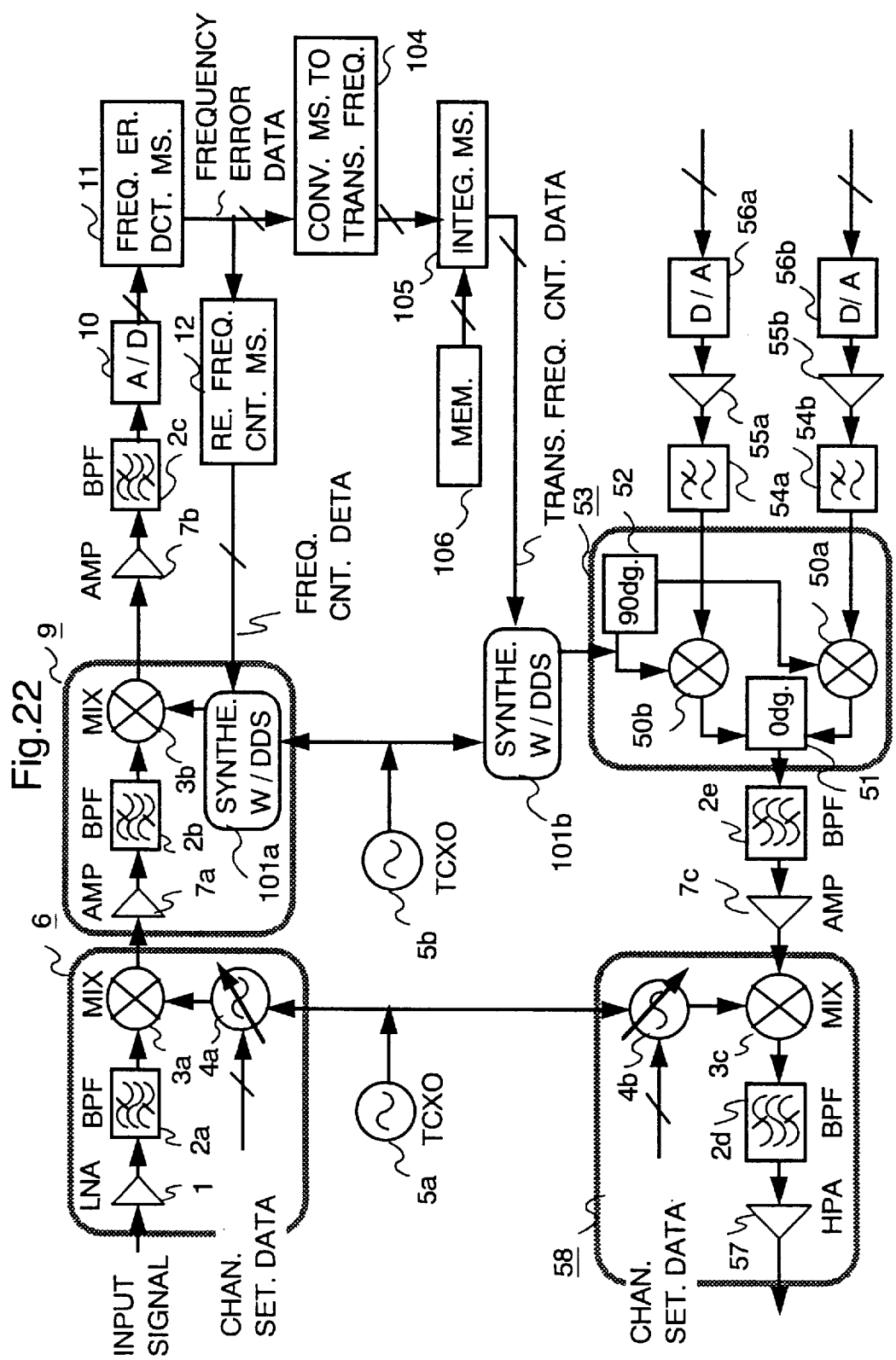
FIG. 22 shows a block diagram of one example of a receiving/transmitting apparatus according to Embodiment 7 of the present invention.

In FIG. 22, integral means 105 and a memory 106 are shown. The same elements or the corresponding elements to the elements in FIG. 21 have the same references in FIG. 22. The synthesizers 101a and 101b with DDS have the same configuration as the synthesizer 101 with DDS in Embodiment 1.

The operation will now be described. In the receiving/transmitting apparatus of this embodiment, the way that the transmitting frequency is controlled by AFC in the receiving apparatus is the same as in Embodiment 6. In addition to the configuration of Embodiment 6, the integral means 105 and the memory 106 are provided. The integral means 105 integrates control data of the transmitting frequency. The memory 106 stores an integral value of the integral means 105. The integral means 105 is provided for giving a time constant to time change of the control data of the transmitting frequency. On account of the integral means 105, there is an effect that an extreme change of transmitting frequency caused by any disorder of AFC in receiving can be lessened. The disorder of AFC, a frequency jump for instance, is caused by a frequency change in the receiving apparatus due to an accidental change (steep fading) of the input signal or a vibration and so forth. The extreme change of transmitting frequency is prevented because the integral means 105 absorbs the disorder of AFC.

Figure 23:
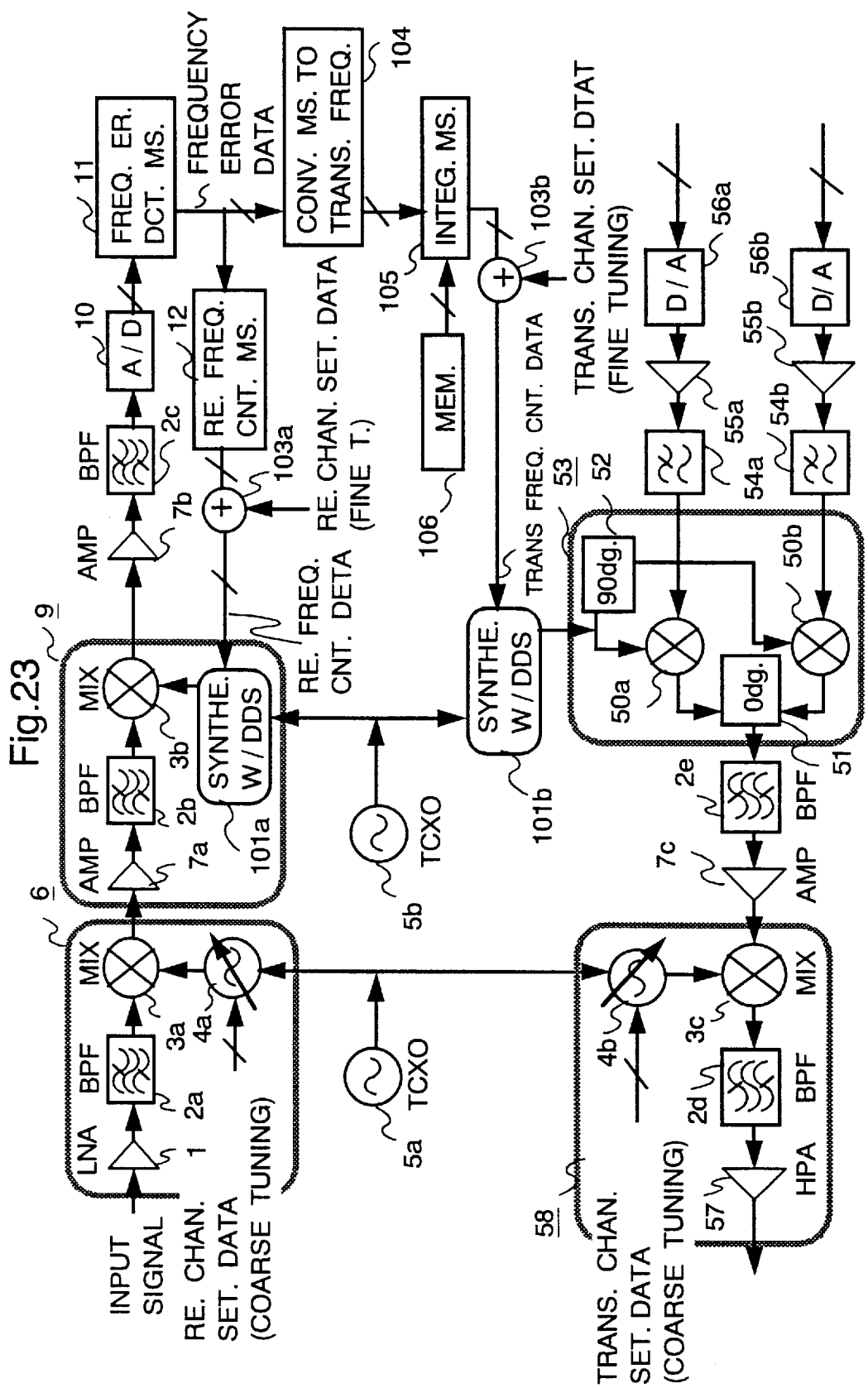
FIG. 23 shows a block diagram of another example of a receiving/transmitting apparatus according to Embodiment 7 of the present invention.

When a receiving/transmitting channel is being set finely in addition to the AFC by the synthesizers 101a and 101b with a DDS, the same effect can be obtained by providing the integral means 105 before an adder 103b as shown in FIG. 23.

The followings are features of the receiving/transmitting apparatus of this embodiment. The memory stores or corrects the frequency error data for the receiving frequency or the correction value for the transmitting frequency, with providing a time constant. The receiving frequency error data is detected by the detecting means 11. The correction value for transmitting frequency is output from the conversion means 104. The second DDS for controlling frequency based on the data stored in the memory, is included in the local oscillator 101b for the transmitting apparatus.

Embodiment 8

In the receiving/transmitting apparatus of this embodiment, a reference oscillator with DDS and a receiving apparatus synchronized with the reference oscillator are included. A detecting means for detecting frequency error data is also included. The detecting means detects the frequency error data representing a frequency difference between a center frequency of an input signal and a receiving frequency of the receiving apparatus. Frequency control means for controlling an output frequency of a DDS in order to reduce the frequency error detected by the detecting means is also included. The transmitting apparatus synchronized with the reference oscillator is included.

One example of the receiving/transmitting apparatus of Embodiment 8 will now be explained.

Figure 24:
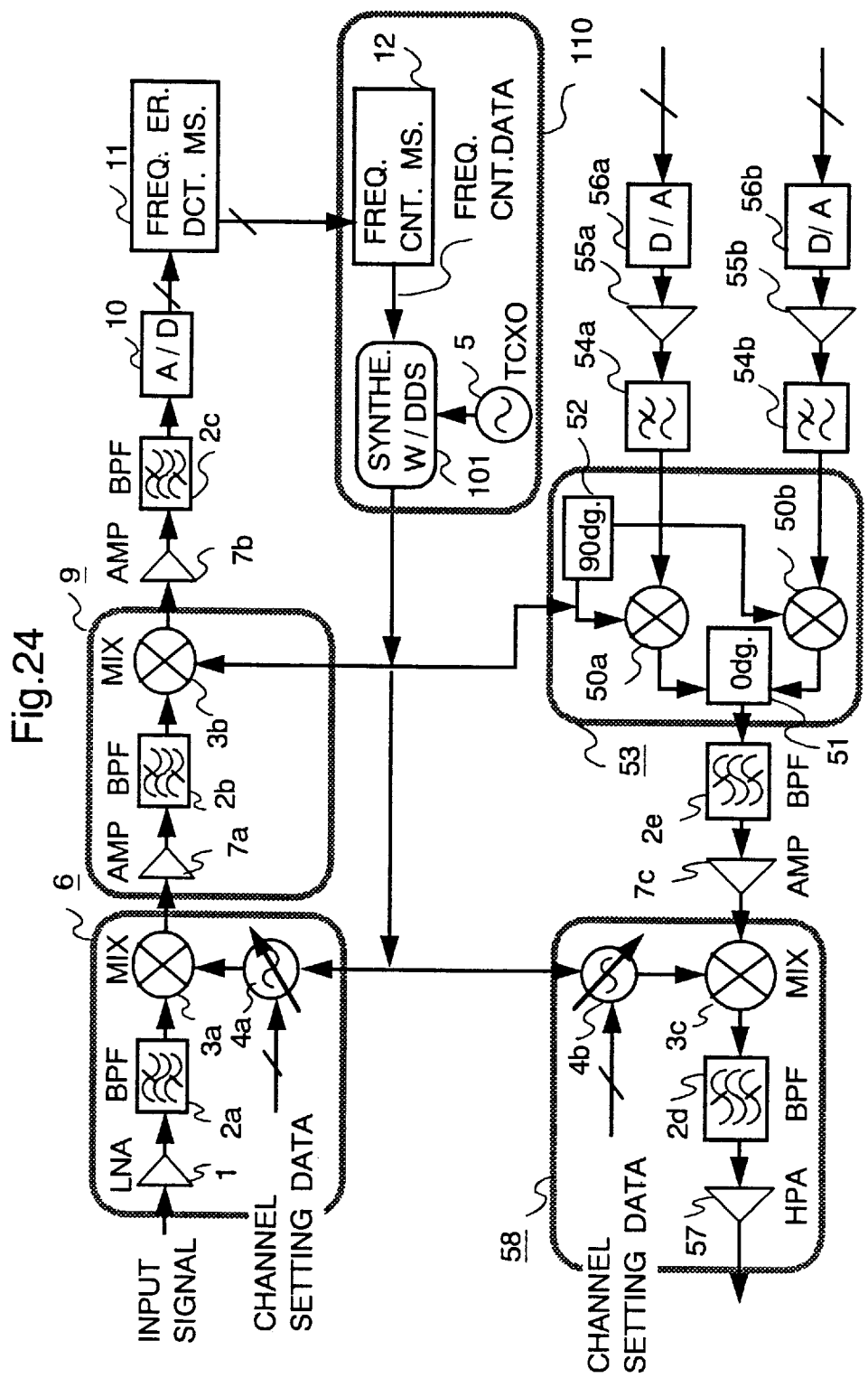
FIG. 24 shows a block diagram of an example of a receiving/transmitting apparatus according to Embodiment 8 of the present invention.

In FIG. 24, a reference oscillator 110 includes the frequency control means 12, the synthesizer 101 with DDS and a temperature compensation quartz-crystal oscillator (TCXO) 5. The reference oscillator 110 is common to the receiving apparatus and the transmitting apparatus. In FIG. 24, the same elements or the corresponding elements to the elements in FIG. 22 have the same references. The synthesizer 101 with DDS has the same configuration as in Embodiment 1.

Now, the operation will be described. The frequency error detecting means 11 detects a frequency error in a received frequency. The frequency control means 12 controls the synthesizer 101 with DDS so as to correct the frequency error. This frequency error is caused from an error of the TCXO 5. An output frequency of the reference oscillator 110 is accurate because the frequency error has been corrected by performing AFC. Accordingly, the transmitting frequency can be automatically corrected.

The receiving/transmitting apparatus of this configuration of the present embodiment has effects of simplifying the apparatus and reducing the manufacturing cost as in Embodiments 1 to 7. The reason for these effects is that a memory, writing into the memory, and a D-A converter are not necessary. Furthermore, frequency setting can be performed very accurately since the DDS 31 is used.

The case of adjusting the receiving frequency and the transmitting frequency finely by AFC at the synthesizers 101 with DDS has been described in the above explanation on Embodiment 8. Not only AFC but also a fine channel setting for transmitting/receiving can be performed at the synthesizer 101 with DDS as well as Embodiment 2. In this case, it is possible to make channel intervals of the PLL synthesizer 4 wide and increase a reference frequency. Accordingly, there are effects of reducing the phase noise and increasing the frequency switching speed as well as in Embodiment 2.

In the above explanation, the configuration of the receiving apparatus wherein an IF signal is A-D converted has been described. However as shown in FIG. 11, another configuration wherein the IF signal is quasi-synchronization detection performed and its I and Q signals are A-D converted has the same effects. As shown in FIG. 16, another configuration, which is a homodyne configuration, wherein an RF signal is quasi-synchronization detection performed and its I and Q signals are A-D converted is also acceptable. This configuration has the same effects as the above configuration.

The configuration of the transmitting apparatus wherein the IF signal is modulated by the quadrature mixer has been described above. As shown in FIG. 17, another configuration, which is a homodyne configuration, wherein an RF signal is modulated by the quadrature mixer is also acceptable. This configuration has the same effects as the above configuration.

The followings are features of the receiving apparatus or the transmitting apparatus of this embodiment. The receiving apparatus includes the reference oscillator 110 wherein a DDS is used. The DDS is composed of a digital operation means and a D-A converter. The digital operation means outputs an amplitude value of periodic waveform of a periodic function, synchronized with the reference clock. The D-A converter converts the output of the digital operation means to an analog waveform. The receiving apparatus also includes a first local oscillator 4a synchronized with the reference oscillator. The detecting means 11 which detects frequency error data representing the center frequency of the input signal and the receiving frequency of the receiving apparatus is provided in the configuration of this embodiment. The frequency control means 12 controls an output frequency of the DDS in order to reduce a frequency error detected by the detecting means. The transmitting apparatus includes a second local oscillator 4b synchronized with the reference oscillator 110.

Embodiment 9

The receiving/transmitting apparatus of this embodiment is the one to be mounted on a mobile object. A local oscillator with DDS, operation means for Doppler frequency generated in moving and frequency control means are provided. The frequency control means is for controlling an output frequency of the DDS by correcting for the Doppler frequency. Either transmitting frequency or received frequency, or both are corrected in the configuration of this embodiment.

Figure 25:
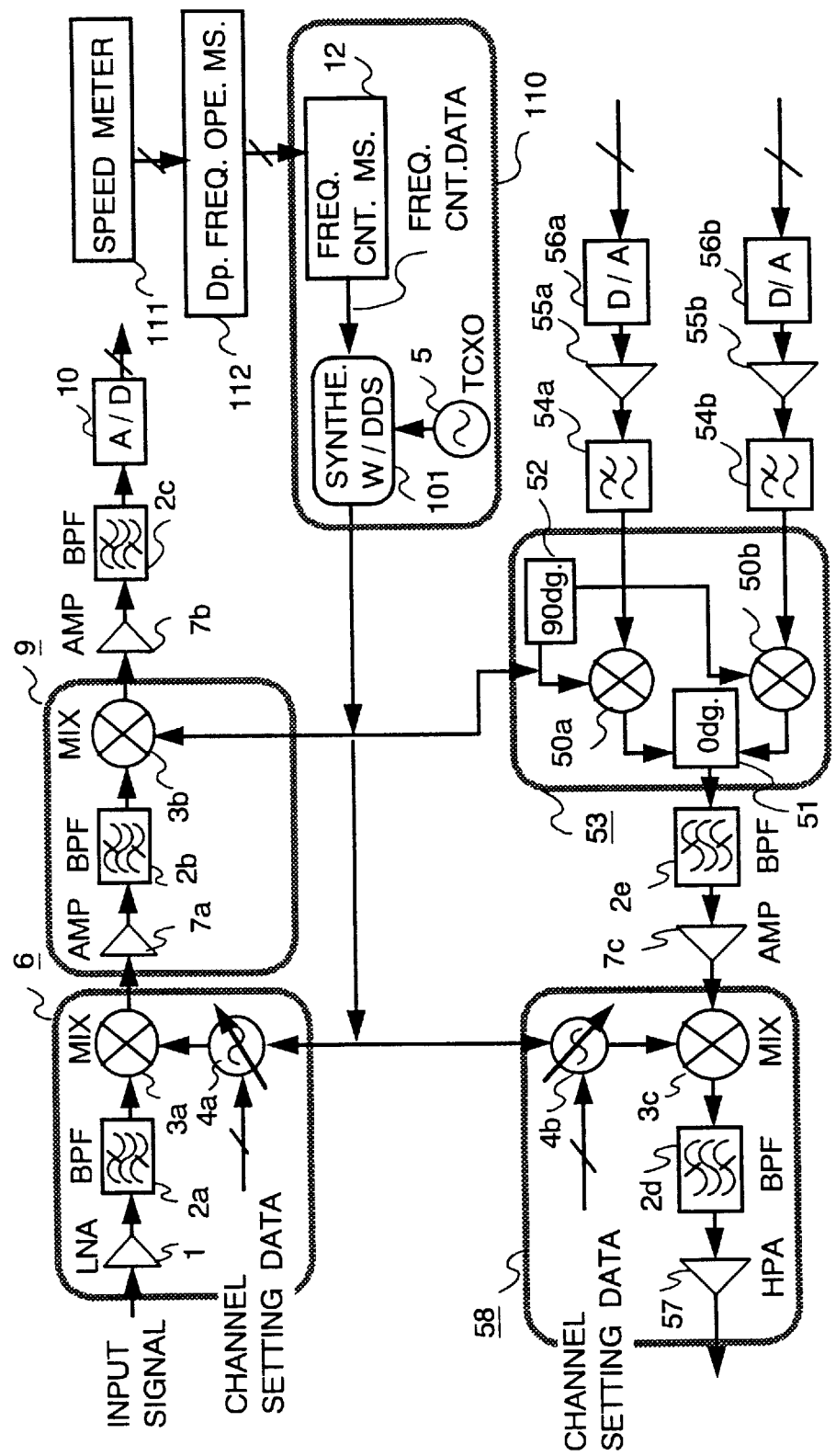
FIG. 25 shows a block diagram of an example of a receiving/transmitting apparatus according to Embodiment 9 of the present invention.

One example of the receiving/transmitting apparatus of Embodiment 9 will now be explained with reference to FIG. 25. A speed meter 111 and Doppler frequency operation means 112 are shown in FIG. 25. The same elements or the corresponding elements to the elements in FIG. 24 have the same references in FIG. 25. The synthesizer 101 with DDS has the same configuration as Embodiment 1.

The operation will now be explained. The receiving/transmitting apparatus of this embodiment is constructed on the supposition that the apparatus is mounted on a high speed aircraft, such as a plane or rocket. The reference oscillator 110 of this embodiment is common to the receiving apparatus and the transmitting apparatus as in Embodiment 8. The reference oscillator includes the frequency control means 12, the synthesizer 101 with a DDS and the TCXO 5. Doppler frequency generated in high speed moving is calculated from the speed meter 111 and the Doppler frequency operation means 112. The synthesizer 101 with a DDS is controlled by the frequency control means 12 by correcting the Doppler frequency.

The receiving/transmitting apparatus of this configuration of the present embodiment has effects of simplifying the apparatus and reducing the manufacturing cost as in Embodiments 1 to 8. The reason of these effects is that a memory, writing into the memory, and a D-A converter are not necessary. Furthermore, frequency setting can be performed very accurately since the DDS 31 is used.

The case of correcting the Doppler frequency by the synthesizer 101 with DDS has been described in the above explanation on Embodiment 9. Not only the Doppler frequency correction but also AFC and a fine channel setting for transmitting/receiving can be performed at the synthesizer 101 with DDS as in Embodiment 2. In this case, it is possible to make channel intervals of the PLL synthesizer 4 wide and increase a reference frequency. Accordingly, there are effects of reducing the phase noise and increasing the frequency switching speed as in Embodiment 2.

In the above explanation, the configuration of the receiving apparatus wherein an IF signal is A-D converted has been described. However as shown in FIG. 11, another configuration wherein the IF signal is quasi-synchronization detection performed and its I and Q signals are A-D converted has the same effects. As shown in FIG. 16, another configuration, which is homodyne configuration, wherein an RF signal is quasi-synchronization detection performed and its I and Q signals are A-D converted is also acceptable. This configuration has the same effects as the above configuration.

The configuration of the transmitting apparatus wherein the IF signal is modulated by the quadrature mixer has been described above. As shown in FIG. 17, another configuration, which is homodyne configuration, wherein an RF signal is modulated by the quadrature mixer is also acceptable. This configuration has the same effects as the above configuration.

According to the present embodiment, the followings are features of the receiving/transmitting apparatus mounted on a mobile object. The operation means 112 for the Doppler frequency and the frequency control means 12 are provided. The Doppler frequency operation means 112 calculates the Doppler frequency generated in moving at high speed. The frequency control means 12 controls an output frequency of the DDS by correcting for the Doppler frequency calculated by the Doppler frequency operation means 112. Either the transmitting frequency or the received frequency, or both are corrected in this embodiment.

Embodiment 10

The frequency synthesizer of this embodiment has a phase locked loop configuration including a voltage-controlled oscillator, first frequency divider, phase comparator and loop filter. A reference signal is generated from a DDS, a second frequency divider and a frequency converter.

One example of the frequency synthesizer of Embodiment 10 will now be described.

Figure 26:
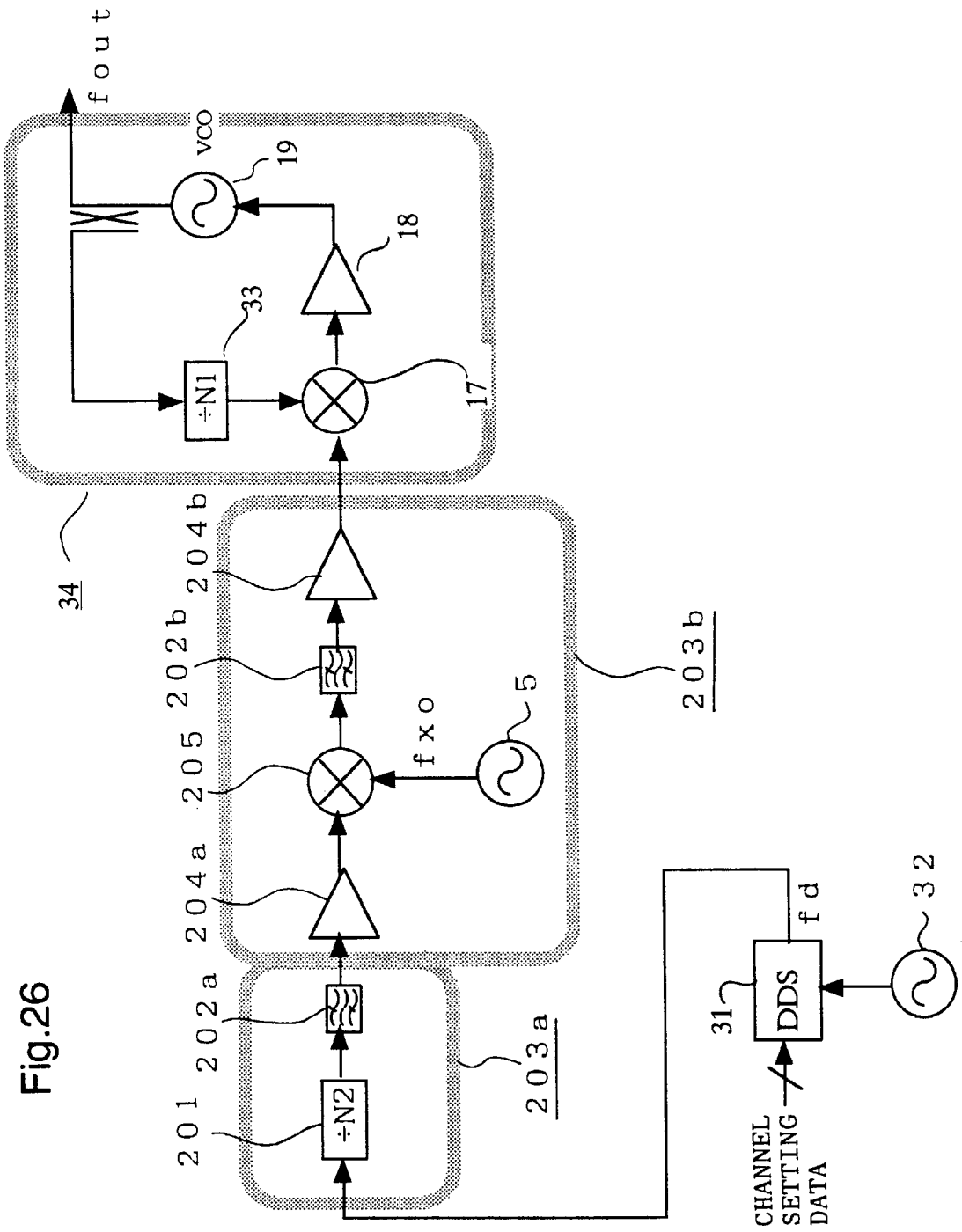
FIG. 26 shows a block diagram of an example of a frequency synthesizer according to Embodiment 10 of the present invention.

In FIG. 26, a frequency divider 201, band pass filters (BPF) 202a and 202b, frequency converters 203a and 203b, amplifiers 204a and 204b and a mixer 205 are shown. The same elements or the corresponding elements to the Related Art of FIG. 49 and FIG. 50 have the same references in FIG. 26.

Now, the operation will be explained. A frequency of the DDS 31 is divided by the frequency divider 201. The divided frequency is changed at the frequency converter 203b. The changed frequency is used as a reference oscillating wave of a PLL 34. The BPF 202a is for suppressing a high harmonic wave of the frequency divider 201. It is acceptable to use a low band pass filter as the BPF 202a. The BPF 202b is for suppressing an unnecessary wave of the mixer 205. Assuming that an output frequency of the DDS 31 is fd, the dividing number of a frequency divider 33 in the PLL 34 is N1, the dividing number of the frequency divider 201 is N2, and an output frequency of the TCXO 5 is fxo, an output frequency fout of the frequency synthesizer can be obtained by the following equation.

$$fout = |(fd/N2) \pm fxo| \cdot N1 \text{tm (3)}$$

An output frequency of the PLL 34 can be changed with the output frequency fd of the DDS 31 by changing channel setting data for the DDS 31. The changing ratio of the output frequency of the PLL 34 is N1/N2 times as much as the changing band width of the DDS 31. Spurious component SPout of the output from the synthesizer in the passing band of the PLL 34, caused by spurious component SPdds (dBc) of the DDS 31, can be obtained by the following equation.

$$SPout = 10 \cdot LOG_{10}(N1/N2)^2 + SPdds = (dBc) \quad (4)$$

Comparing with the conventional frequency synthesizer shown in FIG. 50, the frequency synthesizer of this embodiment has an effect of reducing the spurious component. The spurious component can be reduced by the effect of the frequency divider 201. The spurious component can be reduced as much as the following amount.

$$20 \cdot LOG_{10}(N2) \text{ (dB)}$$

When the reference oscillating frequency becomes low by frequency dividing and the dividing number N1 becomes increased in the PLL 34, the effect of reducing the spurious level by the frequency dividing is generally canceled. However, in the present embodiment, tendency for the reference oscillating frequency to become low is suppressed by providing the frequency converter 203b. Thus, the spurious component becomes low. Simultaneously, an operating frequency of the DDS 31 can be lowered by increasing the reference oscillating frequency in the frequency converter 203b. This has an effect that electrical power consumption of the DDS 31 can be lessened.

Figure 27:
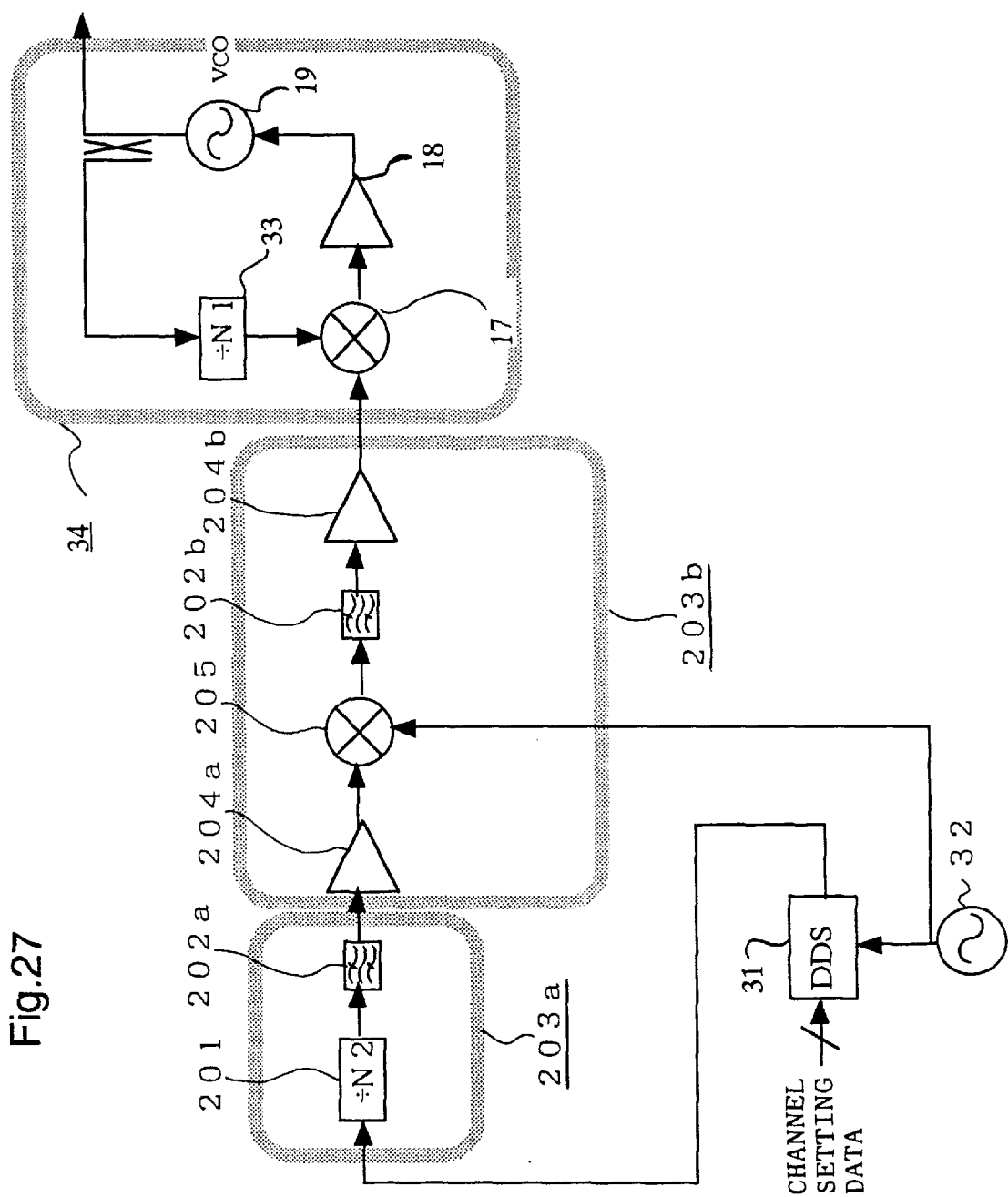
FIG. 27 shows a block diagram of another example of a frequency synthesizer according to Embodiment 10 of the present invention.

There are two oscillators in the above configuration, which are the TCXO 5 and the reference clock 32 for the DDS 31. It is also acceptable to use one oscillator as shown in FIG. 27. In this case, the same effect can be obtained. There is another effect that the cost can be lessened by decreasing the number of oscillators.

Figure 28:
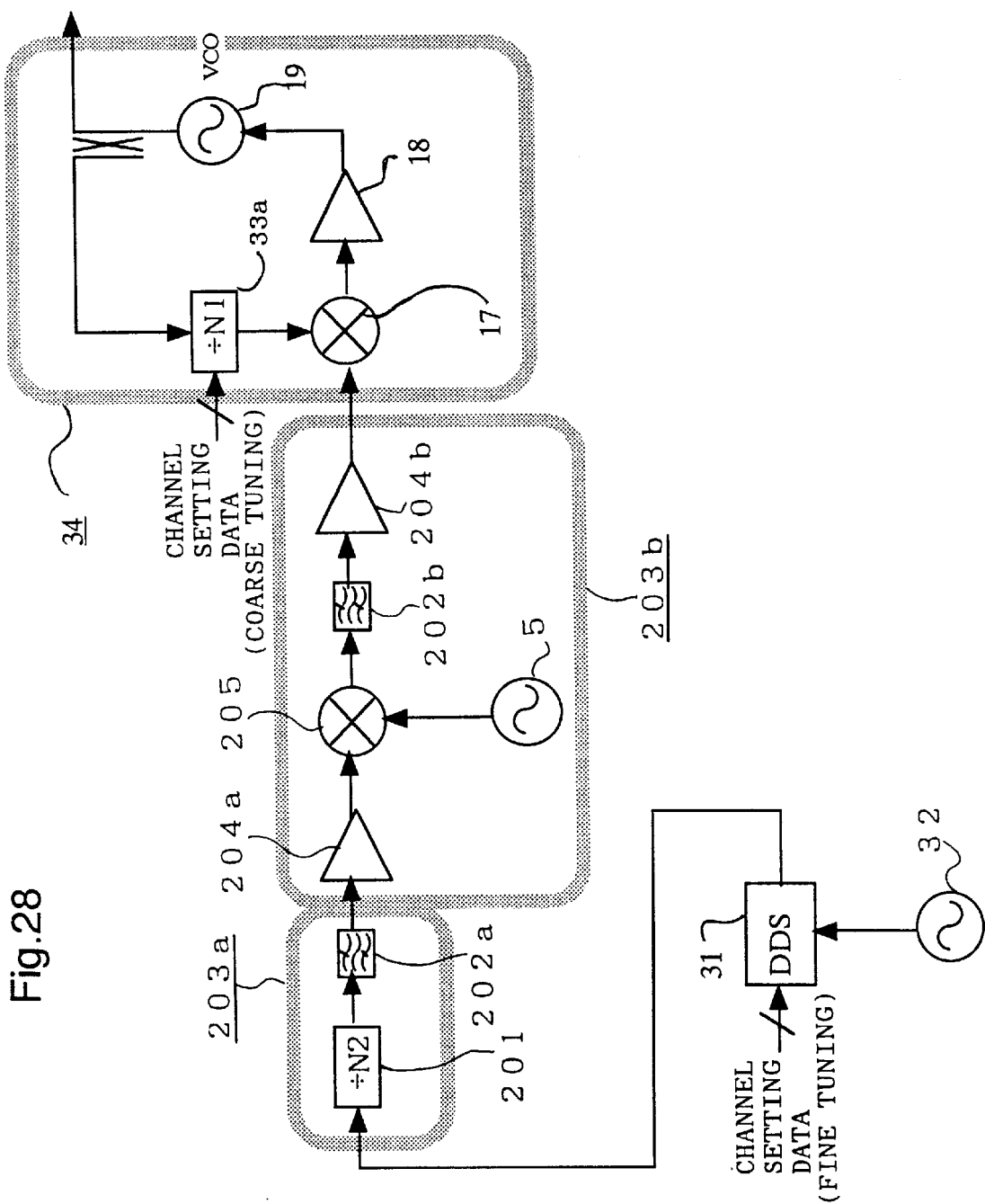
FIG. 28 shows a block diagram of another example of a frequency synthesizer according to Embodiment 10 of the present invention.

Although the channel setting is performed at the DDS 31 in the above explanation, it is also acceptable to perform fine channel tuning at the DDS 31 and coarse tuning at a variable divider 33a in the PLL 34 as shown in FIG. 28. In this case, the same effect can be obtained.

The frequency synthesizer of the configuration according to Embodiment 10 has been described in the above explanation. It is also acceptable to apply this frequency synthesizer to the PLL synthesizer 4 for the receiving/transmitting apparatus, the synthesizers 101, 101a and 101b with a DDS as in Embodiments 1 to 9 to obtain the same effects.

The followings are features of the frequency synthesizer of this embodiment. The frequency synthesizer of this embodiment has the phase locked loop configuration. The phase locked loop configuration includes the voltage-controlled oscillator 19, first frequency divider 33 or 33a, phase comparator 17 and loop filter 18. The frequency synthesizer also includes the DDS 31. The DDS is composed of the digital operation means and the D-A converter. The digital operation means outputs an amplitude value of periodic waveform of a periodic function, synchronizing with a reference clock. The D-A converter converts the output of the digital operation means to an analog waveform. An output wave of the DDS is divided at the second frequency divider 201. An output of the second frequency divider 201 is changed at the frequency converter 203b. An output of the frequency converter 203b is used as a reference signal.

Embodiment 11

The frequency synthesizer of this embodiment has a phase locked loop configuration including a voltage-controlled oscillator, a first frequency divider, a phase comparator and a loop filter. A reference signal is generated from DDS, a second frequency divider, a frequency converter and a third frequency divider.

One example of the frequency synthesizer of Embodiment 11 will now be described.

Figure 29:
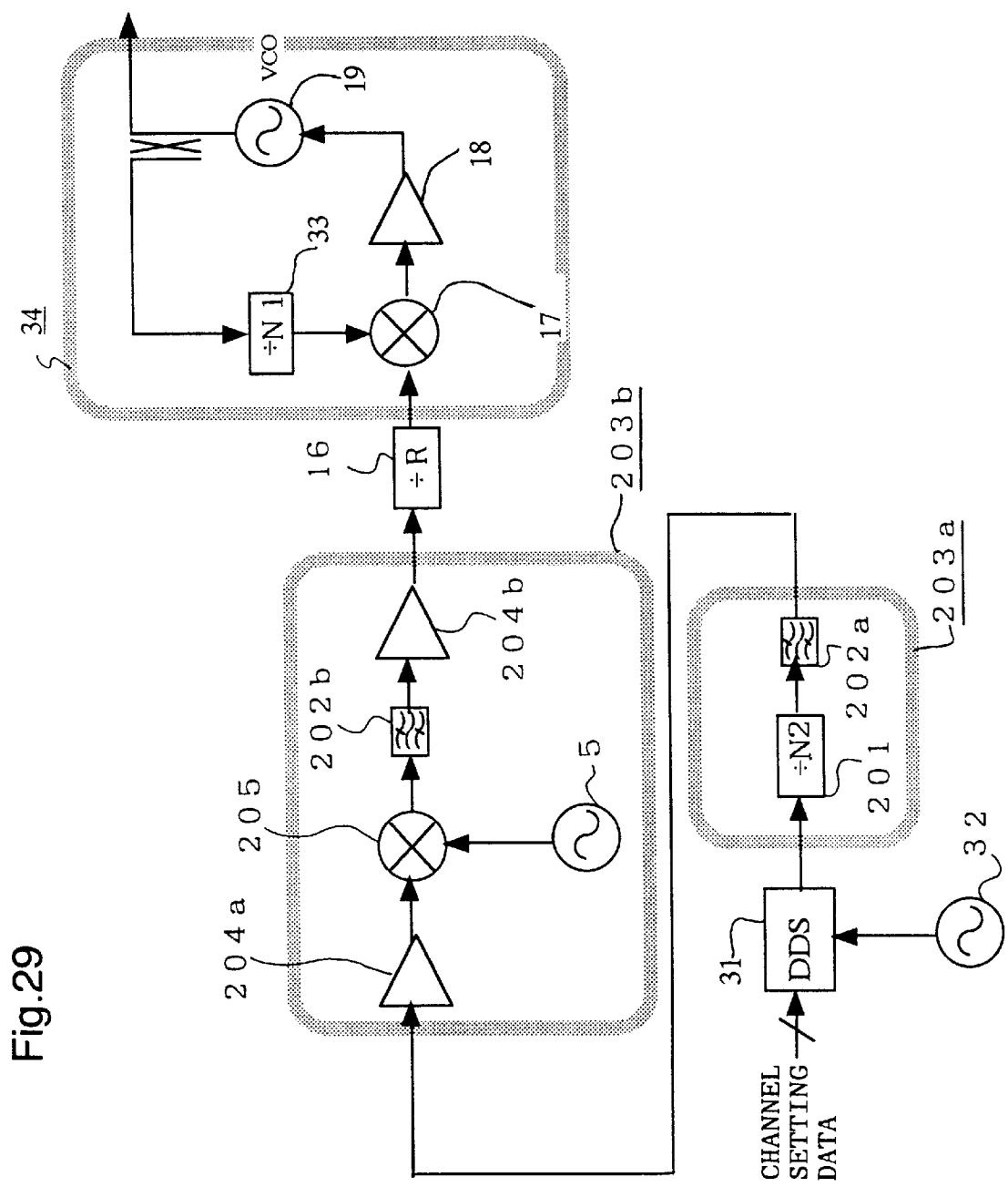
FIG. 29 shows a block diagram of an example of a frequency synthesizer according to Embodiment 11 of the present invention.

In FIG. 29, the same elements or the corresponding elements to the elements in FIG. 26 have the same references.

Now, the operation will be explained. Frequency of the DDS 31 is divided by the frequency divider 201. The divided frequency of an output signal of the frequency divider 201 is changed at the frequency converter 203b. The changed frequency is divided by a divider 16. The divided frequency is used as a reference oscillating wave of the PLL 34. The frequency converters 203a and 203b have the same configuration as Embodiment 10 . Assuming that an output frequency of the DDS 31 is fd, the dividing number of the frequency divider 33 in the PLL 34 is N1, the dividing number of the frequency divider 201 is N2, an output frequency of the TCXO 5 is fxo and the dividing number of the divider 16 is R, an output frequency fout of the frequency synthesizer can be obtained by the following equation.

$$f\text{out} = |(fd/N2)| \cdot N1/R \tag{5}$$

The output frequency of the PLL 34 can be changed by the output frequency fd of the DDS 31 by changing the channel setting data for the DDS 31. The changing ratio of the output frequency of the PLL 34 is N1/(N2·R) times as much as the changing band width of the DDS 31. Spurious level SPout in the output from the synthesizer in the passing band of the PLL 34, caused by spurious component SPdds (dBc) of the DDS 31, can be obtained by the following equation.

$$SP\text{out} = 10\ \text{LOG}_{10}\{N1/(N2\cdot R)\}^2 + SPdds\text{(dBc)} \tag{6}$$

Comparing with the conventional frequency synthesizer shown in FIG. 50, the frequency synthesizer of this embodiment has an effect of reducing the spurious level based on the equation (6). The spurious level can be reduced by the effect of the frequency dividers 201 and 16. The spurious level can be reduced as much as the following amount.

$$20 \cdot \text{LOG}_{10}(N2 \cdot R)\ (\text{dB})$$

Another effect of reducing electrical power consumption can be obtained by providing the frequency converter 203b as well as Embodiment 10. Generally, most of IC (integrated circuit) for the PLL synthesizer sold at low price may include the divider 16, which has an effect of reducing the cost.

There are two oscillators in the above configuration, which are the TCXO 5 and the reference clock 32 of the DDS 31. It is also acceptable to use one oscillator as shown in FIG. 27 of Embodiment 10. In this case, the same effect can be obtained. There is another effect that the cost can be lessened by decreasing the number of the oscillators.

Although the channel setting is performed at the DDS 31 in the above explanation, it is also acceptable to perform fine channel tuning at the DDS 31 and coarse tuning at the variable divider 33a of the PLL 34 as in FIG. 28 in Embodiment 10. The same effect can also be obtained by this configuration. In this case, an oscillating band is widely covered depending mainly upon the dividing number of the variable divider 33a. Therefore, by changing the dividing number of the variable divider 33a, the band width of an output frequency at the DDS 31 can be extremely narrow. Thus, spurious components of the DDS 31, emerging around carrier wave which can not be suppressed by the PLL 34, can be lessened. The spurious component of the DDS 31 would emerge in different frequencies corresponding to output frequencies. Namely, there is an effect that the spurious components can be avoided by selecting the appropriate frequency of the DDS 31. The higher the dividing number R of the divider 16, the more the reduction.

The frequency synthesizer of the configuration of Embodiment 11 has been described in the above explanation. It is also acceptable to apply this frequency synthesizer to the PLL synthesizer 4 for the receiving/transmitting apparatus, and the synthesizers 101, 101a and 101b with DDS in Embodiments 1 to 9. The same effect can be obtained.

The followings are features of the frequency synthesizer of this embodiment. The frequency synthesizer has the phase locked loop configuration including the voltage-controlled oscillator 19, first frequency divider 33 or 33a, phase comparator 17 and loop filter 18. The DDS 31 is also included in the frequency synthesizer. The DDS is composed of the digital operation means and the D-A converter. The digital operation means outputs an amplitude value of periodic waveform of a periodic function, synchronized with the reference clock. The D-A converter converts the output of the digital operation means to an analog waveform. A frequency of output signal of the DDS is divided at the second frequency divider 201. An output signal of the second frequency divider 201 is changed at the frequency converter 203b. An output signal of the frequency converter 203b is divided at the third frequency divider 16. An output signal of the third frequency divider 16 is used as a reference signal.

Embodiment 12

The frequency synthesizer of this embodiment includes a reference clock input into a DDS in addition to the configuration of the frequency synthesizer of Embodiment 10 or 11. An output signal of the reference clock is divided or multiplied and then used as a local oscillating wave of a frequency converter.

One example of the frequency synthesizer of Embodiment 12 will now be described.

Figure 30:
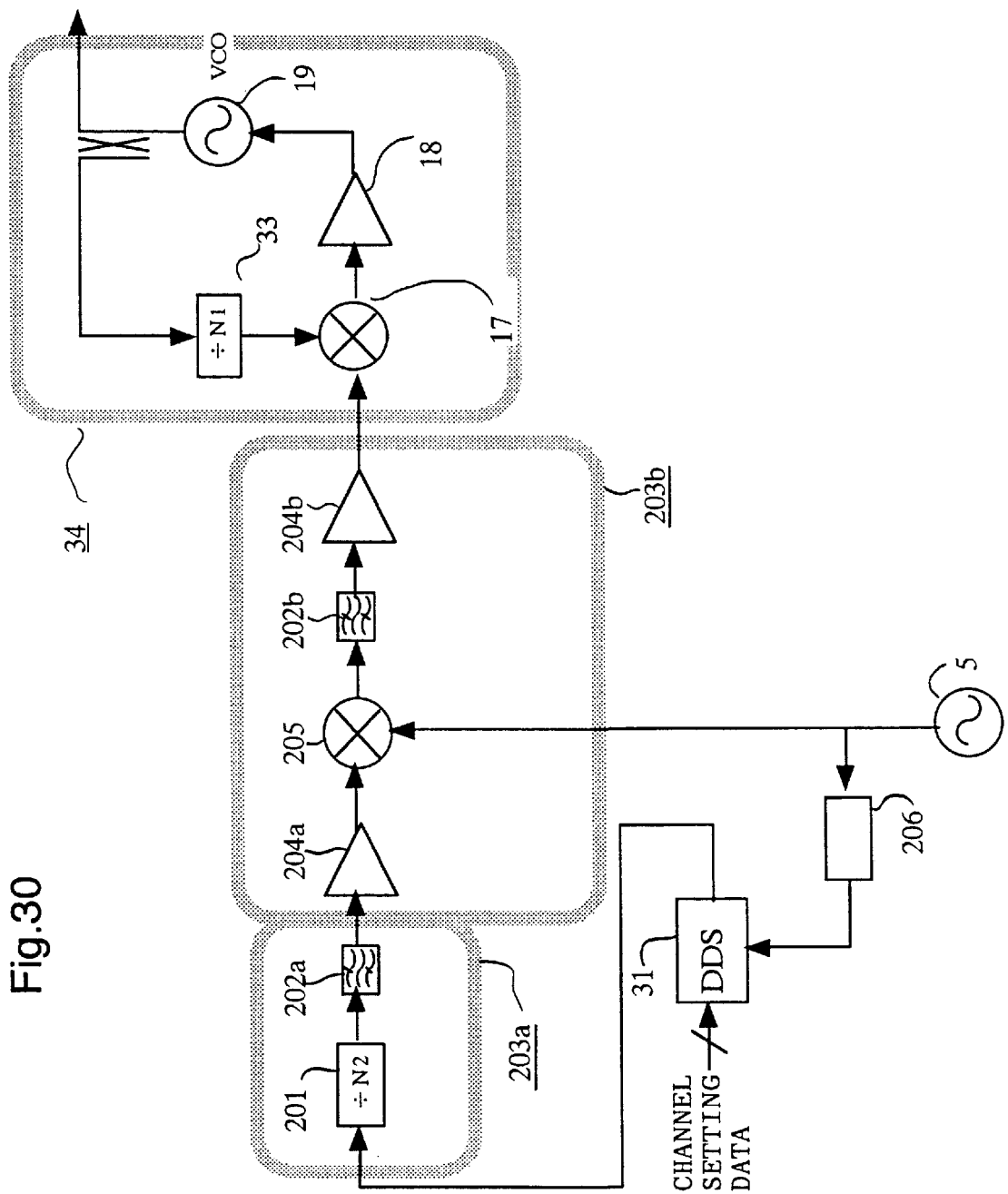
FIG. 30 shows a block diagram of an example of a frequency synthesizer according to Embodiment 12 of the present invention.
Figure 31:
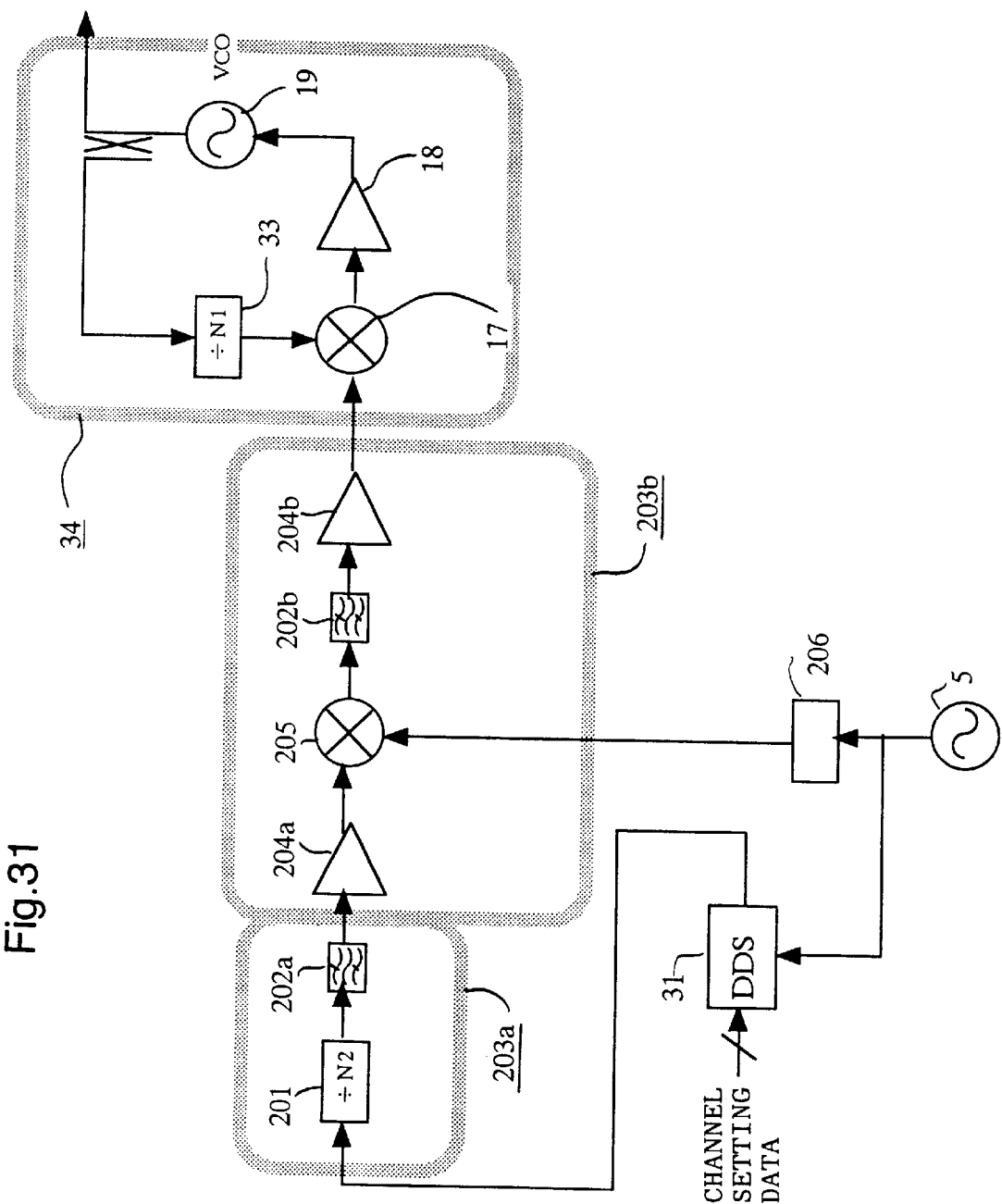
FIG. 31 shows a block diagram of another example of a frequency synthesizer according to Embodiment 12 of the present invention.
Figure 32:
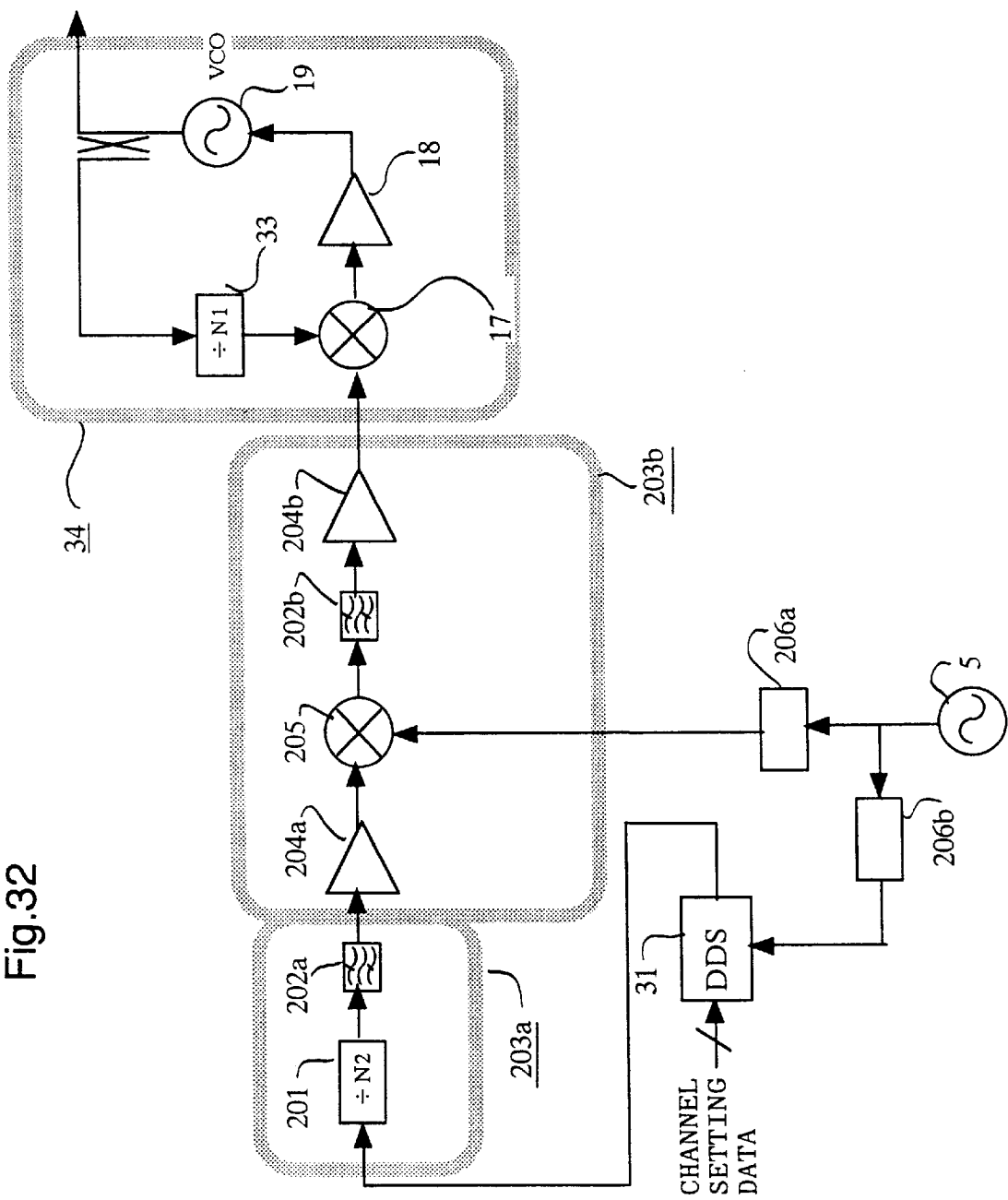
FIG. 32 shows a block diagram of another example of a frequency synthesizer according to Embodiment 12 of the present invention.

In FIGS. 30, 31 and 32, means 206 is for dividing or multiplying the frequency. The same elements or the corresponding elements to the elements in FIG. 26 have the same references in FIGS. 30, 31 and 32.

The operation will now be stated. Basic operation and effect of the frequency synthesizer of this embodiment is the same as in Embodiment 10 or 11. The case that the frequency synthesizer of Embodiment 10 is applied in this embodiment is shown in FIGS. 30, 31 and 32. In the frequency synthesizer of Embodiment 12, an output signal from the TCXO 5 is utilized as the reference clock of the DDS 31 and a local oscillating wave of the frequency converter 203b by using the means 206 for dividing or multiplying the frequency. Therefore, the number of the oscillators can be reduced, leading to cost reduction.

FIG. 30 shows the case that the means 206 for multiplying or dividing the frequency is used for generating the reference clock of the DDS 31. FIG. 31 shows the case that the means 206 for multiplying or dividing the frequency is used for generating the local oscillating wave of the frequency converter 203b. FIG. 32 shows the case that the means 206 for multiplying or dividing the frequency is used in generating both the reference clock of the DDS 31 and the local oscillating wave of the frequency converter 203b.

Figure 33:
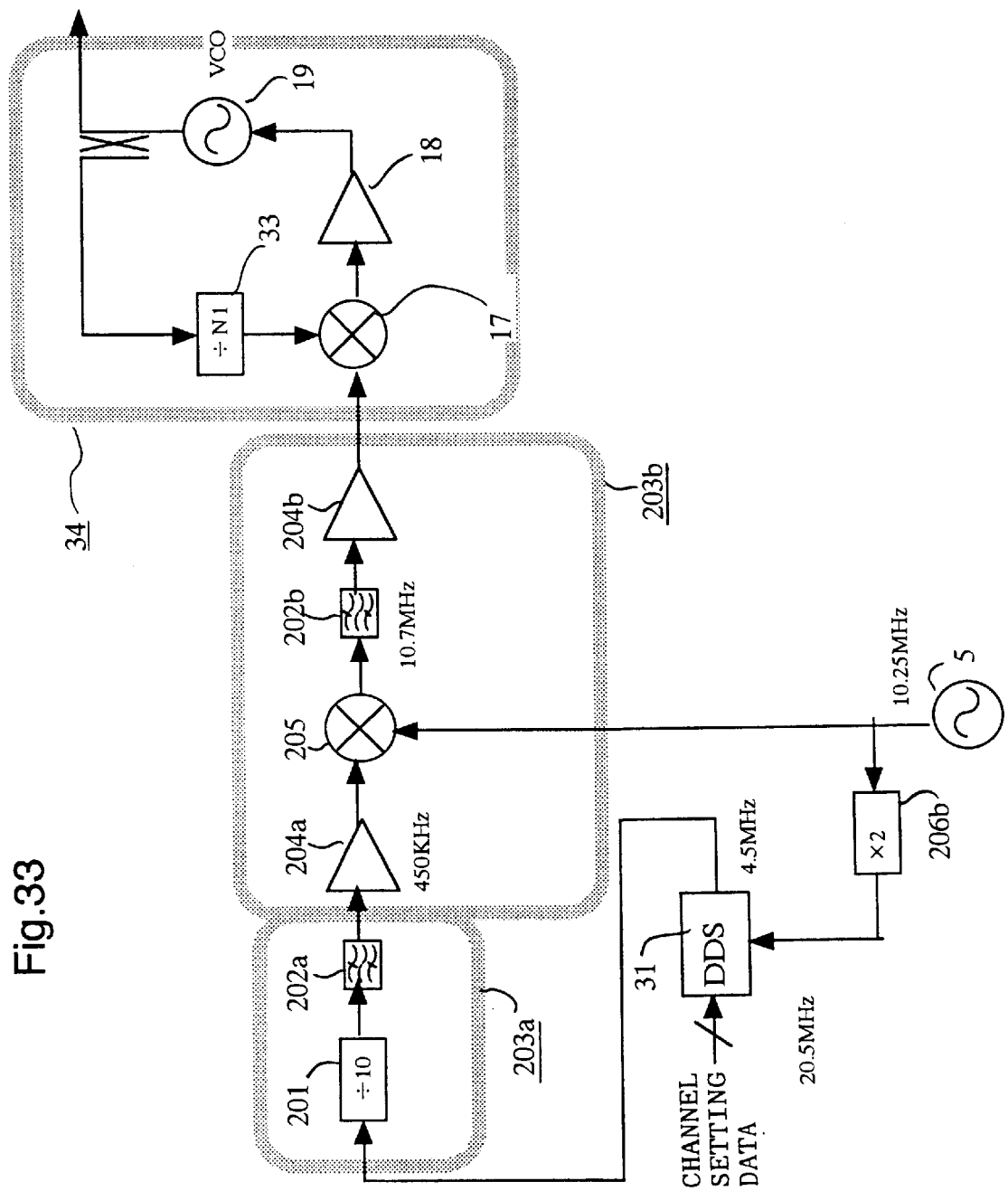
FIG. 33 shows a block diagram of another example of a frequency synthesizer according to Embodiment 12 of the present invention.

FIG. 33 shows a concrete example of frequency setting for the frequency synthesizer of this embodiment. An output frequency of the DDS 31 is defined at about 4.5 MHz. Then, it is divided by ten to be about 450 KHz. The frequency of 450 KHz is mixed with an output wave of 10.25 MHz from the TCXO 5. A reference clock frequency of the DDS 31 usually needs to be more than four times as much as the output frequency of the DDS 31. (It is more than two times according to a sampling theorem, but more than four times practically.) Therefore, the output of the TCXO 5 is multiplied by two by a frequency doubler 206b to be 20.5 MHz. This multiplied output is used as the reference clock. In this case, BPF of extremely low cost can be applied as follows.

(1) BPF of 4.5 MHz for VTR is used for the filter 43 in the DDS 31

(2) BPF of 450 KHz for AM radio is used for the BPF 202a from the divider 201

(3) BPF of 10.7 MHz for FM radio is used for the BPF 202b from the mixer 205

As stated above, the possibility of selecting the frequency freely can be enhanced by using the means 206 for dividing or multiplying the frequency. This brings about an effect that components of low cost can be chosen.

The frequency synthesizer of the configuration of Embodiment 12 has been described in the above explanation. It is also acceptable to apply this frequency synthesizer to the PLL synthesizer 4 for the receiving/transmitting apparatus, the synthesizers 101, 101a and 101b with DDS stated in Embodiments 1 to 9. In this case, the same effect can be obtained.

The followings are features of the frequency synthesizer of this embodiment. The reference clock for being input into the DDS is provided. A frequency of output signal of the reference clock is multiplied or divided, and then used as the local oscillating wave for the frequency converter.

Embodiment 13

The frequency synthesizer of this embodiment includes a first frequency synthesizer of phase locked loop configuration and a second frequency synthesizer of phase locked loop configuration. The first frequency synthesizer of phase locked loop configuration includes a first voltage-controlled oscillator, first frequency divider, first phase comparator and first loop filter, using a frequency synthesizer with DDS as a reference oscillator. The second frequency synthesizer of phase locked loop configuration includes a second voltage-controlled oscillator, second frequency divider, second phase comparator and second loop filter, using the first frequency synthesizer of phase locked loop configuration as a reference oscillator.

One example of the frequency synthesizer of Embodiment 13 will now be described.

Figure 34:
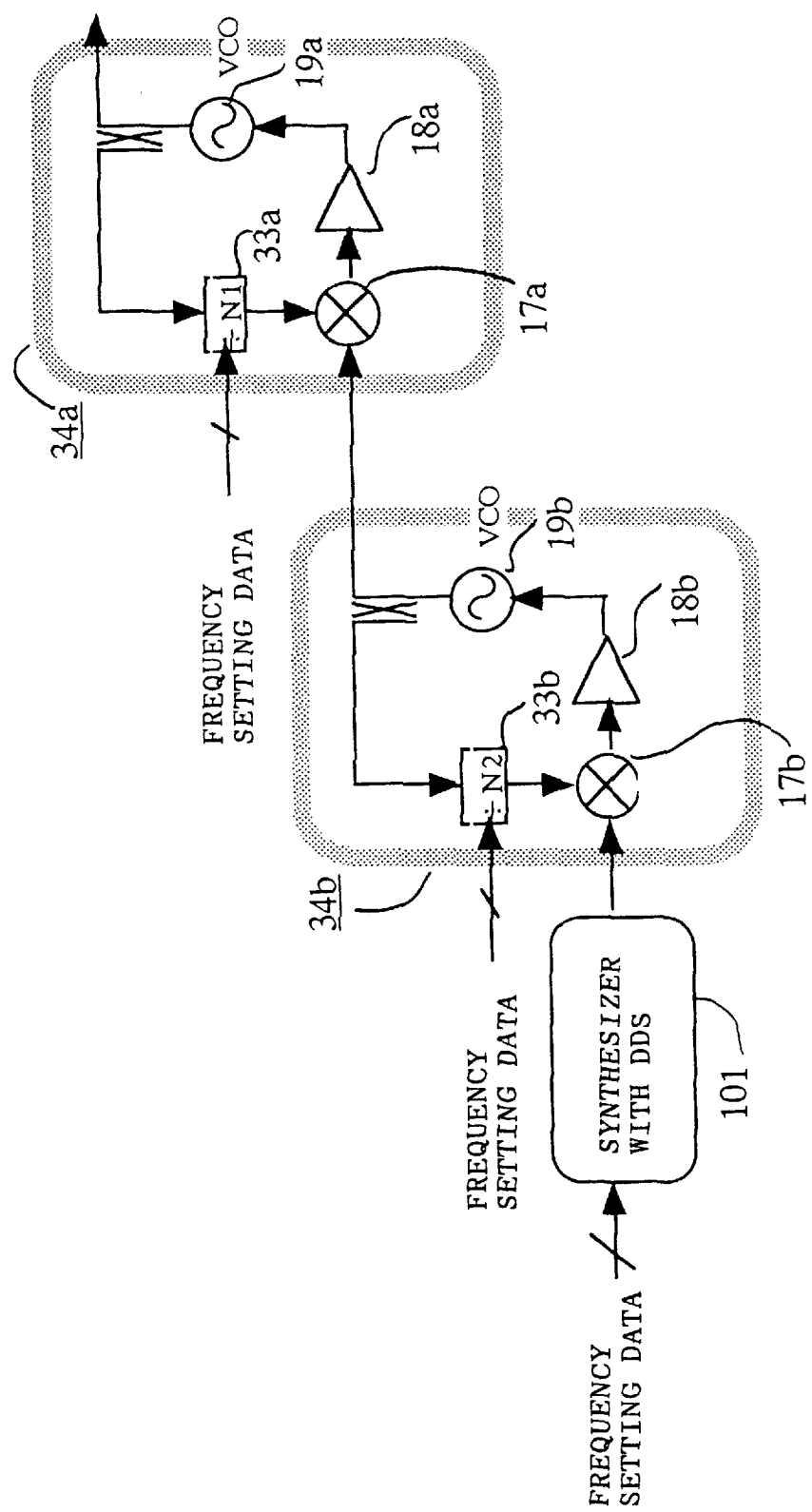
FIG. 34 shows a block diagram of an example of a frequency synthesizer according to Embodiment 13 of the present invention.

In FIG. 34, the same elements or the corresponding elements to the elements in FIG. 26 have the same references. The synthesizer 101 with DDS has the same configuration as Embodiment 1. A frequency synthesizer with two PLLs will now be described as an example.

The operation is explained hereinafter. An output signal of the synthesizer 101 with DDS is used as a reference oscillating wave of a PLL 34b. An output wave of the PLL 34b is used as a reference oscillating wave of a PLL 34a. In this case, spurious component SPout(dBc) in the output of the PLL 34a, caused by spurious component SPdds(dBc) of the synthesizer 101 with DDS, can be obtained by the following equation.

$$SPout = 10 \cdot LOG_{10}\{H1(f) \cdot H2(f)\}^2 + SPdds \quad (7)$$

Figure 35:
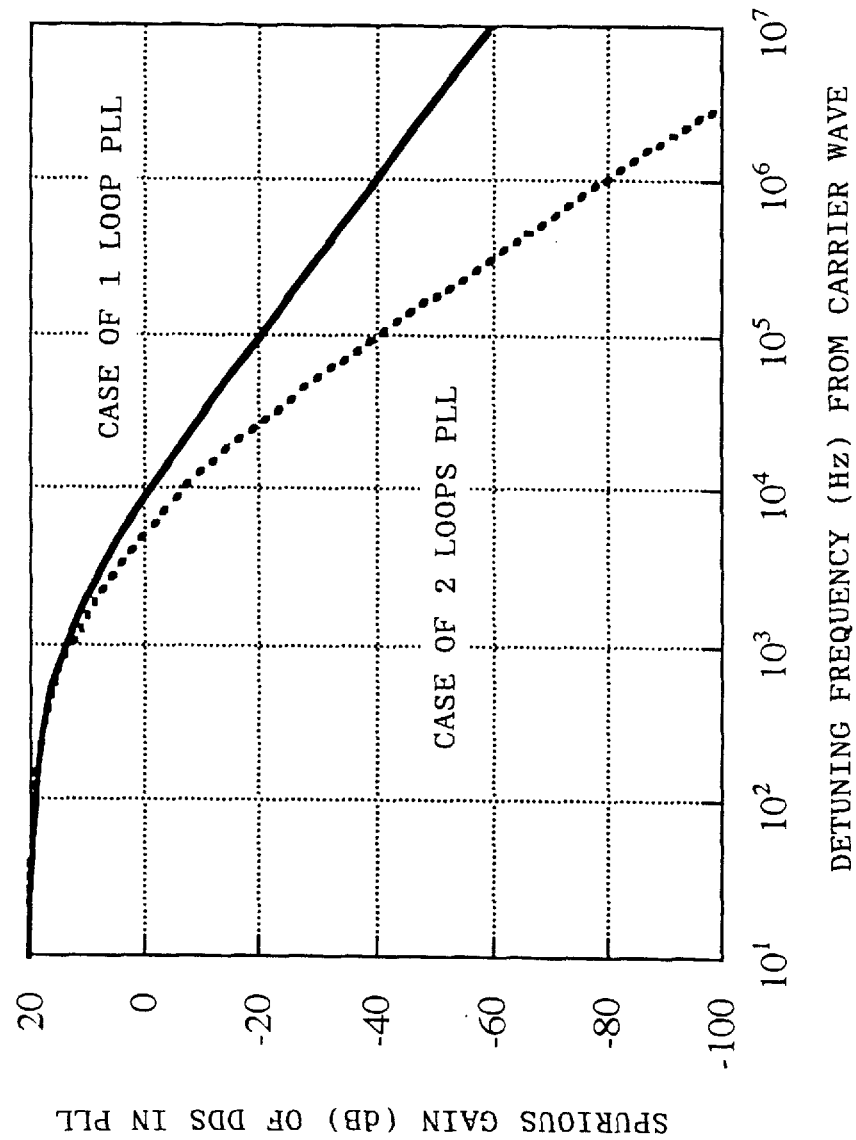
FIG. 35 shows a chart relating to a characteristic of PLL of a frequency synthesizer according to Embodiment 13 of the present invention.

H1(f) expresses a closed loop transfer function of the PLL 34a for the detuning frequency f from a carrier wave. H2(f) expresses a closed loop transfer function of the PLL 34b for the detuning frequency f from the carrier wave and has a characteristic of passing low band. Therefore, spurious components away from the carrier wave, away by more than a cutoff frequency of H1(f) or H2(f), can be suppressed at the PLLs 34a and 34b. Comparing with the conventional case wherein only one PLL 34 is used, it is possible to obtain more attenuation. This will be explained with reference to FIG. 35. The cutoff characteristic of the PLL 34 is usually a second-order characteristic. The cutoff characteristic of the PLL 34 is attenuated at 20 dB/oct when it is more than the cutoff frequency. If it is needed to obtain a higher-order characteristic by using one PLL 34, there is a possibility of phase transition in the loop becoming large and an unstable motion, such as oscillation, being generated. When there are two PLLs 34 like the configuration of the present embodiment, a fourth-order characteristic can be obtained though each PLL 34 has a stable second-order characteristic. In the case of a higher cutoff frequency than as shown in FIG. 35, the attenuation is 40 dB/oct. Accordingly, in the case of a steep attenuation characteristic being needed, it is possible to obtain a low spurious characteristic stably according to the configuration of the present embodiment. A steep attenuation characteristic may be needed when a DDS with high spurious level is being used as a reference oscillator.

The case having two PLLs 34 has been stated. It is also acceptable to have more than three PLLs. In this case, there is an effect that a lower spurious characteristic can be obtained even though the circuit scale becomes large.

Means for setting a channel has not been particularly explained in the above. It is acceptable to tune by the synthesizer 101 with DDS, a variable divider 33a of the PLL 34a, or a variable divider 33b of the PLL 34b as in FIG. 28 of Embodiment 10. The same effect can be obtained in this configuration.

The frequency synthesizer of the configuration of Embodiment 13 has been described in the above explanation. It is also acceptable to apply this frequency synthesizer to the PLL synthesizer 4 for the receiving/transmitting apparatus, the synthesizers 101, 101a and 101b with DDS stated in Embodiments 1 to 9. In this case, the same effect can be obtained.

The followings are features of this embodiment. The frequency synthesizer of this embodiment includes the first frequency synthesizer 34b of phase locked loop configuration and the second frequency synthesizer 34a of phase locked loop configuration. The first frequency synthesizer 34b of phase locked loop configuration includes the first voltage-controlled oscillator, first frequency divider, first phase comparator and first loop filter, using the frequency synthesizer 101 with DDS as the reference oscillator. The DDS includes the digital operation means and the D-A converter. The digital operation means outputs an amplitude value of periodic waveform of a periodic function, synchronizing with the reference clock. The D-A converter converts the output of the digital operation means to an analog waveform. The second frequency synthesizer 34a of phase locked loop configuration includes the second voltage-controlled oscillator, second frequency divider, second phase comparator and second loop filter, using the first frequency synthesizer 34b of phase locked loop configuration as the reference oscillator.

Embodiment 14

In the frequency synthesizer of this embodiment, an output from the DDS is filtered at a filter, converted to a level for driving a digital circuit, such as TTL level, at a level converter and input into a frequency divider.

One example of the frequency synthesizer of Embodiment 14 will now be described.

Figure 36:
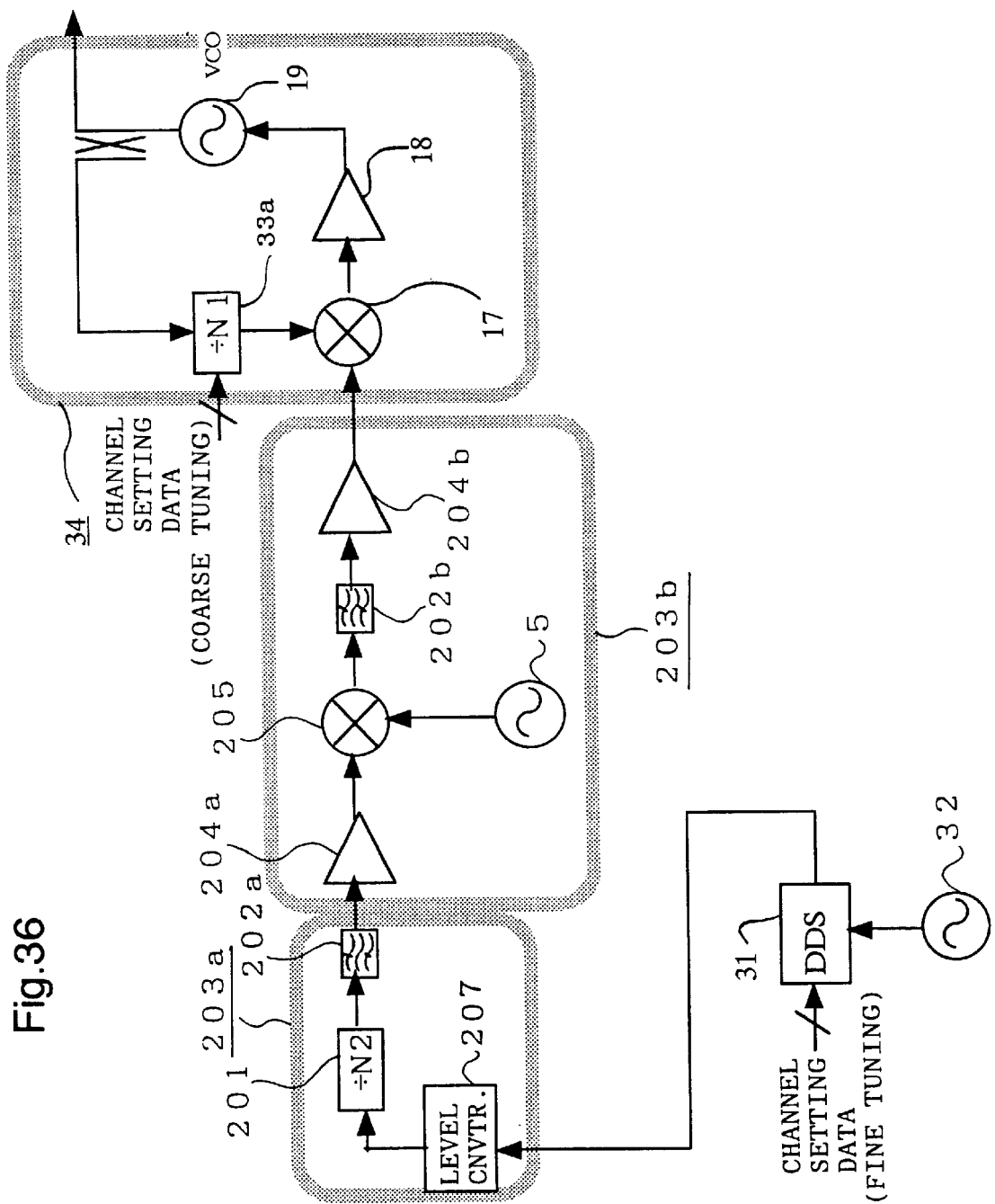
FIG. 36 shows a block diagram of an example of a frequency synthesizer according to Embodiment 14 of the present invention.

A level converter 207 is shown in FIG. 36. The same elements or the corresponding elements to the elements in FIG. 26 have the same references in FIG. 36.

Now, the operation will be explained. In the frequency synthesizer of this embodiment, a frequency of output from the DDS 31 is divided at the frequency divider 201. In this case, small signal level in the output from the DDS 31 is converted to TTL level at the level converter 207 for driving the frequency divider 201. The level converter 207 is generally called a comparator. The level convertor 207 has a nonlinear input/output characteristic for an input level as shown in FIG. 37A. A level change of an input signal is absorbed and a short form wave of stable duty ratio is generated in the level converter 207. Therefore, comparing with the case that it is amplified to TTL level by an ordinary amplifier, the level converter 207 has an effect that frequencies can be stably divided. When the level converter 207 including a hysteresis characteristic is used as shown in FIG. 37B, erroneous operation in the level converter caused by noise and so forth can be suppressed. In this case, there is an effect that the operation is performed rather stably.

When such a level converter 207 is applied to the DDS 31, quantization noise in the output wave of the DDS 31 can be suppressed, which has an effect of lowering spurious components.

There are two oscillators in the above configuration, which are the TCXO 5 and the reference clock 32 of the DDS 31. It is also acceptable to use one oscillator as shown in FIG. 27 of Embodiment 10. In this case, the same effect can be obtained. There is another effect that the cost can be lessened by decreasing the number of the oscillators.

The frequency synthesizer of the configuration of Embodiment 13 has been described in the above explanation. It is also acceptable to apply this frequency synthesizer to the PLL synthesizer 4 for the receiving/transmitting apparatus, the synthesizers 101, 101a and 101b with DDS stated in Embodiments 1 to 9. In this case, the same effect can be obtained.

The followings are features of the present embodiment. The output from the DDS is filtered at the filter. The filtered output is converted to a level for driving a digital circuit, such as TTL level, at the level converter 207. Then, the converted wave is input into the frequency divider.

Embodiment 15

The frequency synthesizer of this embodiment is a direct digital synthesizer including digital operation means and a first D-A converter. The digital operation means outputs an amplitude value of a periodic function, synchronized with a reference clock. The first D-A converter converts the output of the digital operation means to an analog waveform. Pseudo random noise generating means and digital addition means are also included in the frequency synthesizer. The digital addition means adds output data of the digital operation means and output data of the pseudo random noise generating means. Output data from the addition means is converted to a first output wave by the first D-A converter. Output data from the pseudo random noise generating means is converted to a second output wave by a second D-A converter. The second output wave is subtracted from the first output wave at an analog addition means and the subtracted wave is output.

One example of the frequency synthesizer of Embodiment 15 will now be described with reference to FIG. 38.

The pseudo random noise generating circuit 208, a digital adder 209 and an analog subtracter 210 are shown in FIG. 38. The same elements or the corresponding elements to the elements in FIG. 51 have the same references in FIG. 38.

The operation will now be explained. Frequency data (Δφ) input at a phase accumulator 40 is accumulated, synchronized with the reference clock. The accumulated data is converted to phase data φ and output. Amplitude data sin φ of a sine wave is stored in the memory 41 in advance. The sin φ is output depending upon the phase data φ. At the same time, noise data is generated at a pseudo random noise generating circuit 208, synchronized with the reference clock. The noise data is added to the amplitude data sin φ and converted to an analog waveform at a D-A converter 42a. Spurious components of the reference clock, harmonics and so forth are removed at a filter 43a. The filtered wave is composed of (sine wave voltage+noise voltage). At the same time, the noise data is converted to an analog waveform at a D-A converter 42b and filtered at a filter 43b. The filtered wave is composed of a noise voltage. The noise voltage is removed from the (sine wave voltage+noise voltage) at an analog subtracter 210. Namely, the sine wave is extracted.

In a system applying digital operation, it is common to add a pseudo random noise to an amplitude data in order to mitigate quantization error. Applying this method to a DDS has been reported. There is an effect that spurious components of the DDS, being a high level delta function, can be diffused by injecting the pseudo random noise as shown in FIGS. 39A and 39B. However, there is a problem that when the noise level is increased, the S/N (signal/noise) ratio of signal is deteriorated. Therefore, the pseudo random noise injected by the digital operation is D-A converted and removed by the analog operation in this embodiment. S/N ratio is improved as shown in FIG. 39C. There is an effect of improving S/N ratio at the DDS wherein the pseudo random noise is injected according to the configuration of the present embodiment.

The frequency synthesizer of the configuration of Embodiment 15 has been described in the above explanation. It is also acceptable to apply this frequency synthesizer to the DDS 31 for the receiving/transmitting apparatus, the synthesizers 101, 101a and 101b with DDS stated in Embodiments 1 to 14. In this case, the same effect can be obtained.

The followings are features of this embodiment. The direct digital synthesizer includes the digital operation means and the first D-A converter. The digital operation means outputs an amplitude value of a periodic function, synchronized with the reference clock. The first D-A converter converts the output of the digital operation means to an analog waveform. Pseudo random noise generating means 208 and digital addition means 209 are also included in the frequency synthesizer. The digital addition means 209 adds output data of the digital operation means and output data of the pseudo random noise generating means. Output data from the addition means is converted to the first output wave by the first D-A converter. Output data from the pseudo random noise generating means 208 is converted to the second output wave by the second D-A converter. The second output wave is subtracted from the first output wave at the analog addition means 210 and the subtracted wave is output.

Embodiment 16

The frequency synthesizer of this embodiment, which has a phase locked loop configuration, includes a loop filter. A first lag lead type filter and a second lag lead type filter are serially connected in the loop filter. The second lag lead type filter is applied optionally.

One example of the frequency synthesizer of Embodiment 16 will now be described.

FIG. 40 shows the whole diagram of the frequency synthesizer including a loop filter 18. FIG. 41 shows a detailed diagram of the loop filter 18. A first lag lead filter 211, resistances 212 and 213, a capacitor 214, a SPDT switch 215, an amplifier 216, a SPST switch 217 and a second lag lead filter 218 are shown in FIGS. 40 and 41. The same elements or the corresponding elements to the Related Art in FIG. 49 have the same references in FIG. 40.

The operation will now be explained. The loop filter 18 of the frequency synthesizer of this embodiment includes the first lag lead filter 211 and the second lag lead filter 218. When a high speed transient response, such as a transient response in frequency switching, is required, only the first lag lead filter 211 is connected to the PLL. When the characteristic of low noise and low spurious components, such as in stationary states used for communication, are required, both the first lag lead filter 211 and the second lag lead filter 218 are connected to the PLL. As shown in FIGS. 42A and 42B, a cutoff frequency of the second lag lead filter 218 is set to be rather lower than the cutoff frequency of the first lag lead filter 211. By this setting, it is possible to avoid an unstable movement of the PLL caused by accumulated phase lag generated in multiplying stages of the filter.

In the frequency switching, the SPST switch 217 is on and the SPDT switch 215 connects the capacitor 214 and the amplifier 216 in FIG. 41. Accordingly, it becomes possible to have high speed frequency switching by bypassing the second lag lead filter 218. It is also possible to charge the capacitor 214 in order to have the same electrical potential as a VCO 19 side, by the amplifier 216.

In the stationary state, the SPST switch is off and the SPDT switch 215 connects the capacitor 214 and the resistance 213. Accordingly, the second lag lead filter 218 can be connected, so that the characteristic of low noise and low spurious levels can be obtained.

As stated above, the frequency synthesizer of this embodiment has an effect of realizing high speed frequency switching as well as the characteristic of low noise and low spurious levels.

The frequency synthesizer of the configuration of Embodiment 16 has been described above. It is also acceptable to apply this frequency synthesizer to the PLL 34 for the receiving/transmitting apparatus shown in Embodiments 1 to 14. In this case the same effect can be obtained.

The following are the features of the frequency synthesizer of this embodiment. The frequency synthesizer has the phase locked loop configuration including the voltage-controlled oscillator, frequency divider, phase comparator and the loop filter. The first lag lead type filter 211 and second lag lead type filter 218 are serially connected in the loop filter. The cutoff frequency of the second lag lead type filter 218 is set lower than the cutoff frequency of the first lag lead filter 211. The second lag lead filter 218 is disconnected from the loop filter by switch means in the frequency switching. There is also provided charging means for making the electrical potential difference between terminals of the capacitor 214 used for the second lag lead type filter 218 be the control voltage of the voltage-controlled oscillator 19. In the stationary state after the frequency switching, the second lag lead type filter 218 is connected to the loop filter and the charging means for charging the capacitor is cut off, by the switch means.

Embodiment 17

The frequency synthesizer of this embodiment includes a plurality of reference oscillators for the direct digital synthesizer. The reference oscillators are switched by determination means.

One example of the frequency synthesizer of Embodiment 17 will now be described with reference to FIG. 43.

A switch 220, determination circuit 221 and memory 222 are shown in FIG. 43. The switch 220 switches reference clocks 32a and 32b. The determination circuit 221 selects either the reference clock 32a or 32b depending upon channel setting data. The memory 222 provides data to the determination circuit. The same elements or the corresponding elements to the Related Art in FIG. 50 have the same references in FIG. 43.

The operation will now be explained. There is a problem in composing the frequency synthesizer using the DDS 31. When there is a spurious component too close to a desired wave, it is impossible to remove the spurious component by the filter or the PLL, as shown in FIG. 44A. Frequency fsp of the spurious component of the DDS 31 can be defined based on the relation between the frequency fck of the reference clock and the output frequency fd. The frequency fsp can be obtained by the following.

$$fsp = |m \cdot fck - n \cdot fd| \, (m, n \text{ are integers})$$

As shown in 44B, the spurious component frequency can be away from the desired wave in the configuration wherein the frequency of the reference clock 32 is switched from the problematic frequency. Namely, selecting either the reference clock 32a or 32b is determined by the determination circuit 221 based on the channel setting data by the switch 220. Frequency setting data as an address, setting data on the switch 220 as content 1, and frequency setting data in the case of selecting the reference clock 32b as content 2 are written in the memory 222 in advance, as shown in FIG. 45.

The contents 1 and 2 in FIG. 45 are data of the memory 222. Whether or not the spurious component close to the desired wave emerges by changing the frequency using the reference clock 32a, is measured in advance. The contents 1 and 2 are set in advance based on the measured result. When no spurious component exists near the desired wave, the switch is not changed. Accordingly, the contents 1 is set at 0. In this case, it is not necessary to set a value for the contents 2. When the spurious component emerges close to the desired wave, the contents 1 is set at 1 and the switch needs to be switched. In switching, the reference clock 32a is switched to the reference clock 32b. Therefore, frequency setting data adapted for the reference clock 32b is set in the contents 2. As long as the channel setting data is the same, frequency of the output signal from the DDS 31 should be the same when whichever of the reference clock 32a and 32b is used. The output frequency of the DDS 31 is defined depending upon the reference clock and the frequency setting data. Accordingly, when the reference clock is changed, an output frequency equivalent to the output frequency before changing the reference clock can be obtained by changing the frequency setting data.

When the determination circuit 221 determines to switch from the reference clock 32a to the reference clock 32b, the frequency setting data for the DDS 31 needs to be changed. In changing the frequency of the reference clock, the frequency setting data for getting the same frequency as the frequency before changing is stored in the contents 2 in the memory 222.

Even when the reference clock is changed, the DDS 31 can output a signal having the same output frequency as that before changing, by the frequency setting data after changing.

As stated above, a frequency of spurious component is defined depending upon a frequency of the reference clock. The frequency of the spurious component can be changed by changing the frequency of the reference clock. Therefore, it is possible to remove the spurious component close to the desired wave.

There is an effect that a low spurious characteristic can be obtained in the frequency synthesizer of this embodiment.

Though the reference clocks 32a and 32b are not coherent in the above, it is acceptable for the reference clocks 32a and 32b to be coherent and synchronous with a common reference oscillator 223 as shown in FIG. 46. In this case, there is another effect that channel intervals can be perfectly uniform, in addition to the effect shown in FIGS. 44A and 44B.

It is also acceptable to compose the reference clock using a second DDS 31b as shown in FIG. 47. An output frequency of the DDS 31b can be switched by the determination circuit 221. In this case, there is another effect of increasing the frequency switching speed in addition to the effect shown in FIG. 46. The frequency switching speed is increased because the frequency switching of the reference clock can be done phase serially.

The frequency synthesizer of Embodiment 17 has been described in the above. It is also acceptable to apply this frequency synthesizer to the DDS 31 stated in Embodiments 1 to 15. In this case, the same effect can be obtained.

The followings are the features of the frequency synthesizer of this embodiment. A plurality of the reference oscillators of the direct digital synthesizer, the switch means for the plural reference oscillators and the operation means for controlling the switch means are provided.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only, and not intended to be limiting. The invention is limited only as defined in the following claims and the equivalents thereto.

What is claimed is:

1. A frequency synthesizer for generating a signal of desired frequency, comprising:
    a direct digital synthesizer for generating a first signal of a first frequency;
    a divider for dividing the first signal to provide a second signal having a second frequency;
    a frequency converter for converting the second frequency to provide a third signal; and
    a phase locked loop for inputting the third signal as a reference signal and generating the signal of desired frequency from the reference signal.

2. The frequency synthesizer of claim 1, further comprising:
    another divider, provided between the frequency converter and the phase locked loop, for dividing the third signal to provide a divided third signal and using the divided third signal as the reference signal of the phase locked loop.

3. The frequency synthesizer of claim 1, further comprising an oscillator which provides a clock signal to the direct digital synthesizer and to the frequency converter.

4. The frequency synthesizer of claim 1, further comprising a level converter, provided between the direct digital synthesizer and the divider, for converting a level of the first signal.

5. A method for synthesizing a final signal having a predetermined frequency comprising steps of:
    generating an oscillating signal having an oscillating frequency by a direct digital synthesizer;
    dividing the oscillating frequency to provide a divided signal having a divided frequency;
    converting the divided frequency to provide a converted signal; and
    inputting the converted signal into a phase locked loop as a reference signal for generating the final signal.

6. The method of claim 5 further comprising a step of dividing the converted signal.

7. A frequency synthesizer for generating a final signal having a predetermined frequency characteristic, the frequency synthesizer comprising:
    a direct digital synthesizer for generating a first signal having a first frequency characteristic determined by first channel setting data and having a first amplitude;
    a first divider, operatively connected to the direct digital synthesizer, for dividing the first frequency characteristic of the first signal to generate a divided signal having a divided frequency characteristic;
    a frequency converter, operatively connected to the first divider, for shifting the divided frequency characteristic by a shift frequency interval to provide a reference signal having a reference frequency characteristic; and
    a phase locked loop for generating the final signal from the reference signal.

8. The frequency synthesizer of claim 7 wherein, the direct digital synthesizer includes:
    a signal generator for generating a digital preliminary first signal;
    a noise generating circuit for generating a digital pseudo random noise signal;
    a digital adder for adding the digital preliminary first signal and the digital pseudo random noise signal to provide a digital first signal;
    a first D-A converter for converting the digital first signal to an analog first signal;
    a second D-A converter for converting the digital pseudo random noise signal to an analog noise signal; and
    an analog subtractor that subtracts the analog noise signal from the analog first signal to provide the first signal.

9. The frequency synthesizer of claim 7 wherein, the phase locked loop includes:
    a first filter having a first cutoff frequency; and
    a second filter, operatively connected to the first filter, having a second cutoff frequency.

10. The frequency synthesizer of claim 7, further comprising:
    at least one oscillator, each oscillator generating a respective driving signal for driving the direct digital synthesizer;
    a switching circuit, operatively connected between the direct digital synthesizer and the at least one oscillator, that selects an oscillator from the at least one oscillator based on determination data; and
    a determination circuit, operatively connected to the switching circuit and the direct digital synthesizer, for calculating the determination data from channel setting data.

11. The frequency synthesizer of claim 7 wherein, the first channel setting data finely tunes the final signal to the predetermined frequency characteristic and wherein, a second channel setting data which is input at the phase locked loop coarsely tunes the final signal to the predetermined frequency characteristic.

12. The frequency synthesizer of claim 7 further comprising a second divider, operatively connected to the frequency converter and the phase locked loop, for dividing the reference frequency characteristic to provide a divided reference signal and wherein the phase locked loop generates the final signal from the divided reference signal.

13. The frequency synthesizer of claim 4 further comprising:
    an oscillator for providing a driving signal, having a driving frequency characteristic, to the direct digital synthesizer and the frequency converter; and
    a frequency converter circuit, operatively connected between the oscillator and one of the direct digital synthesizer and the frequency converter, for varying the driving frequency characteristic of the driving signal.

14. The frequency synthesizer of claim 7, further comprising:
    a level converter, operatively connected between the direct digital synthesizer and the first divider, for varying the first amplitude.

15. A method for synthesizing a final signal having a predetermined frequency characteristic, the method comprising the steps of:
    A. generating a first signal, having a first frequency characteristic determined by first channel setting data and having a first amplitude, at a direct digital synthesizer;

B. dividing the first frequency characteristic of the first signal to generate a divided signal having a divided frequency characteristic;

C. shifting the divided frequency characteristic by a shift frequency interval to provide a reference signal having a reference frequency characteristic; and D. generating the final signal from the reference signal, at a phase locked loop.

16. The method of claim 15 further comprising the steps of:

coarsely tuning the final signal to the predetermined frequency characteristic with coarse channel setting data at the phase locked loop; and finely tuning the final signal to the predetermined frequency characteristic with fine channel setting data at the direct digital synthesizer.

17. The method of claim 15 further comprising the step of dividing the reference frequency characteristic to provide a divided reference signal and wherein, the phased locked loop generates the final signal from the divided reference signal.

18. The method of claim 15 further comprising the steps of:

providing a driving signal having a driving frequency characteristic to the direct digital synthesizer; and varying the driving frequency characteristic.

19. The method of claim 15, further comprising the step of varying the first amplitude.

20. A frequency synthesizer for generating a final signal having a predetermined frequency characteristic, the frequency synthesizer comprising:

a means for generating a first signal having a first frequency characteristic by digital operations and determined by first channel setting data;

a first divider, operatively connected to the means for generating, for dividing the first frequency characteristic of the first signal to generate a divided signal having a divided frequency characteristic;

a frequency converter, operatively connected to the first divider, for shifting the divided frequency characteristic by a shift frequency interval to provide a reference signal having a reference frequency characteristic; and a phase locked loop for generating the final signal from the reference signal.

21. The frequency synthesizer of claim 20, further comprising means for coarsely and finely adjusting the first frequency characteristic and the reference frequency characteristic.

22. The frequency synthesizer of claim 20, further comprising means for reducing spurious components in the final signal.

* * * * *